(12) United States Patent
Umeno et al.

(10) Patent No.: US 9,793,388 B2
(45) Date of Patent: Oct. 17, 2017

(54) NITRIDE SEMICONDUCTOR DEVICE, PRODUCTION METHOD THEREOF, DIODE, AND FIELD EFFECT TRANSISTOR

(71) Applicant: FURUKAWA ELECTRIC CO., LTD., Tokyo (JP)

(72) Inventors: Kazuyuki Umeno, Tokyo (JP); Shinya Otomo, Tokyo (JP); Keishi Takaki, Tokyo (JP); Jiang Li, Tokyo (JP); Takuya Kokawa, Tokyo (JP); Ryosuke Tamura, Tokyo (JP); Masayuki Iwami, Tokyo (JP); Shusuke Kaya, Tokyo (JP); Hirotatsu Ishii, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/097,888

(22) Filed: Apr. 13, 2016

(65) Prior Publication Data

US 2016/0225889 A1     Aug. 4, 2016

Related U.S. Application Data

(63) Continuation of application No. PCT/JP2014/077747, filed on Oct. 17, 2014.

(30) Foreign Application Priority Data

Oct. 18, 2013  (JP) .................................. 2013-217856

(51) Int. Cl.
*H01L 29/778*  (2006.01)
*H01L 29/47*  (2006.01)
(Continued)

(52) U.S. Cl.
CPC ...... *H01L 29/7787* (2013.01); *H01L 29/0649* (2013.01); *H01L 29/0653* (2013.01);
(Continued)

(58) Field of Classification Search
CPC ........... H01L 29/7787; H01L 29/66212; H01L 29/205; H01L 29/0649; H01L 29/7783;
(Continued)

(56) References Cited

U.S. PATENT DOCUMENTS

| 7,075,125 B2 | 7/2006 | Saito et al. |
| 7,078,743 B2 | 7/2006 | Murata et al. |

(Continued)

FOREIGN PATENT DOCUMENTS

| JP | 2005-285870 | 10/2005 |
| JP | 4072858 | 4/2008 |

(Continued)

OTHER PUBLICATIONS

International Search Report issued Jan. 20, 2015 in PCT/JP2014/077747, filed on Oct. 17, 2014 ( with English Translation).

(Continued)

*Primary Examiner* — Jarrett Stark
(74) *Attorney, Agent, or Firm* — Oblon, McClelland, Maier & Neustadt, L.L.P.

(57) ABSTRACT

A nitride semiconductor device includes; a semiconductor stack configured with a plurality of semiconductor layers made of nitride semiconductors provided on a base having a conductive portion; a first electrode provided on a portion of a semiconductor layer of the semiconductor layers configuring the semiconductor stack; a second electrode provided on a portion of a semiconductor layer of the semiconductor layers configuring the semiconductor stack separately from the first electrode; a first wiring provided at an upper layer of the first electrode; and a second wiring provided at an upper layer of the second electrode. A low permittivity area being a portion of which permittivity is lower than permittivities of the nitride semiconductors configuring the semiconductor stack at a lower layer of a portion (Continued)

of at least one of the first electrode and the second electrode other than a portion being junctioned with the semiconductor stack electrically.

40 Claims, 32 Drawing Sheets

(51) Int. Cl.
| | |
|---|---|
| *H01L 29/872* | (2006.01) |
| *H01L 29/40* | (2006.01) |
| *H01L 29/417* | (2006.01) |
| *H01L 29/66* | (2006.01) |
| *H01L 29/10* | (2006.01) |
| *H01L 29/15* | (2006.01) |
| *H01L 29/20* | (2006.01) |
| *H01L 29/205* | (2006.01) |
| *H01L 29/812* | (2006.01) |
| *H01L 29/423* | (2006.01) |
| *H01L 29/06* | (2006.01) |
| *H01L 29/51* | (2006.01) |

(52) U.S. Cl.
CPC ........ *H01L 29/1075* (2013.01); *H01L 29/152* (2013.01); *H01L 29/2003* (2013.01); *H01L 29/205* (2013.01); *H01L 29/402* (2013.01); *H01L 29/41758* (2013.01); *H01L 29/47* (2013.01); *H01L 29/66143* (2013.01); *H01L 29/66212* (2013.01); *H01L 29/66462* (2013.01); *H01L 29/7783* (2013.01); *H01L 29/7786* (2013.01); *H01L 29/872* (2013.01); *H01L 29/0619* (2013.01); *H01L 29/404* (2013.01); *H01L 29/4236* (2013.01); *H01L 29/42376* (2013.01); *H01L 29/513* (2013.01); *H01L 29/812* (2013.01)

(58) Field of Classification Search
CPC ........... H01L 29/0653; H01L 29/66143; H01L 29/402; H01L 29/152; H01L 29/41758; H01L 29/2003; H01L 29/66462; H01L 29/7786; H01L 29/1075; H01L 29/872; H01L 29/47; H01L 29/513; H01L 29/0619; H01L 29/4236; H01L 29/42376; H01L 29/404; H01L 29/812
See application file for complete search history.

(56) References Cited

U.S. PATENT DOCUMENTS

| | | | |
|---|---|---|---|
| 7,339,207 B2 | 3/2008 | Murata et al. | |
| 7,692,298 B2 | 4/2010 | Otsuka et al. | |
| 7,859,014 B2 | 12/2010 | Nakayama et al. | |
| 7,859,020 B2 | 12/2010 | Kikkawa et al. | |
| 7,999,288 B2 * | 8/2011 | Briere | H01L 29/045 257/194 |
| 8,178,898 B2 | 5/2012 | Ikeda et al. | |
| 8,659,056 B2 | 2/2014 | Tanaka et al. | |
| 8,716,141 B2 | 5/2014 | Dora et al. | |
| 8,729,603 B2 | 5/2014 | Ikeda et al. | |
| 8,816,395 B2 * | 8/2014 | Bunin | H01L 29/42316 257/194 |
| 9,142,659 B2 | 9/2015 | Dora et al. | |
| 9,525,052 B2 * | 12/2016 | Briere | H01L 29/402 |
| 2004/0169194 A1 * | 9/2004 | Noda | H01L 29/7785 257/192 |
| 2007/0164326 A1 | 7/2007 | Okamoto et al. | |
| 2007/0284653 A1 * | 12/2007 | Ueno | H01L 29/1066 257/324 |
| 2010/0155720 A1 * | 6/2010 | Kaneko | H01L 29/2003 257/43 |
| 2013/0126943 A1 * | 5/2013 | Tanaka | H01L 21/28575 257/194 |
| 2013/0256755 A1 | 10/2013 | Kurachi | |

FOREIGN PATENT DOCUMENTS

| | | |
|---|---|---|
| JP | 2009-38392 | 2/2009 |
| JP | 2009-111204 | 5/2009 |
| JP | 4389935 | 12/2009 |
| JP | 4417677 | 2/2010 |
| JP | 4517077 | 8/2010 |
| JP | 4584293 | 11/2010 |
| JP | 4691060 | 6/2011 |
| JP | 2011-204984 | 10/2011 |
| JP | 2012-23211 | 2/2012 |
| JP | 4888115 | 2/2012 |
| JP | 2013-123023 | 6/2013 |
| JP | 2013-207086 | 10/2013 |
| WO | WO 2006/001369 A1 | 1/2006 |
| WO | WO 2012/121952 A2 | 9/2012 |

OTHER PUBLICATIONS

Written Opinion Issued Jan. 20, 2015 in PCT/JP2014/077747, filed on Oct. 17, 2014.

Y. Kawakami et al. "Improved electrical properties in AlGaN/GaN heterostructures using AlN/GaN superlattice as a quasi-AlGaN barrier", Applied Physics Letters 90, 2007, 3 Pages.

N.-Q. Zhang et al. "High Breakdown GaN HEMT with Overlapping Gate Structure", IEEE Electron Device Letters, vol. 21, No. 9, Sep. 2000, 3 Pages.

* cited by examiner

ELECTRIC FIELD DISTRIBUTION WHEN APPLYING REVERSE BIAS

NITRIDE SEMICONDUCTOR DEVICE, PRODUCTION METHOD THEREOF, DIODE, AND FIELD EFFECT TRANSISTOR

CROSS-REFERENCE TO RELATED APPLICATION

This application is a continuation of PCT International Application No. PCT/JP2014/077747 filed on Oct. 17, 2014 which claims the benefit of priority from Japanese Patent Application No. 2013-217856 filed on Oct. 18, 2013, the entire contents of which are incorporated herein by reference.

BACKGROUND OF THE INVENTION

1. Field of the Invention

The present invention relates to a nitride semiconductor device, a production method thereof, a diode, and a field effect transistor.

2. Description of the Related Art

Since a wide bandgap semiconductor has high insulation breakdown voltage, good electron-transferring characteristics, and good thermal conductivity, and thus it is very attractive material for a semiconductor device for use in high-temperature environment, large power application, and high frequency application. As a typical wide bandgap semiconductor, there is a nitride semiconductor made of GaN, AlN, InN, and BN, or a mixed crystal of not less than two of these elements. In a semiconductor device having an AlGaN/GaN heterojunction structure, a two-dimensional electron gas is produced at a hetero junction interface by Piezoelectric polarization and spontaneous polarization. This two-dimensional electron gas has high electron mobility and carrier density.

Therefore, field effect transistors (FETs) such as semiconductor devices having AlGaN/GaN heterojunction structures as such, for example, a schottky barrier diode (SBD), a high electron mobility transistor (HEMT) and the like have high voltage resistance, low on-state resistance, and high switching speed, and thus are very suitable for being applied to power-switching use. On the other hand, since a high voltage is applied to, and flows through, these semiconductor devices, these semiconductor devices are required for reduction in parasitic capacity and on-state resistance.

To address these requirements, Japanese Patent No. 4389935 (hereinafter to be referred to as Patent Literature 1) proposes a semiconductor device in which parasitic capacity is reduced, while a forward voltage is lowered, by decreasing an internal resistance, by removing 2DEG, in a semiconductor layer between an electrode and a 2DEG by forming a recessed-portion reaching an interface of two semiconductor layers in which two-dimensional electron gas (2DEG) is formed. Japanese Patent Application Laid-open Publication No. 2011-204984 (hereinafter to be referred to as Patent Literature 2) proposes an FET, capable of highly effective operation at a high temperature, by forming an insulation area by removing a 2DEG layer by an ion injection method between drain ohmics each formed below a plurality of drain electrodes in an field effect transistor in which the drain ohmics are formed under a drain electrode to reduce parasitic capacity relative to the substrate. Japanese Patent Application Laid-open Publication No. 2013-123023 (hereinafter to be referred to as Patent Literature 3)proposes a nitride semiconductor element in which a parasitic capacity is reduced and a leak current is restrained from being produced by providing, below an electrode, an isolation area formed by making an inert element be subjected to ion injection.

SUMMARY OF THE INVENTION

It is an object of the present invention to at least partially solve the problems in the conventional technology.

In accordance with one aspect of the present invention, a nitride semiconductor device includes: a base having, at least a portion thereof, a conductive portion; a semiconductor stack configured with a plurality of semiconductor layers being made of nitride semiconductors provided on the base; a first electrode provided on at least a portion of a semiconductor layer of the semiconductor layers configuring the semiconductor stack; a second electrode provided on at least a portion of a semiconductor layer of the semiconductor layers configuring the semiconductor stack separately from the first electrode; a first wiring provided at an upper layer of the first electrode; and a second wiring provided at an upper layer of the second electrode. A low permittivity area being a portion of which permittivity is lower than permittivities of the nitride semiconductors configuring the semiconductor stack at a lower layer of a portion of at least one of the first electrode and the second electrode other than a portion being junctioned with the semiconductor stack electrically.

In accordance with another aspect of the present invention, a diode includes: a base having a conductive portion at least a portion thereof; a semiconductor stack configured with a plurality of semiconductor layers made of nitride semiconductors provided on the base; a first electrode provided on at least a portion of the semiconductor layers configuring the semiconductor stack; a second electrode provided on at least the portion of the semiconductor layers configuring the semiconductor stack separately from the first electrode; a first wiring provided at an upper layer of the first electrode; and a second wiring provided at an upper layer of the second electrode. A low permittivity area being a portion, of which permittivity is lower than permittivities of the nitride semiconductors configuring the semiconductor stack, is provided at a lower layer of a portion of an electrode being at least one of the first electrode and the second electrode and being other than a portion junctioned electrically to the semiconductor stack. The first electrode is an anode electrode and the second electrode is a cathode electrode.

In accordance with still another aspect of the present invention, a field effect transistor includes: a base having a conductive portion at at least a portion thereof; a semiconductor stack configured with a plurality of semiconductor layers made of nitride semiconductors provided on the base; a first electrode provided on at least a portion of the semiconductor layers configuring the semiconductor stack; a second electrode provided on at least the portion of the semiconductor layers configuring the semiconductor stack separately from the first electrode; a third electrode provided on at least the portion of the semiconductor layers configuring the semiconductor stack between the first electrode and the second electrode separately from the first electrode and the second electrode; a first wiring provided at an upper layer of the first electrode; and a second wiring provided at an upper layer of the second electrode. A low permittivity area being a portion, of which permittivity is lower than permittivities of the nitride semiconductors configuring the semiconductor stack, is provided at a lower layer of a portion of an electrode being at least one of the first electrode and the second electrode and being other than a portion junctioned electrically to the semiconductor stack.

The first electrode is a source electrode, the second electrode is a drain electrode, and the third electrode is a gate electrode.

In accordance with still another aspect of the present invention, a production method of a nitride semiconductor device which includes: a base having a conductive portion at at least a portion thereof; a semiconductor stack having a first semiconductor layer made of a nitride semiconductor provided on the base, and a second semiconductor layer in which a nitride semiconductor layer made of at least two different Al composition ratios is layered by a plurality of times, the second semiconductor layer has a super lattice structure made of a plurality of nitride semiconductor layers, a bandgap of the second semiconductor layer is broader than a bandgap of the first semiconductor layer in average; a first electrode provided on at least a portion of the semiconductor layers configuring the semiconductor stack; a second electrode provided on at least the portion of the semiconductor layers configuring the semiconductor stack separately from the first electrode; a first wiring provided at an upper layer of the first electrode; a second wiring provided at an upper layer of the second electrode; and a low permittivity area being a portion, of which permittivity is lower than permittivities of the nitride semiconductors configuring the semiconductor stack, being provided at a lower layer of a portion of an electrode being at least one of the first electrode and the second electrode and being other than a portion junctioned electrically to the semiconductor stack. When forming the plurality of nitride semiconductor layers in the second semiconductor layer in a growing step by an metalorganic chemical vapor deposition method, the growing of the nitride semiconductor layer is interrupted for a predetermined time between respective growing steps of the respective nitride semiconductor layers in the plurality of the nitride semiconductor layers.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
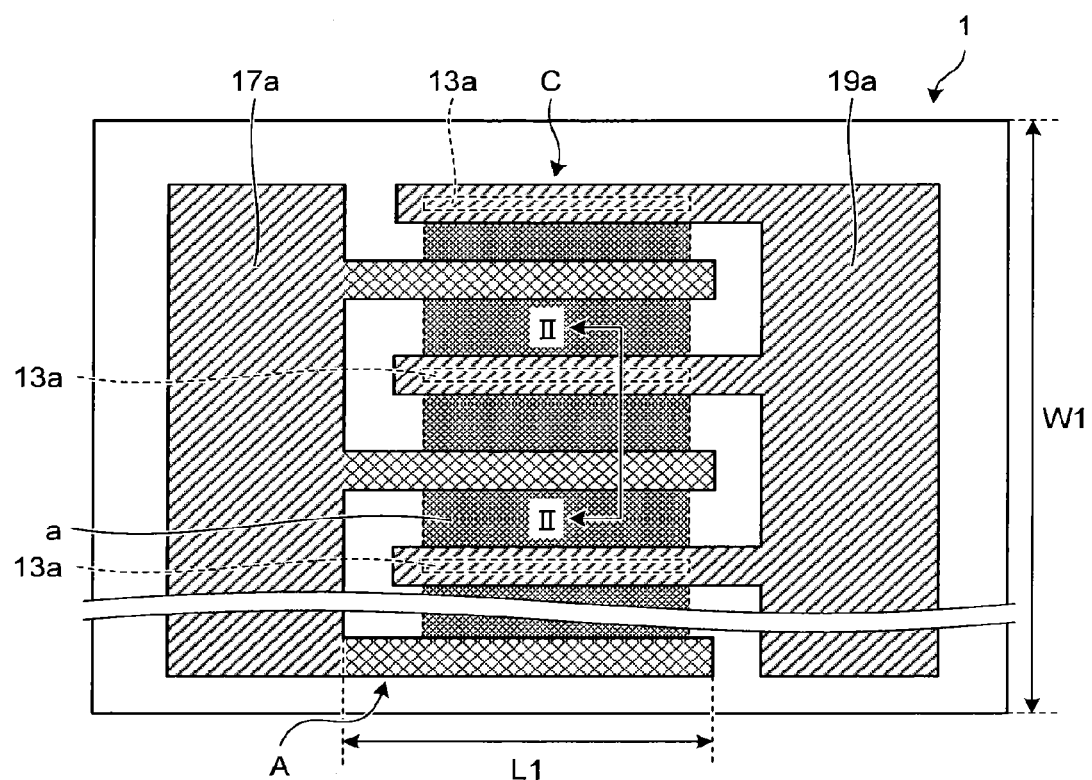
FIG. 1 is a schematic plan view, viewing from above, of an SBD according to Embodiment 1 of the present invention.

Hereafter, embodiments of the present invention will be explained with reference to drawings. The present invention is not limited to these embodiments. In each drawing, identical or corresponding elements are given same reference numerals appropriately to omit duplicated explanations. Moreover, it should be noted that the drawings show schematic examples. Accordingly, a relationship between respective elements may be different from real values. Among the drawings, there may be parts where the relationships and ratios of the shown sizes are different from one another. Hereafter, terms such as "above", "upper layer", "upward", "upper portion", "below", "lower layer", "lower", and "lower portion" indicate directions separated orthogonally relative to a primary surface of a substrate of a semiconductor device and directions approaching the primary surface of the substrate respectively, and it should be noted that these terms do not necessarily coincide with vertical direction in implemented state of the semiconductor device.

In the SBD as a nitride semiconductor device, wirings are provided on upper layers of an anode electrode as a schottky electrode and a cathode electrode as an ohmic electrode respectively. Similarly, in a field effect transistor such as HEMT as a nitride semiconductor device, wirings are provided on upper layers of a source electrode and a drain electrode as ohmic electrodes and on an upper layer of a gate electrode as, for example, a schottky electrode. In a lateral nitride semiconductor device, through which a large current is flown, electrodes and wirings on their upper layers are of a comb-shaped structure for making effective use of element area in many cases.

In a case of using these nitride semiconductor devices with a back surface of a substrate being grounded, a parasitic capacity (wiring capacity) is produced between the substrate and the wiring. This wiring capacity can be reduced by decreasing a wiring width. However, the wiring width is limited so that an electric current density is, for example, equal to or smaller than 0.3 MA/cm$^2$ as a typical value based on a counter-measure for electromigration (EM) in a case of, specifically, wiring made of aluminum (Al) as a typical value. That is, since the wiring width is limited by the minimum current density determined by a rated current in the nitride semiconductor device, reduction in wiring capacity by increasing thickness and decreasing width is limited. Hereby, there was a problem that a switching loss is produced at, particularly, in a high speed switching by an entire parasitic capacity including the wiring capacity and an on-state resistance of a channel portion, and thus switching characteristics are deteriorated.

As described above, Patent Literatures 1, 2, and 3 describe technology deleting 2DEG to reduce capacity by forming a recessed-portion on a hetero junction portion of a semiconductor layer by etching or by forming an insulation area and an isolation area by ion injection. However, according to an insight of the inventors, it was difficult, by the technologies of the above-described Patent Literatures 1, 2, and 3, to reduce the parasitic capacity between substrates at a portion of an electrode such as a cathode electrode and a drain electrode or the like, and it was more difficult to improve the switching characteristics while maintaining the SBD and the HEMT improve at high voltage resistance and large current.

Figure 35:
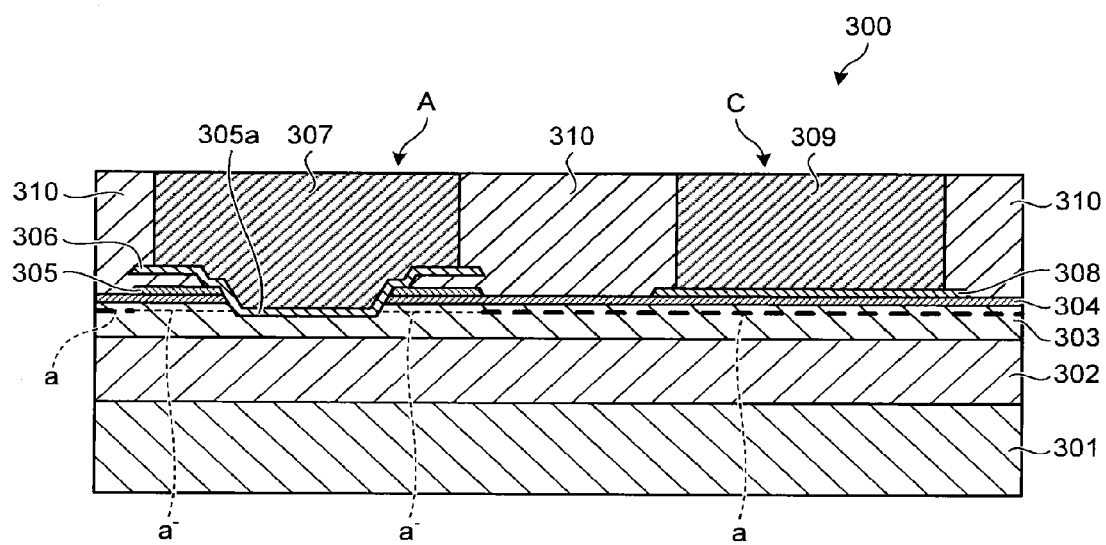
FIG. 35 is a schematic cross-sectional view showing SBDs as semiconductor devices which are objects of keen examination.

Prior to explanation of embodiments of the present invention and in order to facilitate better understanding of the present invention, keen examination conducted by the inventors attempting to solve the above-described problems will be explained. Firstly, a nitride semiconductor device, and its problems, as an object of the keen examination conducted by the inventors will be explained. FIG. 35 is a schematic cross-sectional view showing SBDs as semiconductor devices which are objects of keen examination by the inventors.

That is, as shown in FIG. 35, in an SBD 300 as an example of a nitride semiconductor device, a buffer layer 302, an electron transition layer 303, and an electron-supplying layer 304 are layered in this order on a substrate 301. Provided selectively on the electron-supplying layer 304 is a field plate layer 305. Produced as a lower layer of the field plate layer 305 is a 2DEG layer a$^-$ in which 2DEG concentration is reduced relative to a 2DEG layer a. Formed in the field plate layer 305 is a recessed portion 305a reaching the electron-supplying layer 304 and the electron transition layer 303 therebeneath. Formed on the recessed portion 305a is an anode electrode 306. The anode electrode 306 is subjected to schottky contact with the 2DEG layer a$^-$ produced at an interface between the electron transition layer 303 and the electron-supplying layer 304. The anode electrode 306 has a field plate structure having a plurality of steps stranded on the field plate layer 305 and on steps formed by the insulating film 310. On the other hand, provided selectively on the electron-supplying layer 304 is a cathode electrode 308 making an ohmic contact with the 2DEG layer a via the electron-supplying layer 304. Provided on the anode electrode 306 and the cathode electrode 308 respectively are an anode wiring 307 and a cathode wiring 309 connected with an electrode electrically. An anode A is configured with the anode electrode 306 and the anode wiring 307. A cathode C is configured with the anode electrode 306 and the anode wiring 307. The insulating film 310 is provided to protect these electron-supplying layer 304, field plate layer 305, anode electrode 306, anode wiring 307, cathode electrode 308, and cathode wiring 309.

The SBD 300 configured as above is used by grounding the substrate 301 and the anode electrode 306 mainly. In this case, a wiring capacity is produced between the cathode electrode 308 with the cathode wiring 309 thereabove and a base including a conductive portion configured with the buffer layer 302 and the substrate 301. According to an insight of the inventors, as described above, although the wiring capacity can be reduced by decreasing a wiring width of the cathode wiring 309, narrowing of the wiring as counter measures to EM of the cathode wiring 309 is limited.

To address this, the inventors studied about reduction of the wiring capacity by forming a non-occurrence area by removing the 2DEG layer at a lower layer of the cathode electrode 308 as described in Patent Literatures 1 to 3. However, it was found that the switching characteristics are not improved since an effect of reducing the capacity sufficiently cannot be obtained by merely removing the 2DEG layer a. Then, the inventors thought a method of reducing the wiring capacity by increasing the thickness of the buffer layer 302 above the substrate 301. However, problems such as warp of a wafer and a cracking or the like being produced on a growth layer occur along with an increase in the thickness of the buffer layer 302. Therefore, from a viewpoint of restraining these problems, there was a limit in increasing the thickness of the buffer layer 302.

The inventors further conducted keen examination about reduction of the wiring capacity based on the above-described studies. As a result, the inventors thought to reduce the wiring capacity by not only forming a non-occurrence area of the 2DEG layer a in an area at a lower layer of the cathode electrode 308 but also providing a material of which permittivity is lower than that of the semiconductor material configuring the buffer layer 302. In this case, a similar effect can be obtained by increasing the thickness of the area at a lower layer of the cathode electrode 308. Therefore, in the nitride semiconductor device, it is possible to reduce the wiring capacity while maintaining the wiring width, necessary for electric current capacity, of a wiring at a sufficient and necessary size and further improve the switching characteristics. Embodiments being explained hereafter are conceived based on the above-described keen examinations.

Figure 2:
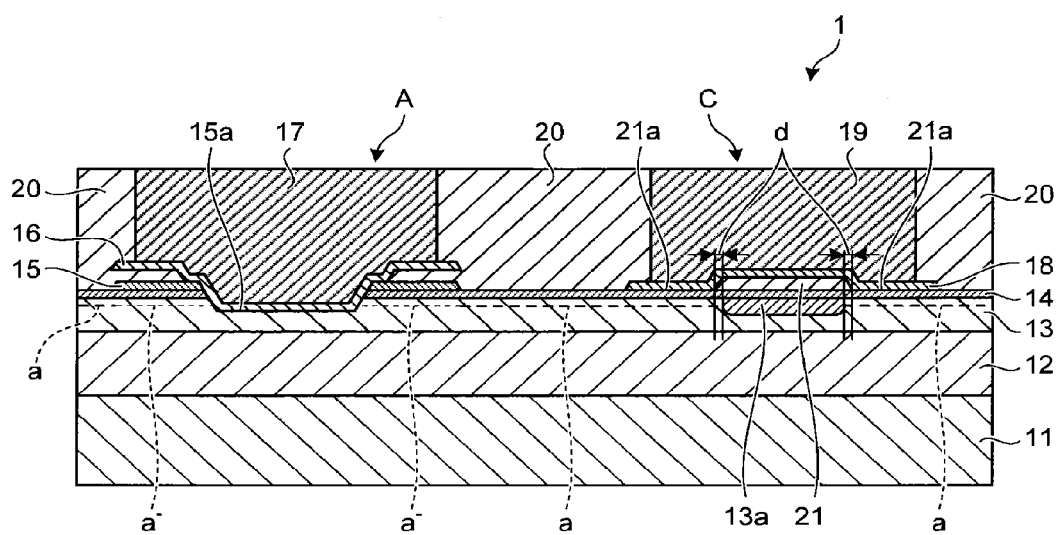
FIG. 2 is a schematic cross-sectional view of the SBD along line II-II shown in FIG. 1.

Hereafter a nitride semiconductor device according to Embodiment 1 of the present invention will be explained. FIG. 1 is a plan view, viewed from above, of a schottky barrier diode (SBD) 1 as a nitride semiconductor device according to this Embodiment 1. FIG. 2 is a schematic cross-sectional view of the SBD 1 along line II-II of FIG. 1.

As shown in FIG. 1, in the SBD 1, the anode A and the cathode C are formed plainly and comb-shaped with each other on the 2DEG layer a. Main electrodes connecting the anode A and the cathode C are of slit-finger-shapes, and are connected to an anode pad 17a and a cathode pad 19a respectively for taking out electric current. Herein a device width W1 of the SBD 1 is 0.1 to 25 mm, for example, approximately 4 mm, and a wiring length L1 of a finger electrode as a finger-shaped main electrode is 0.5 to 5 mm, for example, approximately 1 mm (1000 μm). These are adjusted appropriately based on required electric current capacity from several to several hundreds of amperes. Formed in a portion of the 2DEG layer a in an area of the cathode C is a 2DEG-non-produced area 13a in which a 2DEG is removed.

As shown in FIG. 2, in the SBD 1 according to Embodiment 1, an electron transition layer 13 is formed in which the 2DEG-non-produced area 13a is formed, via a buffer layer 12, on a portion of the primary surface of the substrate 11. Provided on the electron transition layer 13 is an electron-supplying layer 14. These electron transition layer 13 and the electron-supplying layer 14 constitute a portion of the semiconductor stack, and the 2DEG layer a is produced at an interface between the electron transition layer 13 and the electron-supplying layer 14 inside the semiconductor stack.

In addition, formed selectively on a surface of the electron-supplying layer 14 is a two-dimensional-electron-gas-controlling layer 15. Formed in an area in which the anode A of the two-dimensional-electron-gas-controlling layer 15 is formed is a recessed portion 15a reaching the electron-supplying layer 14 and the electron transition layer 13 therebeneath. An anode electrode 16 is provided on the recessed portion 15a to cover the recessed portion 15a, and an anode wiring 17 is provided on the anode electrode 16. The anode A of the SBD 1 is configured with the anode electrode 16 and the anode wiring 17.

A cathode electrode 18 is provided on the electron-supplying layer 14 selectively, and a cathode wiring 19 is provided on the cathode electrode 18. A cathode C of the SBD 1 is configured with the cathode electrode 18 and the cathode wiring 19. A dielectric layer 21 is provided inside the cathode electrode 18 along the primary surface of the substrate 11 between an upside of the electron-supplying layer 14 and the cathode electrode 18 and in an area covering the 2DEG-non-produced area 13a.

The substrate 11 is configured with a substrate made of a material capable of forming a GROUP-III nitride compound semiconductor on the primary surface (main surface). Specifically, the substrate 11 is configured with, for example, a silicon (Si) substrate, a Gallium Arsenide (GaAs) substrate, a Gallium Phosphide (GaP) substrate, a gallium nitride (GaN) substrate, a aluminum nitride (AlN) substrate, a silicon carbide (SiC) substrate, a carbon (C) substrate, or a Sapphire substrate or the like.

The buffer layer 12 is a layer for forming a GROUP-III nitride compound semiconductor layer on the substrate 11 desirably. The buffer layer 12 has a commonly known structure in which, for example, an aluminum nitride (AlN) layer and a gallium nitride (GaN) layer are layered alternately. Herein, preferably, the thickness of the buffer layer 12 is equal to or greater than 2 μm and equal to or smaller than 6 μm, and in this Embodiment 1, for example, 4.0 μm. The buffer layer may be made to become semi-insulating by doping the buffer layer 12 with impurity such as C, Fe, and Mg or the like. If necessary, various layers for configuring the nitride semiconductor device may be provided. The substrate 11, the buffer layer 12, and, if necessary, other layers configure a base having, at least a part thereof, a conductive portion. The conductive portion of the base configured with the substrate 11 and the buffer layer 12 is grounded when the SBD 1 is being used. A C—GaN layer doped with carbon (C) or the like may be further provided between an upside of the buffer layer 12 and the electron transition layer 13 to configure a base by the substrate 11, the buffer layer 12, and the C—GaN layer or the like.

The electron transition layer 13 as a first semiconductor layer is made of, for example, undoped GaN (u-GaN). For a material configuring the electron transition layer 13, a material may be used which is made of $In_xAl_yGa_{1-x-y}N$ ($0 \leq x \leq 1$, $0 \leq y \leq 1$, $0 \leq x+y \leq 1$) as a GROUP-III nitride compound semiconductor other than GaN. In a case of using AlGaN as a material for configuring the electron transition layer 13, it is preferable that an Al composition ratio thereof be equal to or lower than 5%. Herein the thickness of the electron transition layer 13 is, preferably, equal to or greater than 0.1 μm and equal to or smaller than 2 μm, and in this Embodiment 1, for example, 0.7 to 1.0 μm. The 2DEG-non-produced area 13a doped with impurities such as, for example, nitrogen (N), hydrogen (H), and argon (Ar) or the like for restraining a 2DEG from being produced is formed in a portion of area, in which the cathode electrode 18 of the electron transition layer 13 is formed.

The electron-supplying layer 14 as the second semiconductor layer is made of $Al_xGa_yIn_zN$ ($0 \leq x,y,z \leq 1$, $x+y+z=1$) as GROUP-III nitride compound semiconductor of which bandgap is broader than that of the electron transition layer 13. An Al composition ratio x of the $Al_xGa_yIn_zN$ is set to correspond to a two-dimensional electron gas concentration (2DEG concentration) as a carrier density becoming a target, and in a case of z=0, it is preferable to be equal to or greater than 0.15 and equal to or lower than 0.35, and more preferably, equal to or greater than 0.20 and equal to or lower than 0.3, more specifically, for example, 0.25. The thickness of the electron-supplying layer 14 is, preferably equal to or greater than 10 nm and equal to or smaller than 50 nm, more preferably equal to or greater than 20 nm and equal to or smaller than 25 nm, and in this Embodiment 1, for example, 20 nm.

The electron-supplying layer 14 is not limited to a single layer made of $Al_xGa_yIn_zN$, and may be of a structure in which plural kinds of GROUP-III nitride compound semiconductors having different bandgaps are layered, and specifically may be of a pseudo alloy structure in which, for example, a GaN layer and a AlN layer are layered a plurality of times in this order repeatedly. A bandgap in this case of the electron-supplying layer 14 is an average bandgap, and specifically is a bandgap being subjected to weighting (integral) by a layer-thickness ratio of each semiconductor layer configuring the layered structure. In a case of configuring the electron-supplying layer 14 by layering the plural kinds of GROUP-III nitride compound semiconductors, it is preferable that the electron-supplying layer 14 be formed so that no 2DEG is produced in the electron-supplying layer 14.

The two-dimensional-electron-gas-controlling layer 15 made of a portion of a third semiconductor layer is made of a GROUP-III nitride compound semiconductor of which bandgap is narrower than that of the electron-supplying layer 14, more specifically, for example, GaN for varying a 2DEG concentration of the 2DEG layer a produced in the electron transition layer 13 locally. In this Embodiment 1, the semiconductor stack is configured with the electron transition layer 13, the electron-supplying layer 14, and the two-dimensional-electron-gas-controlling layer 15, and the two-dimensional-electron-gas-controlling layer 15 as an electric field relaxation layer varies the 2DEG layer a inside the semiconductor stack. The 2DEG concentration decreases if the thickness of the two-dimensional-electron-gas-controlling layer 15 increases. Therefore, in this Embodiment 1, it is preferable that the thickness of the two-dimensional-electron-gas-controlling layer 15 be, for example, equal to or greater than 20 nm and equal to or smaller than 200 nm. From a view point of facilitating control of the 2DEG concentration by thickness-control using growth and etching, it is more preferable that the thickness of the two-dimensional-electron-gas-controlling layer 15 be equal to or greater than 20 nm and equal to or smaller than 100 nm. The thickness of equal to or greater than 25 nm and equal to or smaller than 80 nm is further preferable because it is hardly affected by variation of the 2DEG concentration because of variation of thickness. From a viewpoint of making the SBD 1 high voltage resistant, it is preferable that the thickness of the two-dimensional-electron-gas-controlling layer 15 be determined so that, in the 2DEG layer $a^-$ of which 2DEG concentration is low, the 2DEG concentration is smaller than $7 \times 10^{12}$ cm$^{-2}$. From a viewpoint of reducing on-state resistance of the SBD 1, it is preferable that, in the 2DEG layer a of which 2DEG concentration is high, the 2DEG concentration be equal to or greater than $7 \times 10^{12}$ cm$^{-2}$.

The anode electrode 16 as the first electrode is provided to have a layered structure, which covers the recessed portion 15a, in which for example, a lower electrode layer is made of a nickel (Ni) layer and an upper electrode layer is an aurum (Au) layer (hereafter Ni/Au). Hereby the anode electrode 16 makes schottky contact with the 2DEG layer a beneath the two-dimensional-electron-gas-controlling layer 15 and the electron-supplying layer 14 laterally. The anode electrode 16 may be provided on a surface, on which the recessed portion 15a is not formed, of the electron-supplying layer 14 to make schottky contact, via the electron-supplying layer 14, to the 2DEG layer a produced on the electron transition layer 13. In this Embodiment 1, the anode electrode 16 is grounded to be identical in electric potential to the substrate 11 or the buffer layer 12.

This anode electrode 16 is stranded on the two-dimensional-electron-gas-controlling layer 15 to form at least one step, and is stranded on one step formed from the insulating film 20 and extends so that the anode electrode 16 arches out to the cathode electrode 18's side. In this Embodiment 1, the anode electrode 16 is provided to contact a side surface and a portion of an upper surface of the two-dimensional-electron-gas-controlling layer 15. Other semiconductor film and a dielectric film may be disposed between the anode electrode 16 and the two-dimensional-electron-gas-controlling layer 15 to make the anode electrode 16 and the two-dimensional-electron-gas-controlling layer 15 not contact with each other. The thickness of the insulating film 20 between the two-dimensional-electron-gas-controlling layer 15 and the anode electrode 16 increases so that the thickness increases continuously or incrementally from the anode electrode 16's side toward the cathode electrode 18. Hereby an effect, by a field plate structure of the anode electrode 16, of dispersing electric field is obtained.

The insulating film 20 is configured with, for example, silicon oxide ($SiO_2$). Mainly the insulating film 20 protects surfaces of the two-dimensional-electron-gas-controlling layer 15, the anode electrode 16, the anode wiring 17, the cathode electrode 18, the cathode wiring 19, and the electron-supplying layer 14. The insulating film 20 may be configured with a material other than $SiO_2$, specifically, silicon nitride ($SiN_x$) and aluminum oxide ($Al_2O_3$: alumina) or the like, and may be configured with combining, or by layering successively, plural kinds of materials appropriately.

Selectively provided above the 2DEG-non-produced area 13a formed in a portion of the electron transition layer 13 and above the electron-supplying layer 14 is a dielectric layer 21 as a low permittivity area covering the 2DEG-non-produced area 13a. Herein this dielectric layer 21 is provided to be separated from the insulating film 20 by the contact portion 21a. The dielectric layer 21 may be provided independently from the insulating film 20 and may be configured with a portion of the insulating film 20. That is, the dielectric layer 21 may be configured with a material that is identical to that of the insulating film 20, for example, $SiO_2$ or the like, or may be configured with a material that is different from that of the insulating film 20. It is preferable that the dielectric layer 21 be configured with a material of which permittivity is lower than permittivity of a material configuring the buffer layer 12, the electron transition layer 13, and the electron-supplying layer 14 to obtain an effect similar to an effect of increasing the thickness of the buffer layer 12 to reduce wiring capacity. Herein since a relative permittivity of GaN is approximately 9.5 and a relative permittivity of $Al_xGa_yN$ of which Al composition ratio x is equal to or lower than 0.3 is almost the same as that of the GaN, for a material of the dielectric layer 21, a dielectric material containing at least one kind of element selected from a group consisting silicon (Si), oxygen (O), nitrogen (N), carbon (C), fluorine (F), and boron (B). More specifically, as a material for the dielectric layer 21, $SiO_2$ being formed by plasma-enhanced chemical vapor deposition (PECVD) method and having approximately 4.1 of relative permittivity, $SiO_x$ or $SiN_x$ having approximately 3 to 3.5 of relative permittivity and being doped with F and C, or BCN or the like of which relative permittivity is equal to or smaller than 3, may be used.

The cathode electrode 18 as the second electrode has a layered structure in which, for example, a lower electrode layer is a Ti layer and an upper electrode layer is an Al layer (hereafter, Ti/Al). The cathode electrode 18 is provided on the electron-supplying layer 14 and along a plane which is parallel with the primary surface of the substrate 11 so as to cover the 2DEG-non-produced area 13a and the dielectric layer 21. By the configuration as such, the cathode electrode 18 makes ohmic contact, through the contact portion 21a and via the electron-supplying layer 14, with the 2DEG layer a produced in the electron transition layer 13. That is, the cathode electrode 18 provided to sandwich, by together with the electron-supplying layer 14, the dielectric layer 21 while making ohmic contact with a surface of the electron-supplying layer 14 at the contact portion 21a.

Preferably, the thickness of the dielectric layer 21 is equal to or greater than 0.2 μm and equal to or smaller than 1.5 μm, and in this Embodiment 1, for example, 0.5 μm. In this specification, regarding the thickness of a layer made of an insulator, an $SiO_2$ layer of which relative permittivity is 3.9 to 4.1 is a reference, and a thickness of a layer in a case of using other material is to be converted from the thickness of $SiO_2$ layer based on a ratio of a permittivity of the material and a permittivity of $SiO_2$. Hereafter, a reason for that these ranges for the thickness of the dielectric layer 21 are preferable will be explained.

Figure 3:
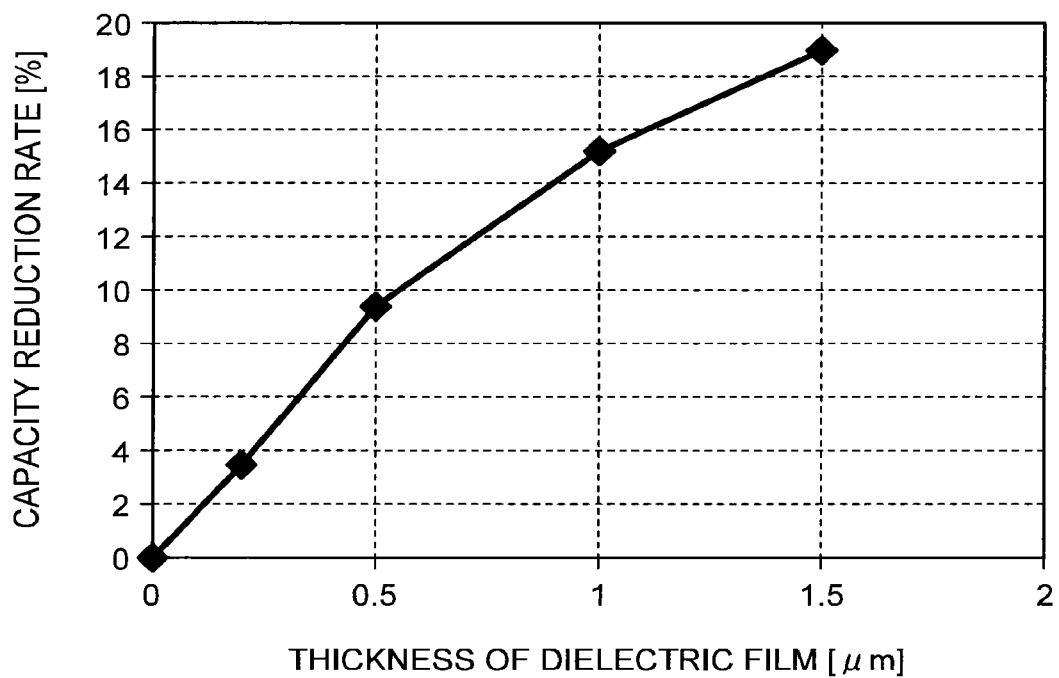
FIG. 3 is a graph showing a reduction rate of parasitic capacity of a dielectric layer relative to thickness for explaining an effect by Embodiment 1 of the present invention.

That is, the inventors measured reduction rate (%) of wiring capacity in a case of varying the thickness of the dielectric layer 21 according to Embodiment 1 from 0.2 μm to 1.5 μm relative to a wiring capacity in a configuration in which the dielectric layer 21 is not provided in an area in which the cathode C is formed. An electrode width of the cathode electrode 18 was 15 μm, an applied voltage was 450 V, a frequency was 1 MHz, and the anode A and the base were grounded. FIG. 3 is a graph showing dependency of this capacity reduction rate (%) of the dielectric layer 21 on the thickness.

From FIG. 3, it is found that, in a case of 0.2 μm of thickness of the dielectric layer 21, the wiring capacity decreases by approximately 3.5%. In a case of 0.5 μm of thickness of the dielectric layer 21, it is found that the wiring capacity decreases relative to the case of 0.2 μm of thickness and the wiring capacity decreases by approximately 9.1%. Similarly, it is found that, in a case of increasing the thickness of the dielectric layer 21 to 1.0 μm and 1.5 μm subsequently, the capacity reduction rate also increases to 5% and 19% monotonously. That is, it is found that the wiring capacity decreases monotonously along with increase in the thickness of the dielectric layer 21. On the other hand, in a so-called lateral nitride semiconductor device such as the SBD 1 according to this Embodiment 1, it is extremely important to decrease the wiring capacity by several percent since it is difficult to decrease the wiring capacity. Therefore, it is preferable that the thickness of the dielectric layer 21 be equal to or greater than 0.2 μm at which 3.5% of reduction rate is achieved. On the other hand, if it is considered to provide the cathode electrode 18 and the cathode wiring 19 on the dielectric layer 21 to make ohmic contact with the electron-supplying layer 14 or the like, it is preferable that the thickness of the dielectric layer 21 be equal to or smaller than 2 μm.

An interval d of outer end portions (outer edge portions) at a same side along the width direction of electrodes of the dielectric layer 21 and the 2DEG-non-produced area 13a in a portion in which the cathode electrode 18 is formed is preferably equal to or greater than 0.5 μm and equal to or smaller than 3 μm, and more preferably equal to or greater than 0.5 μm and equal to or smaller than 2 μm, and in this Embodiment 1, for example, 1.0 μm. Hereafter a reason will be explained for why it is preferable to provide the 2DEG-non-produced area 13a, which is along the plane which is in parallel with the primary surface of the substrate 11, inside the dielectric layer 21, in other words, to configure that a perimeter portion of the dielectric layer 21 along the width direction of the electrode is outside a perimeter portion of the 2DEG-non-produced area 13a.

Figure 4:
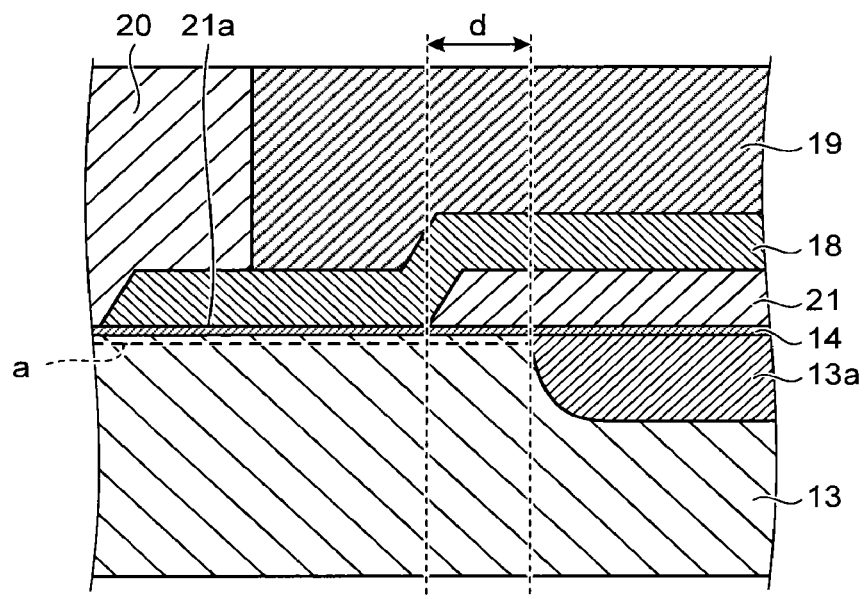
FIG. 4 is a cross-sectional view of a contact portion at and around a cathode electrode in a case of providing the dielectric layer to cover a 2DEG-non-produced area in Embodiment 1 of the present invention, and a graph of electric field intensity.
Figure 4:
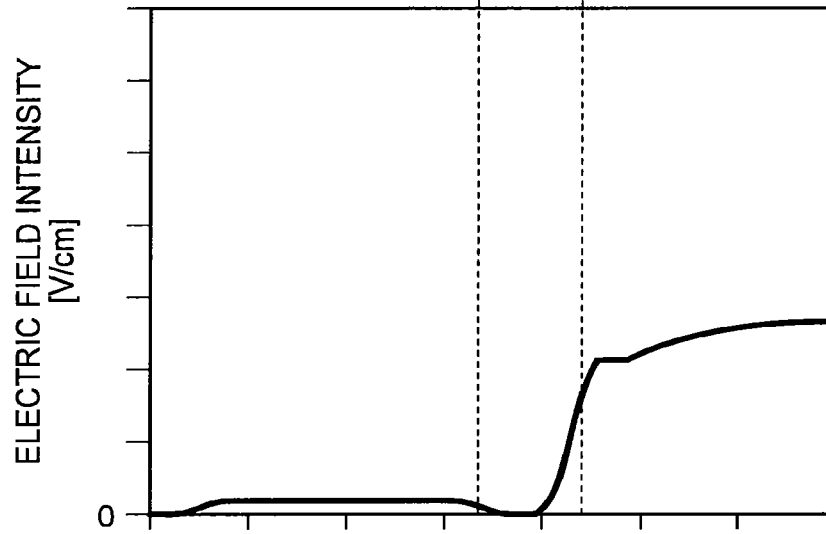
Figure 5:
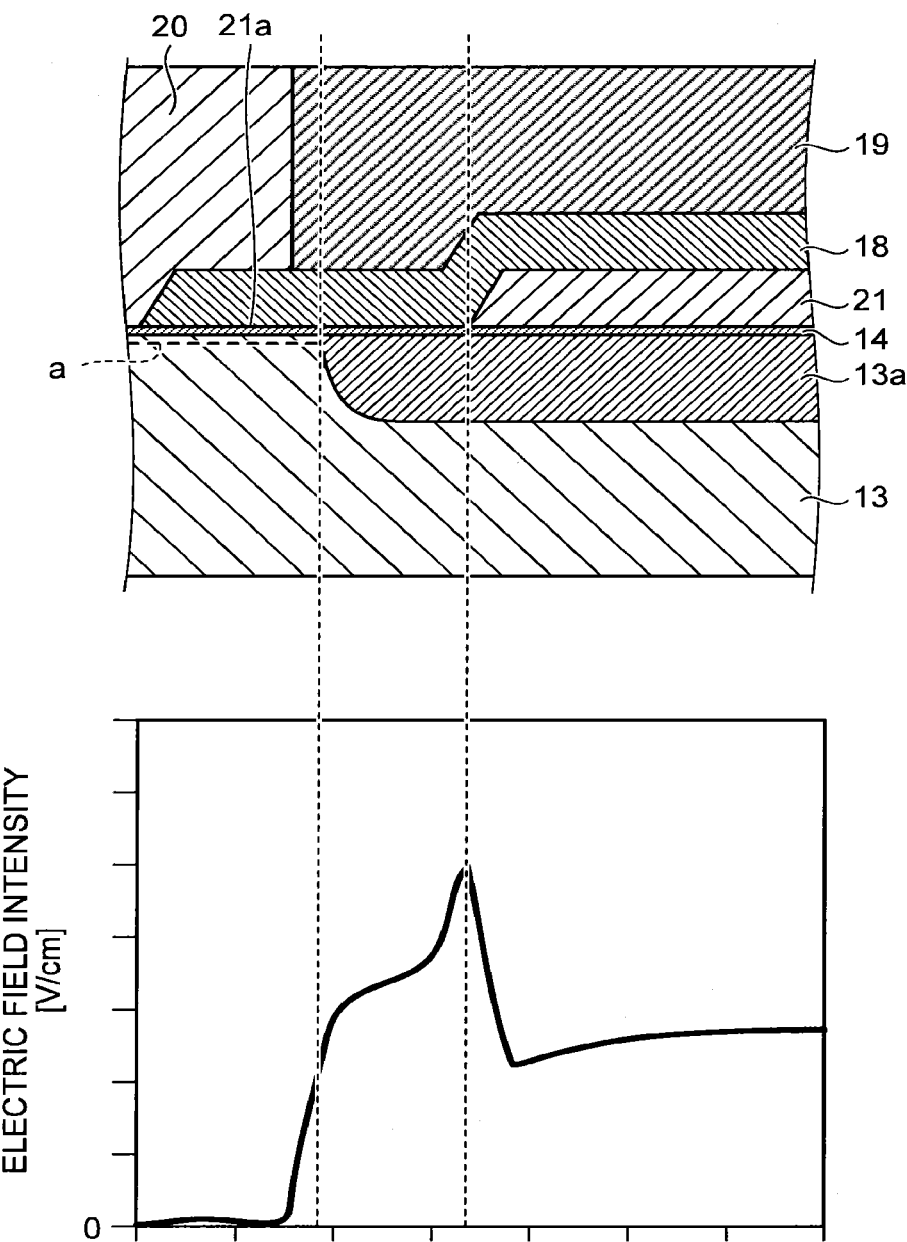
FIG. 5 is a cross-sectional view at and around a contact portion of a cathode electrode, as a modified example of Embodiment 1 of the present invention, in a case of expanding the 2DEG-non-produced area to outside the dielectric layer, and a graph of electric field intensity.
Figure 6:
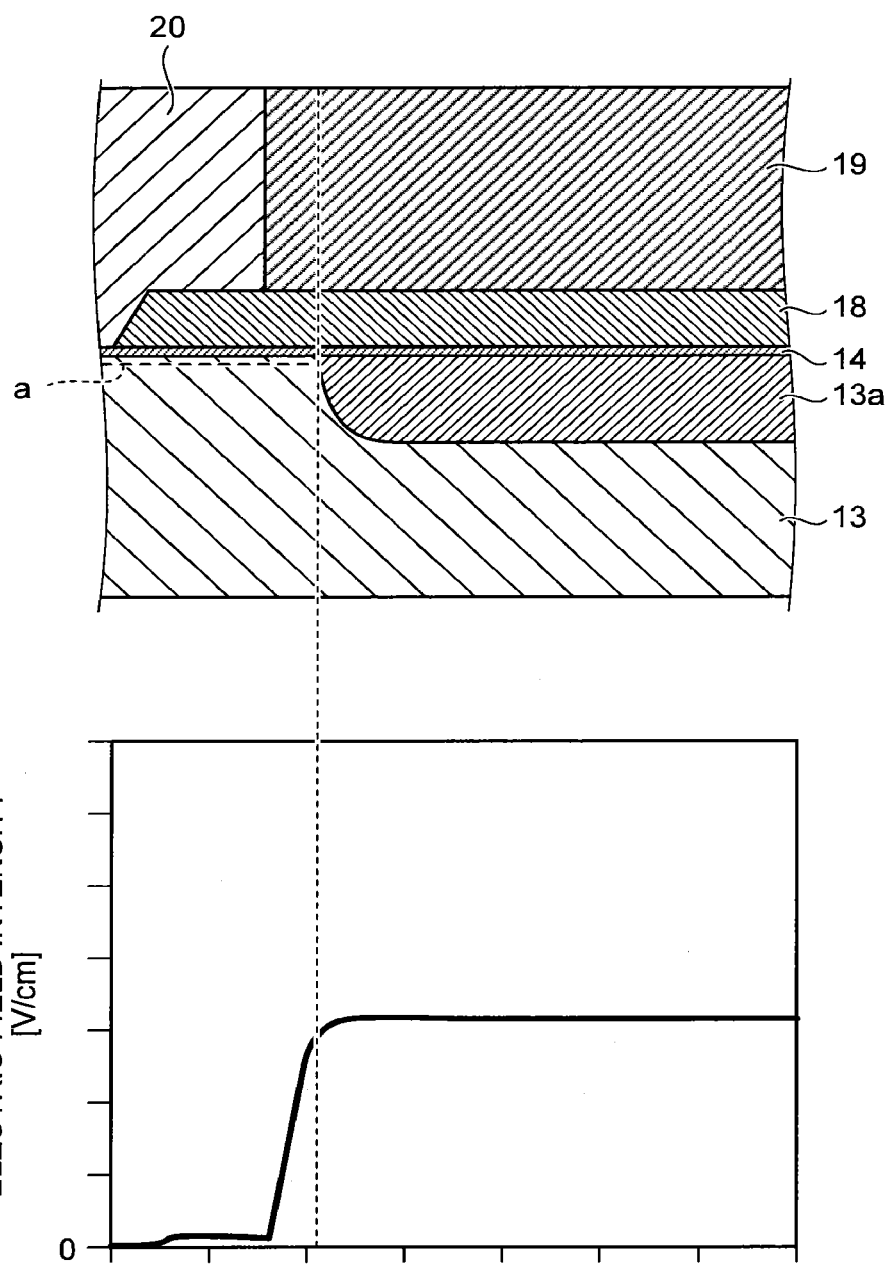
FIG. 6 is a cross-sectional view of a portion of a cathode electrode in a conventional configuration, as a comparison example to the Embodiment 1 of the present invention, in which no dielectric layer is provided but only a 2DEG-removed area is provided, and a graph of electric field intensity.

That is, the inventors measured electric field intensities produced in the semiconductor stack of the SBD 1 in a case of conventional configuration in which the dielectric layer 21 is not provided and in a case in which the dielectric layer 21 is provided and the perimeter portion (outer end portion) of the 2DEG-non-produced area 13a is positioned inside and outside the dielectric layer 21 along the width direction of the electrode. An upper portion of FIG. 4 is a schematic cross-sectional view showing the contact portion 21a, and a peripheral portion, of the cathode electrode 18 in a case in which the dielectric layer 21 is provided on the electron-supplying layer 14 and the perimeter portion of the dielectric layer 21 is positioned outside the perimeter portion of the 2DEG-non-produced area 13a along the width direction of the electrode by an interval d. A lower portion of FIG. 4 is a graph of electric field intensity corresponding to each position of this cross-sectional view. An upper portion of FIG. 5 is a schematic cross-sectional view showing the contact portion 21a, and a peripheral portion, of the cathode electrode 18 in the SBD 1 as a modified example of Embodiment 1 in a case in which the perimeter portion of the 2DEG-non-produced area 13a is positioned outside the dielectric layer 21 along the width direction of the electrode, and a lower portion of FIG. 5 is a graph of electric field intensity corresponding to each position of this cross-sectional view. An upper portion of FIG. 6 is a schematic cross-sectional view showing a portion of ohmic contact of the cathode electrode 18 in the SBD 1 as a comparison example in a conventional configuration in which the dielectric layer 21 is not provided, and a lower portion of FIG. 6 is a graph of electric field intensity corresponding to each position of this cross-sectional view. Reference symbols in FIG. 6 are identical to those of corresponding to the SBD 1 according to Embodiment 1. Scales in vertical axes of the graphs of the electric field intensities in the respective FIGS. 4, 5, and 6 are identical to one another.

From comparison between FIGS. 4 and 5 showing measurement results in the SBD 1 according to this Embodiment 1 and FIG. 6 showing measurement results in the SBD 1 according to the comparison example, it is found that the electric field intensity in the area in which the dielectric layer 21 is provided decreases more than those of the conventional configuration. From FIGS. 4 to 6, it was confirmed that, in an area in which the 2DEG layer a is produced, the electric field intensity is almost zero and the cathode electrode 18 and the 2DEG layer a are substantially identical in electric potentials.

From FIG. 5, it is found that, in the SBD 1 in which the dielectric layer 21 is formed inside the 2DEG-non-produced area 13*a* along the width direction of the electrode, the electric field intensity increases locally at a step portion at which the cathode electrode 18 is stranded on the dielectric layer 21, that is, a so-called electric field concentration point exists. If the electric field concentration point exists in the semiconductor stack configuring the nitride semiconductor device, there is a possibility of decrease in voltage resistance, electric current collapse, and increase in leakage current or the like. By contrast, from FIG. 4, it is found that an electric field concentration point does not exist in the SBD 1 in which the dielectric layer 21 is formed to cover the 2DEG-non-produced area 13*a* and the perimeter portion of the 2DEG-non-produced area 13*a* is positioned inside the dielectric layer 21 by the interval d. Therefore, by forming the dielectric layer 21 to cover the 2DEG-non-produced area 13*a*, effects of high voltage resistance, reduction in electric current collapse, and reduction in leakage current or the like are achieved compatibly. As a result of various experiments conducted by the inventors, it was confirmed that an electric-field-dispersing effect restraining an electric field concentration point from being produced by making the interval d within the above-described range.

The SBD 1 as a nitride semiconductor device according to this Embodiment 1 is configured as described above. This SBD 1 can be produced as follows.

That is, at first, the buffer layer 12 and the electron transition layer 13 are grown successively on the substrate 11 by using a crystal-grow method such as, for example, metalorganic chemical vapor deposition (MOCVD) method or the like. Then, the electron-supplying layer 14 is grown on the electron transition layer 13 by a crystal-grow method such as the MOCVD method or the like.

Then, a semiconductor layer which is to become the two-dimensional-electron-gas-controlling layer 15 is grown on the electron-supplying layer 14. When growing this semiconductor layer, impurities such as, for example, C and Mg or the like may be doped. To be more specific, herein the growth of this semiconductor layer can be conducted as follows. That is, trimethylgallium (TMGa) and ammonia ($NH_3$) are introduced by, for example, the MOCVD method by predetermined flow amounts respectively (for example, 58 μmol/min and 12 L/min respectively). Simultaneously with this, the semiconductor layer is grown epitaxially by flowing trimethylaluminum (TMAl) by a constant flow amount, which is equal to or lower than 0.1% of the flow amount of $NH_3$ and by setting a growth temperature at, for example, 1050° C. Then, the 2DEG-non-produced area 13*a* for restraining the 2DEG from being produced is formed in a portion of an area, in which the cathode C is formed by making, for example, N, H, or Ar or the like be subjected to ion injection. Herein an area to which the ion injection was conducted is also insulated. After that, the two-dimensional-electron-gas-controlling layer 15 is formed by conducting a selective etching to remove the semiconductor layer selectively. Then, the recessed portion 15*a* is formed by removing portions of the electron-supplying layer 14 and the electron transition layer 13, in an area in which the anode A is formed, by the selective etching.

After that, a portion of the insulating film 20, the dielectric layer 21, and the contact portion 21*a* are formed by using a conventionally known technology such as, for example, PECVD method, photo-lithography technology, and etching technology or the like. Herein the forming of the dielectric layer 21 and the forming of the insulating film 20 may be conducted simultaneously or separately in different steps. After that, the cathode electrode 18 is formed by using a combination of conventionally known methods such as, for example, spattering method and lift-off method or etching or the like.

Then, a portion of the insulating film 20 having a step-shaped portion is formed by using, for example, PECVD method, photo-lithography technology, and etching technology successively and appropriately. Then, the anode electrode 16 having a field plate structure is formed in an area covering the recessed portion 15*a* by spattering method and lift-off method.

Then, the remaining portion of the insulating film 20 is formed after the anode wiring 17 is formed on the anode electrode 16 and the cathode wiring 19 is formed on the cathode electrode 18 respectively. For the anode wiring 17 and the cathode wiring 19, it is desirable that metal of which main component is any one of aluminum (Al), copper (Cu), and aurum (Au) be used, and in this Embodiment 1, for example, Al is used. The SBD 1 according to this Embodiment 1 is produced by the above-described steps.

According to the above-described Embodiment 1 of the present invention, since the wiring capacity in the SBD 1 can be reduced while maintaining the wiring width of the cathode wiring 19 at a wiring width limited based on measures to EM relative to the electric current capacity and without changing design thicknesses of the buffer layer 12, the electron transition layer 13, and the electron-supplying layer 14 by providing the dielectric layer 21 made of a material of which permittivity is lower than the permittivities of the buffer layer 12 and the semiconductor stack at a lower layer of the cathode electrode 18 making ohmic contact to the 2DEG layer a via the electron-supplying layer 14 in the contact portion 21*a*, switching time caused by capacity component can be improved by reducing the wiring capacity when applying an off-state voltage, and it is possible to improve switching characteristics and reduce switching loss in a case of operating at a higher frequency.

Figure 7:
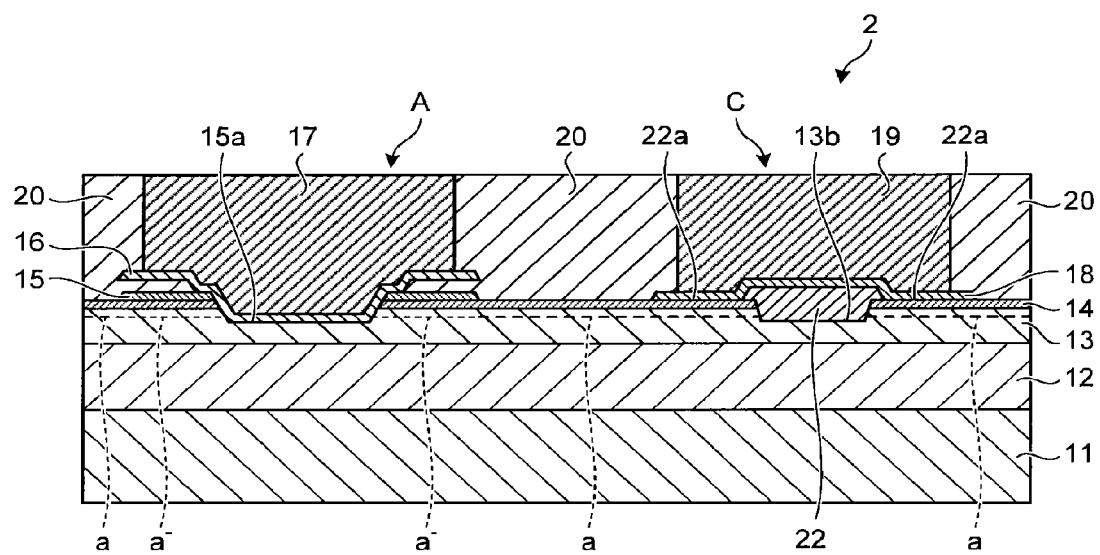
FIG. 7 is a schematic cross-sectional view showing an SBD according to Embodiment 2 of the present invention.

Hereafter, a nitride semiconductor device according to Embodiment 2 of the present invention will be explained. FIG. 7 is a schematic cross-sectional view showing an SBD 2 as the nitride semiconductor device according to this Embodiment 2.

As shown in FIG. 7, in the SBD 2 according to Embodiment 2, a recessed portion 13*b* is formed selectively in a portion inside areas, of the electron-supplying layer 14 and the electron transition layer 13, in which the cathode electrode 18 is formed. The 2DEG-non-produced area, in which the 2DEG layer a is removed in the electron transition layer 13, is configured with this recessed portion 13*b*. A lower portion of a dielectric layer 22 made of a material which is similar to that of the dielectric layer 21 of Embodiment 1 is buried in the recessed portion 13*b*. That is, it is configured so that the 2DEG is not produced in this area of the recessed portion 13*b* by forming the recessed portion 13*b* instead of forming the 2DEG-non-produced area 13*a* of Embodiment 1.

An upper portion of the dielectric layer 22 is stranded on the electron-supplying layer 14 to cover the recessed portion 13*b* for restraining the electric field concentration point, described in Embodiment 1, from being produced, and is provided to be separated from the insulating film 20 at a portion of a contact portion 22*a*. The cathode electrode 18 is provided to cover the dielectric layer 22 and to make ohmic contact with the 2DEG layer a on a surface of the electron-supplying layer 14 and at the contact portion 22a. In this SBD 2, the anode electrode 16 is grounded as a counterpart electrode to the cathode electrode 18 which is an electrode at a side at which the dielectric layer 22 is provided.

The SBD 2 configured as such can be produced as follows. At first, similarly to Embodiment 1, after growing the buffer layer 12, the electron transition layer 13, and the electron-supplying layer 14 on the substrate 11 in this order, the two-dimensional-electron-gas-controlling layer 15 is formed selectively. Then, the recessed portion 13b is formed selectively inside an area, in which the cathode C is formed, in the electron-supplying layer 14 and the electron transition layer 13 by a lithography step and an etching step. After that, the dielectric layer 22 is formed so that the dielectric layer 22 buries and covers the recessed portion 13b by, for example, PECVD method. A portion of the insulating film 20 may be formed simultaneously with this, and in this case, the dielectric layer 22 is made of a material that is the same as that of the insulating film 20. After that, similarly to Embodiment 1, remaining portions of the anode electrode 16, the cathode electrode 18, the anode wiring 17, the cathode wiring 19, and the insulating film 20 are formed to produce the SBD 2. Explanations for other configuration and production method, which are similar to those in Embodiment 1, will be omitted.

According to the above-described Embodiment 2, since the 2DEG-non-produced area is provided, in which the 2DEG is not produced, by forming the recessed portion 13b in the electron transition layer 13 at a portion of a lower layer of the cathode electrode 18, and since the dielectric layer 22 is buried in this recessed portion 13b, therefore wiring capacities between, the cathode wiring 19 and the cathode electrode 18, and the substrate 11 or the buffer layer 12 can be reduced, similar effect to Embodiment 1 can be obtained.

Figure 8:
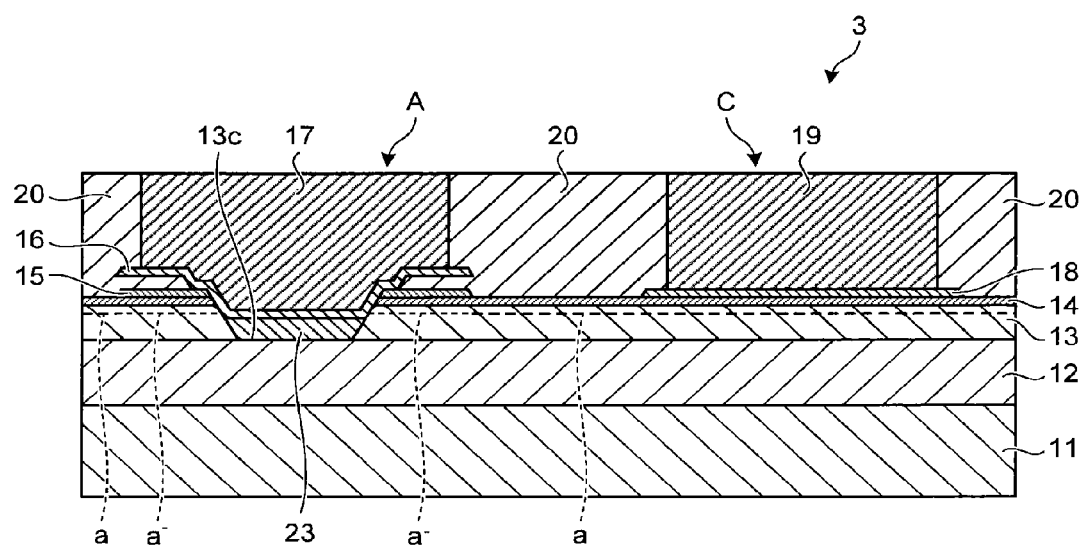
FIG. 8 is a schematic cross-sectional view showing an SBD according to Embodiment 3 of the present invention.

Hereafter a nitride semiconductor device according to Embodiment 3 of the present invention will be explained. FIG. 8 is a schematic cross-sectional view showing an SBD 3 as a nitride semiconductor device according to this Embodiment 3.

As shown in FIG. 8, and unlike Embodiment 1 and 2, in the SBD 3 according to Embodiment 3, a recessed portion 13c reaching the buffer layer 12 selectively is formed in portions of the two-dimensional-electron-gas-controlling layer 15, the electron-supplying layer 14, and the electron transition layer 13 in areas in which the anode A is formed. The 2DEG-non-produced area is configured with this recessed portion 13c. A dielectric layer 23 made of a material similar to that of the dielectric layer 21 of Embodiment 1 is buried inside the recessed portion 13c. The thickness of this dielectric layer 23 is, for example, approximately 1 µm, and its upper surface is in a shape recessing from the upper surface of the electron transition layer 13. The anode electrode 16 provided on an upper layer of the dielectric layer 23 makes schottky contact laterally with the 2DEG layer a as lower layers of the two-dimensional-electron-gas-controlling layer 15 and the electron-supplying layer 14 at an upper portion of inner wall of the recessed portion 13c.

Similarly to the SBD 300 shown in FIG. 35, the cathode electrode 18 is provided on a surface of the electron-supplying layer 14 to make ohmic contact with the 2DEG layer a via the electron-supplying layer 14. In the SBD 3 shown in FIG. 8, the cathode electrode 18 is grounded as a counterpart electrode to the anode electrode 16 as an electrode to which the dielectric layer 23 is provided. Herein the inventors measured reduction rate of wiring capacity of the SBD 3 relative to the SBD 300 shown in FIG. 35, and it was confirmed that the wiring capacity reduced by approximately 22% relative to conventional wiring capacity.

The SBD 3 configured as such can be produced as follows. At first, similarly to Embodiment 1, after the buffer layer 12, the electron transition layer 13, and the electron-supplying layer 14 are grown on the substrate 11 in this order, the two-dimensional-electron-gas-controlling layer 15 is formed selectively. Then, the recessed portion 13c is formed selectively in areas, in which the anode A is formed, of the two-dimensional-electron-gas-controlling layer 15, the electron-supplying layer 14, and the electron transition layer 13 by a lithography step and an etching step. After that, the dielectric layer 23 is formed so that the dielectric layer 23 buries a lower portion of the recessed portion 13c by, for example, PECVD method. A portion of the insulating film 20 may be formed simultaneously with this, and in this case, the dielectric layer 23 is configured with a material that is the same as that of the insulating film 20. After that, similarly to Embodiment 1, remaining portions of the anode electrode 16, the cathode electrode 18, the anode wiring 17, the cathode wiring 19, and the insulating film 20 are produced. Other steps are conducted similarly to Embodiment 1 to produce the SBD 3 according to Embodiment 3. Explanations for other configuration and production method, which are similar to those in Embodiments 1 and 2, will be omitted.

According to the above-described Embodiment 3, the recessed portion 13c is formed in the electron transition layer 13 at a portion of a lower layer of the anode electrode 16, and since the dielectric layer 22 is buried in this recessed portion 13c, therefore wiring capacities between, the anode wiring 17 and the anode electrode 16, and the substrate 11 or the buffer layer 12 can be reduced, similar effects to Embodiments 1 and 2 can be obtained.

Figure 9:
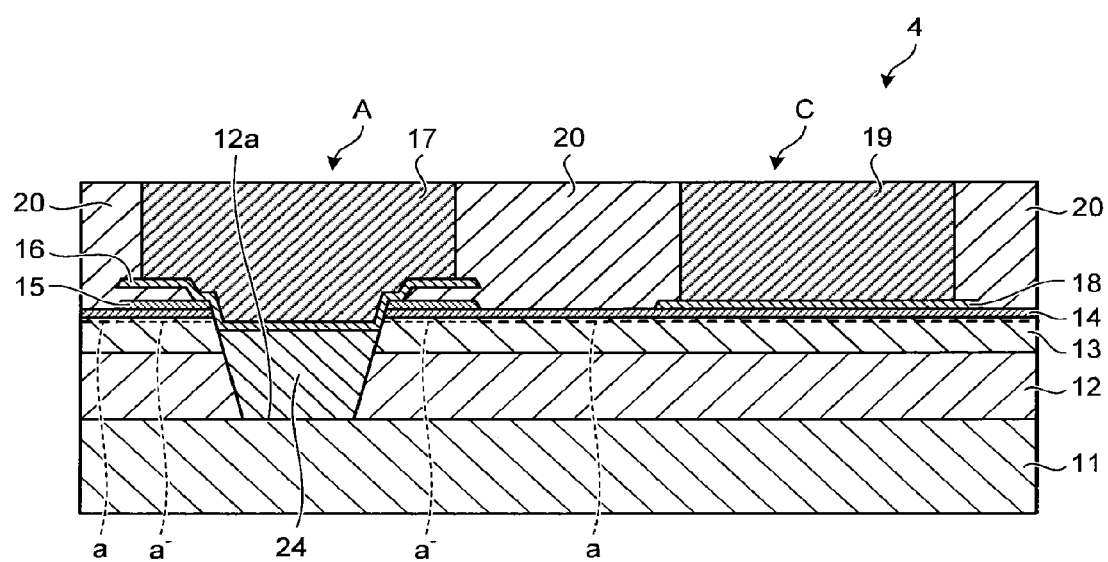
FIG. 9 is a schematic cross-sectional view showing an SBD according to Embodiment 4 of the present invention.

Hereafter a nitride semiconductor device according to Embodiment 4 of the present invention will be explained. FIG. 9 is a schematic cross-sectional view showing an SBD 4 as a nitride semiconductor device according to this Embodiment 4.

As shown in FIG. 9, and unlike Embodiment 3, in the SBD 4 of Embodiment 4, a recessed portion 12a reaching the substrate 11 is formed in portions, in a portion inside an area in which the anode electrode 16 is formed, of the two-dimensional-electron-gas-controlling layer 15, the electron-supplying layer 14, and the electron transition layer 13, and the buffer layer 12. The 2DEG-non-produced area is configured with this recessed portion 12a. A dielectric layer 24 made of a material similar to that of the dielectric layer 21 of Embodiment 1 is buried inside the recessed portion 12a. The thickness of this dielectric layer 24 is, for example, approximately 5 µm, and its upper surface is of a shape recessing from the upper surface of the electron transition layer 13 similarly to Embodiment 3. Hereby the anode electrode 16 provided on its upper layer makes schottky contact laterally with the 2DEG layer a as lower layers of the two-dimensional-electron-gas-controlling layer 15 and the electron-supplying layer 14 at an upper portion of inner wall of the recessed portion 12a.

In the SBD 4, the cathode electrode 18 is grounded as a counterpart electrode to the anode electrode 16 as an electrode to which the dielectric layer 24 is provided. Herein the inventors measured reduction rate of wiring capacity of the SBD 4 relative to the SBD 300 shown in FIG. 35, and it was confirmed that the wiring capacity reduced by approximately 58% relative to conventional wiring capacity.

The SBD 4 configured as such can be produced as follows. At first, similarly to Embodiment 3, after the buffer layer 12, the electron transition layer 13, and the electron-supplying layer 14 are grown on the substrate 11 in this order, the two-dimensional-electron-gas-controlling layer 15 is formed selectively. Then, the recessed portion 12a is formed selectively in areas, in which the anode electrode 16 is formed, of the two-dimensional-electron-gas-controlling layer 15, the electron-supplying layer 14, the electron transition layer 13, and the buffer layer 12 by a lithography step and an etching step. After that, the dielectric layer 24 is formed by, for example, PECVD method, so as to obtain a portion in which the anode electrode 16 makes schottky contact with the 2DEG layer a at an upper portion of the electron transition layer 13 of the recessed portion 12a and bury its lower portion. A portion of the insulating film 20 may be formed simultaneously with this, and in this case, the dielectric layer 24 is made of a material that is the same as that of the insulating film 20. After that, similarly to Embodiment 3, remaining portions of the anode electrode 16, the cathode electrode 18, the anode wiring 17, the cathode wiring 19, and the insulating film 20 are formed to produce the SBD 4 according to Embodiment 4. Explanations for other configuration and production method, which are similar to those in Embodiments 1, 2, and 3, will be omitted.

According to the above-described Embodiment 4, the recessed portion 12a is formed in the electron transition layer 13 at a portion of a lower layer of the anode electrode 16 and the buffer layer 12, and since the dielectric layer 24 is buried in this recessed portion 12a, therefore wiring capacities between, the anode wiring 17 and the anode electrode 16, and the substrate 11 can be reduced, similar effects to Embodiments 1 and 3 can be obtained.

Figure 10:
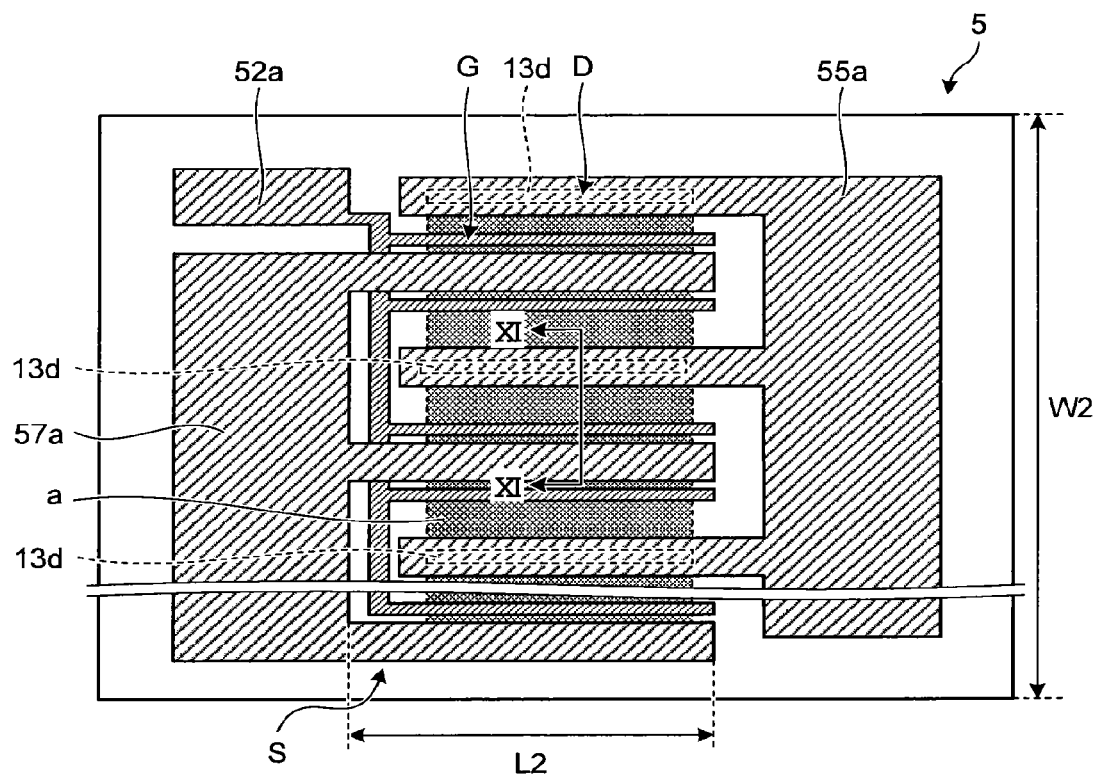
FIG. 10 is a schematic plan view, viewed from above, of a HEMT according to Embodiment 5 of the present invention.
Figure 11:
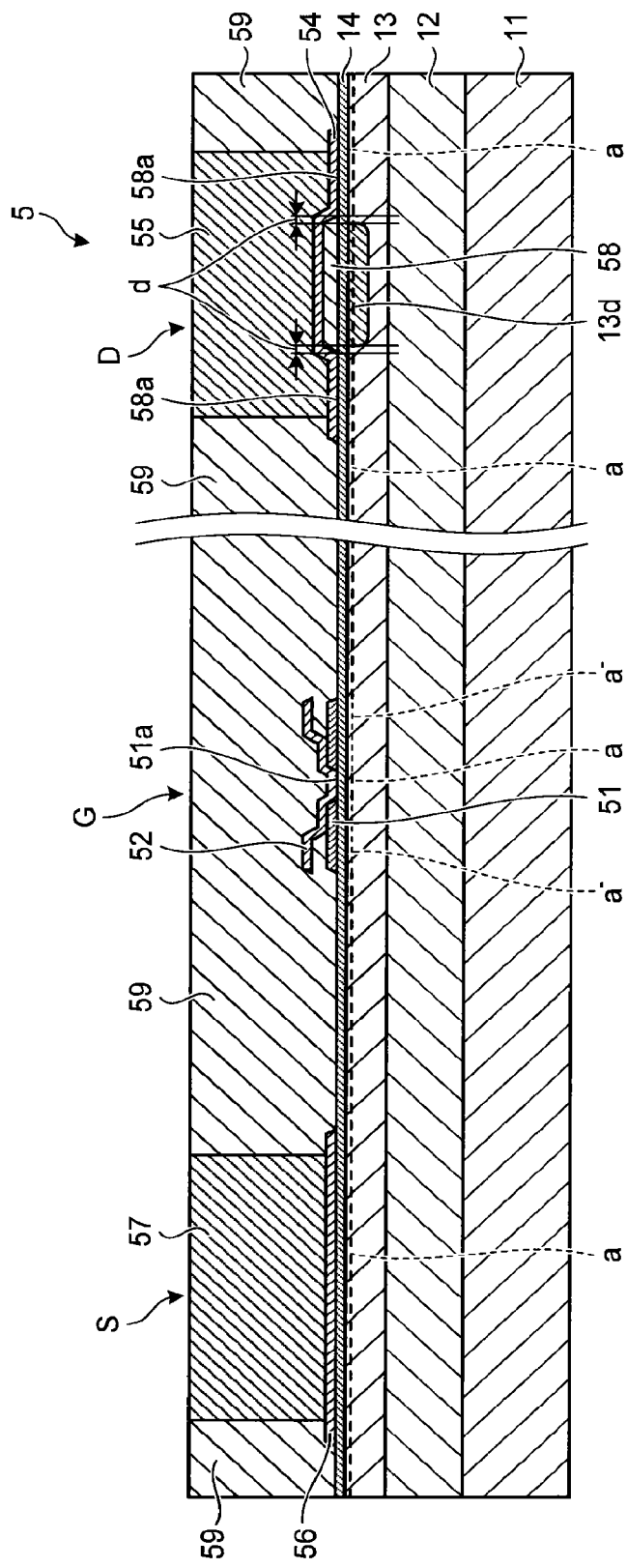
FIG. 11 is a schematic cross-sectional view of the HEMT along XI-XI line of FIG. 10.

Hereafter a high electron mobility transistor (HEMT) as a nitride semiconductor device according to Embodiment 5 of the present invention will be explained. FIG. 10 is a plan view, viewing from upward, of a HEMT 5 as this nitride semiconductor device. FIG. 11 is a schematic cross-sectional view of the HEMT 5 viewed along XI-XI line of FIG. 10.

As shown in FIG. 10, in the HEMT 5, provided flatly on the 2DEG layer a are a source S and a drain D so that the gate G is a lower layer side to the source S. A main electrode becoming the gate G, the drain D, and the source S are of a slit-and-finger-shaped and connected to a gate pad 52a, a drain pad 55a, and a source pad 57a that are positioned on a same plane with one another respectively. A device width W2 of the HEMT 5 is 0.1 to 25 mm, for example, approximately 4.0 mm, and a wiring length L2 of the finger electrode as the finger-shaped main electrode is 0.5 to 5.0 mm, for example, approximately 1.0 mm. When arranging the finger electrode in the plane of the HEMT 5, the gate G is disposed along a direction orthogonal to the longitudinal direction of the finger electrode and between the source S and the drain D. In a portion of the 2DEG layer a in an area of the drain D, a 2DEG-non-produced area 13d in which the 2DEG is removed is formed.

As shown in FIG. 11, the HEMT 5 according to Embodiment 5 includes the substrate 11, the buffer layer 12, the electron transition layer 13, the electron-supplying layer 14, the two-dimensional-electron-gas-controlling layer 51, the gate electrode 52, a drain electrode 54 and a drain wiring 55, a source electrode 56 and a source wiring 57, a dielectric layer 58, and an insulating film 59.

The 2DEG-non-produced area 13d is provided in a portion, in which the drain D is formed, of the electron transition layer 13, and the electron-supplying layer 14 is formed on the electron transition layer 13. A portion of the semiconductor stack is configured with these electron transition layer 13 and the electron-supplying layer 14, the 2DEG layer a is produced at an interface between the electron transition layer 13 and the electron-supplying layer 14 and inside the semiconductor stack. Since impurity ion is injected into the 2DEG-non-produced area 13d of the electron transition layer 13, for example, N or the like, the 2DEG-non-produced area 13d is an area in which the 2DEG is removed and thus no 2DEG is produced.

Moreover, the two-dimensional-electron-gas-controlling layer 51 is provided selectively on the surface of the electron-supplying layer 14. Formed in an area, in which the gate G is formed, of the two-dimensional-electron-gas-controlling layer 51 is a recessed portion 51a reaching the electron-supplying layer 14 as a lower layer. The gate electrode 52 is provided on the recessed portion 51a to cover this recessed portion 51a. The gate G of the HEMT 5 is configured with this gate electrode 52.

The drain electrode 54 is provided on the electron-supplying layer 14 selectively and separately from the gate electrode 52. The drain wiring 55 electrically connected to the drain electrode 54 is provided on the drain electrode 54. The drain D of the HEMT 5 is configured with the drain electrode 54 and the drain wiring 55. The dielectric layer 58 is provided selectively on the electron-supplying layer 14. The dielectric layer 58 is provided in an area being inside the drain electrode 54 along the width direction of the electrode between the drain electrode 54 and the electron-supplying layer 14 and covering the 2DEG-non-produced area 13d.

The source electrode 56 is provided on the electron-supplying layer 14 selectively and separately from the drain electrode 54 and the gate electrode 52. The source wiring 57 connected to the source electrode 56 electrically is provided on the source electrode 56. The source S of the HEMT 5 is configured with the source electrode 56 and the source wiring 57. The gate electrode 52 is disposed between the source electrode 56 and the drain electrode 54. In this Embodiment 5, the source electrode 56, which is an ohmic electrode other than the drain electrode 54 as an electrode provided at a side to which the dielectric layer 58 is provided, is grounded and identical in electric potential to those of the substrate 11 or the buffer layer 12.

In order to vary the 2DEG concentration of the 2DEG layer a produced in the electron transition layer 13 locally, the two-dimensional-electron-gas-controlling layer 51 configured with a portion of the third semiconductor layer is made of GROUP-III nitride compound semiconductor, of which bandgap is narrower than that of the electron-supplying layer 14, to be more specific, for example, GaN. In this Embodiment 5, the semiconductor stack is configured with the electron transition layer 13, the electron-supplying layer 14, and the two-dimensional-electron-gas-controlling layer 51, and the 2DEG layer a inside the semiconductor stack is varied by the two-dimensional-electron-gas-controlling layer 51. The more the thickness of the two-dimensional-electron-gas-controlling layer 51 increases, the more the 2DEG concentration decreases. In this Embodiment 5, it is preferable that the thickness of the two-dimensional-electron-gas-controlling layer 51 be, for example, equal to or greater than 20 nm and equal to or smaller than 200 nm, and it is more preferable that the thickness of the two-dimensional-electron-gas-controlling layer 51 be equal to or greater than 20 nm and equal to or smaller than 100 nm from a view point of facilitating control of the 2DEG concentration by thickness-control using growth and etching. It is further more preferable that the thickness of the two-dimensional-electron-gas-controlling layer 51 be equal to or greater than 25 nm and equal to or smaller than 80 nm at which it is hardly affected by variation of 2DEG concentration caused by variation of the thickness. Moreover, from a view point of achieving high voltage resistance for the HEMT 5, it is preferable that the thickness of the two-dimensional-electron-gas-controlling layer 51 be determined so that the 2DEG concentration be smaller than $7 \times 10^{12}$ cm$^{-2}$ in an area in which the 2DEG concentration is low. From a view point of reducing an on-state resistance of the HEMT 5, it is preferable that the 2DEG concentration be equal to or greater than $7 \times 10^{12}$ cm$^{-2}$ in an area in which the 2DEG concentration is high.

The gate electrode 52 as the third electrode has a layered structure made of, for example, Ni/Au, and is provided to cover the recessed portion 51*a*. Hereby the gate electrode 52 is provided on the surface, on which the recessed portion 51*a* is not formed, of the electron-supplying layer 14, and makes schottky contact with the 2DEG layer a provided in the electron transition layer 13 via the electron-supplying layer 14. A gate insulating film may be provided as a lower layer of the gate electrode 52.

This gate electrode 52 is stranded on the two-dimensional-electron-gas-controlling layer 51 to form at least one step and is stranded on one step formed from the insulating film 59 to extend and arch out toward the drain electrode 54 and the source electrode 56. In this Embodiment 5, the gate electrode 52 is provided to contact a side surface and a portion of the upper surface of the two-dimensional-electron-gas-controlling layer 51. Other semiconductor film and a dielectric film may be disposed to make the gate electrode 52 and the two-dimensional-electron-gas-controlling layer 51 not contact with each other, and a gate insulating film may be provided between the electron transition layer 13 and the electron-supplying layer 14. The gate electrode 52 may be configured to arch out and extend to only one side of the drain electrode 54 and the source electrode 56.

The thickness of the insulating film 59 between the two-dimensional-electron-gas-controlling layer 51 and the gate electrode 52 increases so as to be increased continuously or incrementally from the gate electrode 52 toward the drain electrode 54 and the source electrode 56. Hereby an effect of dispersing electric field can be obtained by a field plate structure of the gate electrode 52.

The insulating film 59 is configured with, for example, $SiO_2$. The insulating film 59 protects surfaces of the two-dimensional-electron-gas-controlling layer 51, the gate electrode 52, the drain wiring 55, the source electrode 56, the source wiring 57, and the electron-supplying layer 14 mainly. The insulating film 59 may be configured with a material other than other than $SiO_2$, specifically $SiN_x$ and $Al_2O_3$ or the like, and may be configured with combining appropriately, or layering successively, plural kinds of materials. In this Embodiment 5, the thickness of the insulating film 59 is a thickness converted from the thickness of the $SiO_2$ layer based on a ratio of permittivity of a material configuring the insulating film 59 and permittivity of $SiO_2$.

The dielectric layer 58 is provided selectively on the electron-supplying layer 14 on an upper layer of the 2DEG-non-produced area 13*d* formed in a portion of the electron transition layer 13 to cover the 2DEG-non-produced area 13*d*. Herein this dielectric layer 58 is provided to be separated from the insulating film 59 at the contact portion 58*a*. The dielectric layer 58 may be provided independently from the insulating film 59 and configured with a portion of the insulating film 59. That is, the dielectric layer 58 may be configured with a material identical to, or other than, that of the insulating film 59, for example, $SiO_2$ or the like. Similarly to Embodiment 1, it is preferable that the dielectric layer 58 be configured with a material of which permittivity is lower than permittivities of the materials configuring the buffer layer 12, the electron transition layer 13, and the electron-supplying layer 14. For that material, $SiO_2$ formed by PECVD method, $SiO_2$ or $SiN_x$ which are doped with F and C, or BCN can be named.

The drain electrode 54 as the second electrode has a layered structure made of, for example, Ti/Al and is provided to cover the 2DEG-non-produced area 13*d* and the dielectric layer 58 on the electron-supplying layer 14 and along a plane which is parallel to a primary surface of the substrate 11. By the configuration as such, the drain electrode 54 makes ohmic contact with the 2DEG layer a produced on the electron transition layer 13 through the contact portion 58*a* and via the electron-supplying layer 14. That is, the drain electrode 54 is provided, while making ohmic contact onto the surface of the electron-supplying layer 14 at the contact portion 58*a*, to sandwich the dielectric layer 58 with the electron-supplying layer 14.

For the reason similar to the reason in the above-described Embodiment 1, the thickness of the dielectric layer 58 is preferably equal to or greater than 0.2 μm and equal to or smaller than 1.5 μm, and for example, 0.5 μm in this Embodiment 5. For the reason similar to the reason in the above-described Embodiment 1, the interval d between perimeter portions of the dielectric layer 58 and the 2DEG-non-produced area 13*d* in an area in which the drain D is formed and along a plane which is in parallel with the primary surface of the substrate 11 is preferably equal to or greater than 0.5 μm and equal to or smaller than 3.0 μm, and more preferably equal to or greater than 0.5 μm and equal to or smaller than 2 μm, and for example, 1.0 μm in this Embodiment 5.

The source electrode 56 as the first electrode has a layered structure made of, for example, Ti/Al, and is provided selectively on the electron-supplying layer 14. Hereby the source electrode 56 makes ohmic contact with the 2DEG layer a produced in the electron transition layer 13 via the electron-supplying layer 14.

As described above, the HEMT 5 as the nitride semiconductor device according to this Embodiment 5 is configured. This HEMT 5 can be produced as follows.

That is, at first, the buffer layer 12 and the electron transition layer 13 are grown in this order on the substrate 11 by, for example, MOCVD method or the like. Then, the electron-supplying layer 14 is grown on the electron transition layer 13 by crystal-grow method such as MOCVD method or the like.

Then, a semiconductor layer to become the two-dimensional-electron-gas-controlling layer 51 is grown on the electron-supplying layer 14. When growing this semiconductor layer, the semiconductor layer may be doped with impurity, for example, C or the like. Herein, when growing this semiconductor layer, TMGa and $NH_3$ are introduced respectively at predetermined flow amounts (for example, 58 μmol/min and 12 L/min respectively) by, for example, MOCVD method. Simultaneously to this, the semiconductor layer is grown epitaxially by flowing TMAl by a constant flow amount which is equal to or lower than 0.1% of flow amount of $NH_3$ and at a growth temperature of, for example, 1050° C. Then, the 2DEG-non-produced area 13*d* for restraining the 2DEG from being produced is formed by making, for example, N, H, or Ar or the like be subjected to ion injection into a portion of an area, in which the drain D is formed, of the electron transition layer 13. Herein, the area, being subjected to ion injection, of the electron-supplying layer 14 is also insulated. After that, by conducting a selective etching and removing the semiconductor layer selectively, the two-dimensional-electron-gas-controlling layer 51 is formed and the recessed portion 51a is formed in a portion of the two-dimensional-electron-gas-controlling layer 51.

After that, a portion of the insulating film 59, the dielectric layer 58, and the contact portion 58a are formed by using a conventionally known technology, for example, PECVD method, photo-lithography technology, and etching technology or the like. Herein forming of the dielectric layer 58 and forming of the insulating film 59 may be conducted simultaneously or in separate steps. After that, the drain electrode 54 and the source electrode 56 are formed by a conventionally known method, for example, spattering method, lift-off method, or etching method or the like.

Then, a portion of the insulating film 59 having a step-shaped portion is formed by using, for example, PECVD method, photo-lithography technology, and etching technology appropriately and successively. Then, the gate electrode 52 having a field plate structure is formed in an area covering the recessed portion 51a by spattering method and lift-off method.

Then, after forming the drain wiring 55 on the drain electrode 54 and forming the source wiring 57 on the source electrode 56 respectively, the remaining portion of the insulating film 59 is formed. It is desirable that a metal of which main component is one of Al, Cu, and Au be used for the drain wiring 55 and the source wiring 57, and for example, Al is used in this Embodiment 5. The HEMT 5 according to this Embodiment 5 is produced by the above-described steps. Explanations for other configuration and production method of the semiconductor device, which are similar to those in Embodiments 1 to 4, will be omitted.

The above-described Embodiment 5 of the present invention can obtain effects similar to those of Embodiment 1 to 4 since the wiring width of the drain wiring 55 is achieved at the wiring width determined based on the measures to EM and the wiring capacity of the HEMT 5 can be reduced without changing the thicknesses of the buffer layer 12, the electron transition layer 13, and the electron-supplying layer 14 because the dielectric layer 58, made of a material of which permittivity is lower than permittivity of the buffer layer 12 and permittivity of the semiconductor stack, is provided at the drain electrode 54 as a lower layer making ohmic contact with the 2DEG layer a via the electron-supplying layer 14 at the contact portion 58a.

Figure 12:
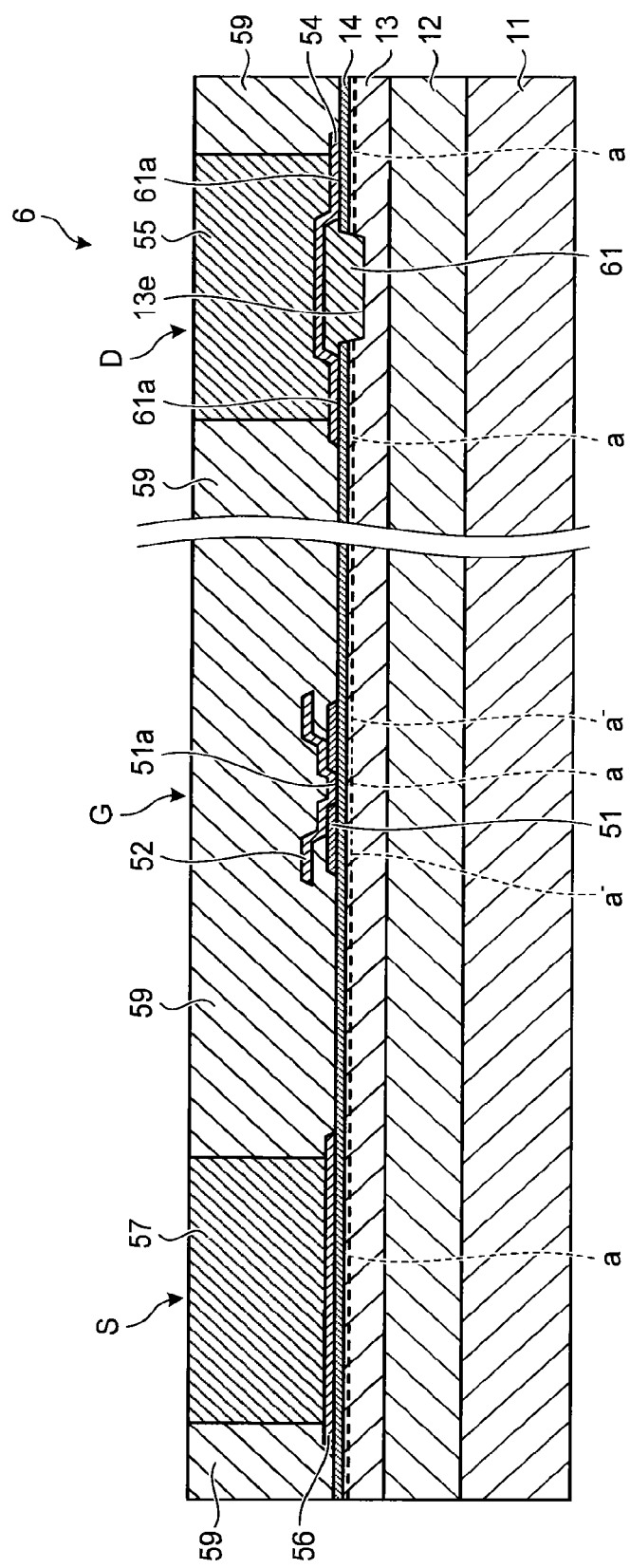
FIG. 12 is a schematic cross-sectional view showing a HEMT according to Embodiment 6 of the present invention.

Hereafter a nitride semiconductor device according to Embodiment 6 of the present invention will be explained. FIG. 12 is a schematic cross-sectional view showing a HEMT 6 as a nitride semiconductor device according to this Embodiment 6.

As shown in FIG. 12, in the HEMT 6 according to Embodiment 6, a recessed portion 13e is formed selectively in a portion inside areas, in which the drain electrode 54 is formed, of the electron-supplying layer 14 and the electron transition layer 13. Hereby the 2DEG-non-produced area is configured in which the 2DEG layer a is removed in the electron transition layer 13. A lower portion of a dielectric layer 61 which is made of a material similar to that of the dielectric layer 58 in the Embodiment 5 is buried in this recessed portion 13e. That is, it is configured with forming the recessed portion 13e in place of the 2DEG-non-produced area 13d of the Embodiment 5 so that the 2DEG is not produced.

The upper portion of the dielectric layer 61 arches out to cover the recessed portion 13e above the electron-supplying layer 14 and is provided to be separated from the insulating film 59 at a portion of the contact portion 61a. The drain electrode 54 is provided to make ohmic contact with the 2DEG layer a at the surface of the electron-supplying layer 14 at the contact portion 61a to cover the dielectric layer 61. In this HEMT 6, the source electrode 56 is grounded which is an electrode other than the drain electrode 54 as the electrode at a side to which the dielectric layer 61 is provided.

The HEMT 6 configured as such can be produced as follows. At first, similarly to Embodiment 5, after growing the buffer layer 12, the electron transition layer 13, and the electron-supplying layer 14 on the substrate 11 successively, the two-dimensional-electron-gas-controlling layer 51 is formed selectively. Then, the recessed portion 13e is formed selectively inside areas, in which the drain electrode 54 is formed, of the electron-supplying layer 14 and the electron transition layer 13 by a lithography step and an etching step. Then, the dielectric layer 61 is formed, by, for example, PECVD method, so as to bury and cover the recessed portion 13e. A portion of the insulating film 59 may be formed simultaneously to this, and in this case, the dielectric layer 61 is configured with a material that is the same as that of the insulating film 59. After that, similarly to Embodiment 5, the drain electrode 54, the source electrode 56, the gate electrode 52, the drain wiring 55, the source wiring 57, and the remaining portion of the insulating film 59 are formed to produce the HEMT 6. Explanations for other configuration and production method, which are similar to that in Embodiment 5, will be omitted.

The above-described Embodiment 6 can obtain effects similar to that of Embodiment 5 since the wiring capacities between, the drain wiring 55 and the drain electrode 54, and the substrate 11 or the buffer layer 12 can be reduced because the recessed portion 13e is formed in the electron transition layer 13 in a portion of a lower layer of the drain electrode 54 to provide the 2DEG-non-produced area in which the 2DEG is not produced and the dielectric layer 61 is buried in this recessed portion 13e.

Figure 13:
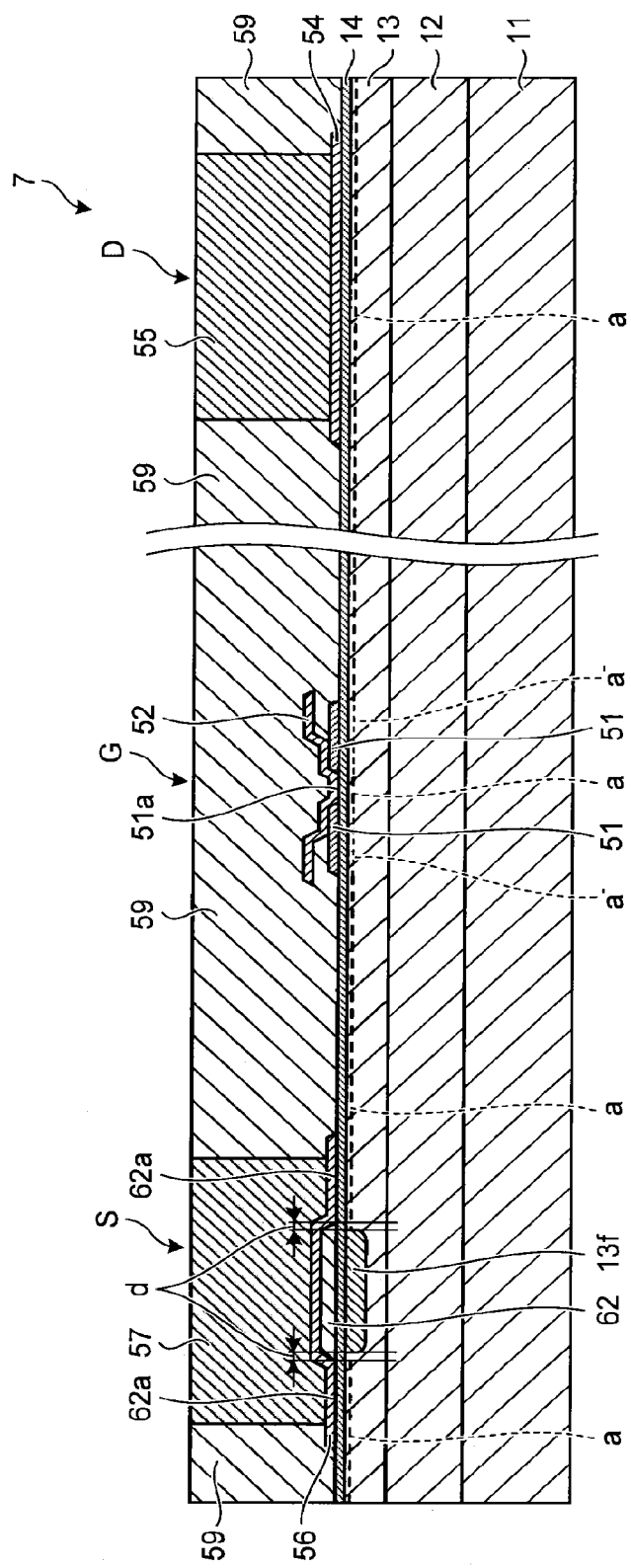
FIG. 13 is a schematic cross-sectional view showing a HEMT according to Embodiment 7 of the present invention.

Hereafter, a nitride semiconductor device according to Embodiment 7 of the present invention will be explained. FIG. 13 is a schematic cross-sectional view showing a HEMT 7 as the nitride semiconductor device according to this Embodiment 7.

As shown in FIG. 13 and unlike Embodiment 5, in the HEMT 7 according to Embodiment 7, a 2DEG-non-produced area 13f is formed in the electron transition layer 13 in an area in which the source electrode 56 is formed, and the dielectric layer 62 is provided between the electron-supplying layer 14 on the upper layer of the electron transition layer 13 and the source electrode 56. The upper portion of the dielectric layer 62 arches out to cover the 2DEG-non-produced area 13f above the electron-supplying layer 14 and is provided to be separated from the insulating film 59 at a portion of the contact portion 62a. The source electrode 56 is provided to make ohmic contact with the 2DEG layer a at the surface of the electron-supplying layer 14 to cover the dielectric layer 62. In this HEMT 7, the drain electrode 54 is grounded which is an electrode other than the source electrode 56 as the electrode at a side to which the dielectric layer 62 is provided. Explanations for other configuration and production method, which are similar to those in Embodiments 5 and 6, will be omitted.

This Embodiment 7 can achieve an effect similar to that of Embodiment 5 since Embodiment 7 is configured in a relationship in which the drain electrode 54 and the source electrode 56 are reversed relative to the HEMT 5 according to Embodiment 5.

Figure 14:
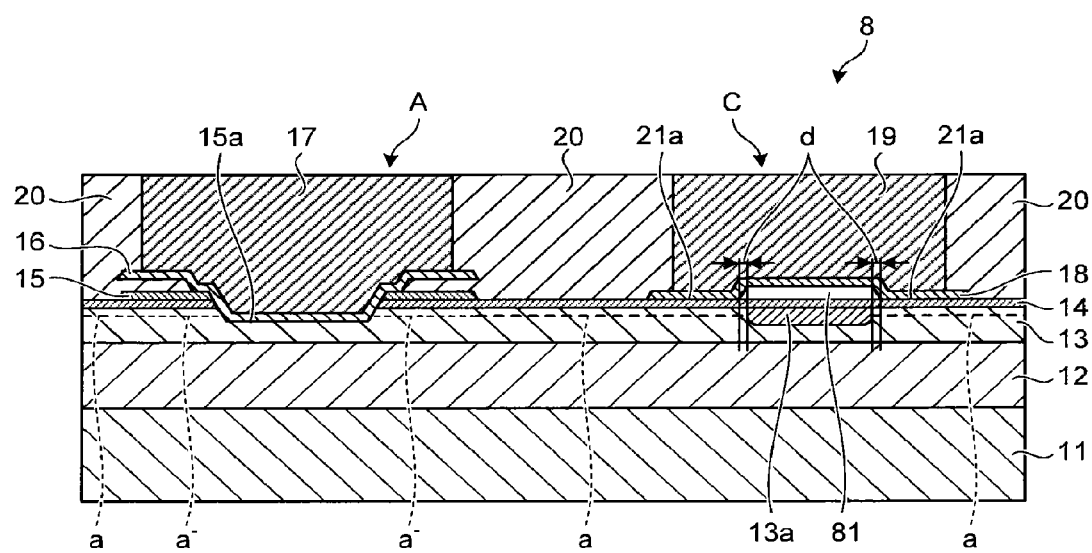
FIG. 14 is a schematic cross-sectional view showing an SBD according to Embodiment 8 of the present invention.

Hereafter, a nitride semiconductor device according to Embodiment 8 of the present invention will be explained. FIG. 14 is a schematic cross-sectional view showing an SBD 8 as the nitride semiconductor device according to this Embodiment 8.

As shown in FIG. 14, and unlike Embodiment 1, in the SBD 8 according to Embodiment 8, a gap 81 is provided as the low permittivity area in place of the dielectric layer 22. Permittivity of this gap 81 is lower than permittivities of materials configuring at least the buffer layer 12, the electron transition layer 13, and the electron-supplying layer 14.

The SBD 8 configured as such can be produced as follows. At first, similarly to Embodiment 1, the buffer layer 12, the electron transition layer 13, and the electron-supplying layer 14 are grown on the substrate 11 in this order. After that, an etching layer (not shown in the drawings) made of a material, of which etching selection ratio relative to the electron-supplying layer 14 and the electron transition layer 13 is high, is formed in an area in which the gap 81 will be formed. Then, the cathode electrode 18 is formed on this etching layer. After that, the etching layer is removed thorough the portion in which the cathode electrode 18 is removed by, for example, wet etching method. Hereby the gap 81 is formed. After that, similarly to Embodiment 1, the anode wiring 17, the cathode wiring 19, and the insulating film 20 are formed to produce the SBD 8. Explanations for other configuration and production method, which are similar to those in Embodiment 1, will be omitted.

According to the above-described Embodiment 8, the gap 81 as the low permittivity area is formed at a portion of a lower layer of the cathode electrode 18, therefore wiring capacities between the cathode wiring 19 and the cathode electrode 18, and the substrate 11 or the buffer layer 12 can be reduced, similar effects to Embodiment 1 can be obtained.

Figure 15:
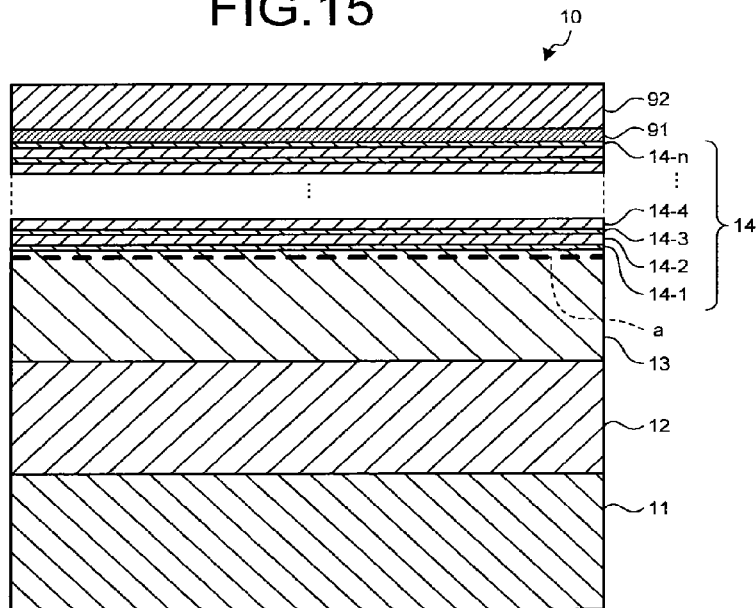
FIG. 15 is a schematic cross-sectional view showing a structure of a semiconductor-layered substrate having an electron-supplying layer made of AlGaN/AlGaN pseudo alloy according to Embodiment 9.

Hereafter, a nitride semiconductor device according to Embodiment 9 of the present invention will be explained. FIG. 15 is a cross-sectional view showing a configuration of a semiconductor-layered substrate for producing the nitride semiconductor device according to Embodiment 9 of the present invention. That is, a semiconductor-layered substrate 10 according to this Embodiment 9 is configured, similarly to Embodiment 1, by layering the buffer layer 12, the electron transition layer 13, the electron-supplying layer 14, an etching sacrifice layer 91, and a semiconductor layer 92 on the substrate 11 in this order.

The electron-supplying layer 14 as the second semiconductor layer is configured with a super-lattice layer in which plural sets of at least two kinds of GROUP-III nitride compound semiconductors each being different in Al composition ratio and bandgap are layered. The electron-supplying layer 14 in this Embodiment 9 has a pseudo alloy structure of $Al_xGa_{1-x}N$ of, for example, average Al composition ratio X. The pseudo alloy structure is made of an AlGaN super-lattice layer in which a plurality of $Al_xGa_{1-x}N$ layers 14-1 to 14-n (n: integer) are layered of which Al composition ratio x is of various values of, at least two kinds of, maximal Al composition ratio x1 or minimal Al composition ratio x2 being different from each other. The electron-supplying layer 14 is configured, in accordance with design of a nitride semiconductor device, by, at least two layers of, and preferably equal to or greater than four layers of, $Al_xGa_{1-x}N$ layers 14-1 to 14-n. That is, the 2DEG concentration Ns is controlled at a desirable concentration based on the design in accordance with the average Al composition ratio X of the electron-supplying layer 14 and the number of layers of the $Al_xGa_{1-x}N$ layers 14-1 to 14-n or of combinations of sets each including two layers. A unit for the number of combinations is 0.5. In this Embodiment 9, the average Al composition ratio X, and the number of layers (n) or the number of combinations (n/2) of each of the $Al_xGa_{1-x}N$ layers 14-1 to 14-n are adjusted so that the 2DEG concentration Ns is smaller than, for example, $1\times10^{13}$ cm. Herein, it is preferable that the number of combinations of the $Al_xGa_{1-x}N$ layers 14-1 to 14-n be equal to or greater than 4.5 combinations such as approximately 5 to 10 combinations and the number of layers be equal to or greater than nine layers such as approximately 10 to 20 layers. Since the Al composition ratio x of each of the $Al_xGa_{1-x}N$ layers 14-1 to 14-n configuring the electron-supplying layer 14 includes Al and Ga, at least 0<x<1 is satisfied.

It is preferable that any one of the $Al_xGa_{1-x}N$ layers 14-1 to 14-n be configured to be adjusted in thickness and Al composition ratio so that the 2DEG is not produced thereinside. The bandgap of the electron-supplying layer 14 is an average bandgap, and to be more specific, bandgap of the electron-supplying layer 14 is of a value of bandgap weighted (integrated) by a thickness ratio of each of the $Al_xGa_{1-x}N$ layers 14-1 to 14-n configuring the layered structure. The electron-supplying layer 14 is configured so that its average bandgap is greater than the bandgap of the electron transition layer 13. Hereby, the 2DEG layer a is produced at an interface between the electron transition layer 13 and the electron-supplying layer 14.

To be more specific, the AlGaN super-lattice layer configuring the electron-supplying layer 14 is layered so that an $Al_{x1}Ga_{1-x1}N$ layer of maximal Al composition ratio x1 and an $Al_{x2}Ga_{1-x2}N$ layer of minimal Al composition ratio x2 are disposed alternately. The $Al_{x1}Ga_{1-x1}N$ layer indicates an AlGaN layer of maximal Al composition ratio x1 and the $Al_{x2}Ga_{1-x2}N$ layer indicates an AlGaN layer of minimal Al composition ratio x2.

Figure 16:
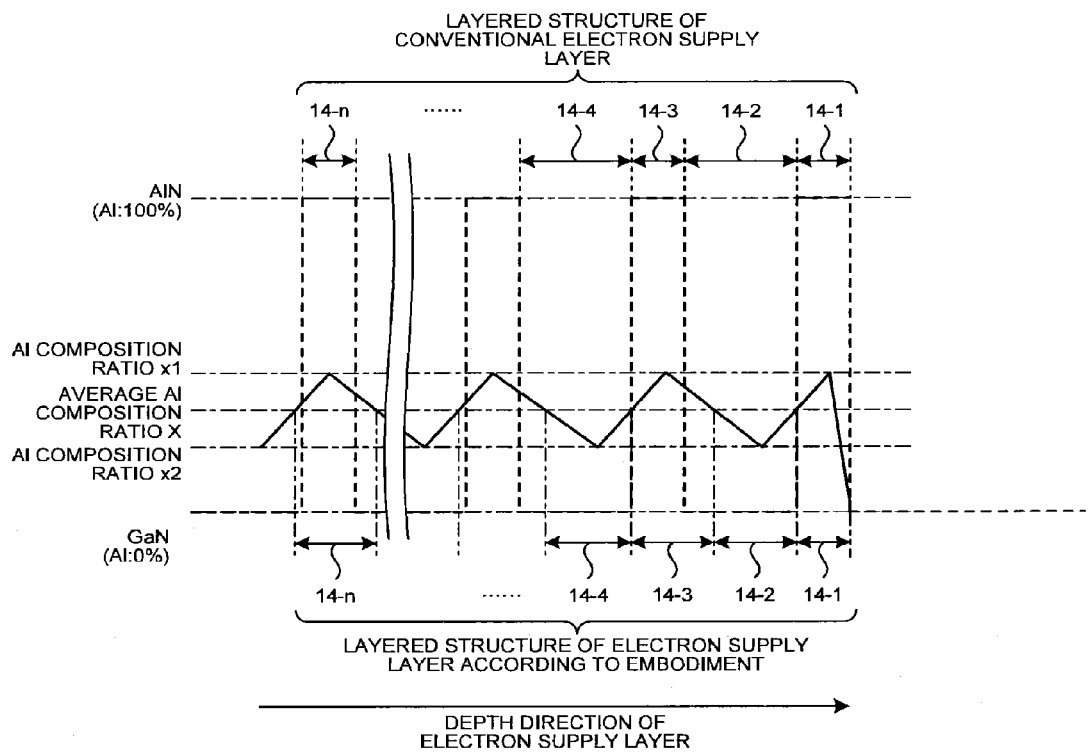
FIG. 16 is a schematic diagrammatic view for explaining a structure of each layer in the electron-supplying layer of a pseudo mixed crystal according to Embodiment 9 and a conventional technology.

The Al composition ratio of the AlGaN super-lattice layer varies such as in an increase and/or in a decrease, for example, in triangle-wave-shape and sine-wave-shape continuously along the depth direction (lamination direction). FIG. 16 is a graph showing a relationship between Al composition ratio x (vertical axis) of each $Al_xGa_{1-x}N$ layer configuring the electron-supplying layer 14 and thickness d (horizontal axis) along the depth direction. A left-hand side of the graph indicates the etching sacrifice layer 91's side or the semiconductor layer 92's side, and a right-hand side indicates the electron transition layer 13's side. In FIG. 16, a solid line indicates the graph of the Al composition ratio of the electron-supplying layer 14 of each pseudo alloy structure according to this Embodiment 9 and numerals therebeneath corresponds to reference symbols in FIG. 15. In FIG. 16, a dotted line indicates the graph of the Al composition ratio in a case of the electron-supplying layer 14 being AlN/GaN super-lattice layer according to a conventional technology and numerals therebeneath corresponds to reference symbols in FIG. 15. The average Al composition ratios X are identical in both the Embodiment 9 and the conventional electron-supplying layer 14.

As shown in FIG. 16, the Al composition ratio of the electron-supplying layer 14 according to this Embodiment 9 repeats increasing and decreasing continuously along the depth direction. To be more specific, the Al composition ratio increases like a mountain-shape along the lamination direction, opposite to the depth direction, in the $Al_{x1}Ga_{1-x1}N$ layer 14-1 as the first nitride semiconductor layer, and then decreases via the maximal of the maximal Al composition ratio x1 higher than the average Al composition ratio X. The Al composition ratio decreases like a valley-shape continuously along the lamination direction of the $Al_{x2}Ga_{1-x2}N$ layer 14-2 as its upper layer and as the second nitride semiconductor layer, and increases via the minimal of the minimal Al composition ratio x2 lower than the average Al composition ratio X. These increase and decrease are repeated, and thus, the Al composition ratio x increases and decreases continuously from the $Al_{x1}Ga_{1-x1}N$ layer 14-1 to the $Al_{x1}Ga_{1-x1}N$ layer 14-n. Then the electron-supplying layer 14 is configured with layering these from the $Al_{x1}Ga_{1-x1}N$ layer 14-1 to the $Al_{x1}Ga_{1-x1}N$ layer 14-n.

The Al composition ratio x of these $Al_xGa_{1-x}N$ layers 14-1 to 14-n increases and decreases alternately between the maximal Al composition ratio x1 and the minimal Al composition ratio x2 across the average Al composition ratio X. Herein it is preferable that the absolute value of an average reduction rate at which the Al composition ratio x becomes from the maximal to the minimal along the depth direction of the electron-supplying layer 14 be smaller than the absolute value of an average growth rate in a case of the Al composition ratio x becoming from the minimal to the maximal. In other words, it is preferable that the absolute value of the average growth rate in a case of the Al composition ratio x becoming from the minimal to the maximal along the lamination direction of the electron-supplying layer 14 be smaller than the absolute value of the average reduction rate in a case of the Al composition ratio x becoming from the maximal to the minimal.

Although, in FIG. 16, the maximal Al composition ratio x1 at each of the $Al_{x1}Ga_{1-x1}N$ layers 14-1, 14-3, . . . , 14-n as the first nitride semiconductor layer is of an identical Al composition ratio, the maximal Al composition ratio x1 may be of an Al composition ratio each being different in a portion of, or from one another in some cases, of the respective $Al_{x1}Ga_{1-x1}N$ layers 14-1, 14-3, . . . , 14-n. Similarly, although the minimal Al composition ratio x2 at each of the $Al_{x2}Ga_{1-x2}N$ layers 14-2, 14-4, . . . , 14-(n–1) as the second nitride semiconductor layer is of an identical Al composition ratio, the minimal Al composition ratio x2 may be of an Al composition ratio each being different in a portion of, or from one another in some cases, of the respective $Al_{x2}Ga_{1-x2}N$ layers 14-2, 14-4, . . . , 14-(n–1). Moreover, in FIG. 16, although the increase-and-decrease shape of the Al composition ratio along the depth direction of the electron-supplying layer 14 is of a triangle-wave-shape in which an increase and a decrease are modest relative to a rectangular shape in which an increase and a decrease are steep (dotted line in FIG. 16), the increase-and-decrease shape may be a sine-wave-shape and a trapezoidal shape in which an increase and a decrease are modest similarly.

Herein, as shown in FIG. 16, the $Al_{x1}Ga_{1-x1}N$ layers 14-3, . . . , 14-n as the first nitride semiconductor layer indicate an area along the direction opposite to the depth direction of the electron-supplying layer 14 (lamination direction) from a position of a median by a thickness from the minimal to the maximal of the Al composition ratio x to a position of a median by a thickness including the maximal and being from the maximal to the subsequent minimal. The $Al_{x2}Ga_{1-x2}N$ layers 14-2, 14-4, . . . , 14-(n–1) as the second nitride semiconductor layer indicate an area along the lamination direction of the electron-supplying layer 14 from a position of a median by the thickness from the maximal to the minimal of the Al composition ratio x to a position of a median by a thickness including the minimal and being from the minimal to a subsequent maximal. However, the $Al_{x1}Ga_{1-x1}N$ layer 14-1 being positioned extremely at the electron transition layer 13's side and being one of the first nitride semiconductor layers indicates an area from a position of a border to the electron transition layer 13 as a lower layer to a position of a subsequent median across the maximal value.

If the maximal Al composition ratio x1 is great, a wave function of electron hardly seeps at a portion becoming the maximal, and thus the 2DEG concentration Ns can be increased in the electron transition layer 13, but in contrast, a contact resistance increases. To address this and in consideration of increasing the 2DEG concentration Ns and reducing the contact resistance, it is desirable that the maximal Al composition ratio x1 be increased within a range of equal to or greater than 0.03 and smaller than 0.3 relative to the average Al composition ratio X of the electron-supplying layer 14, more preferably within a range of equal to or greater than 0.06 and smaller than 0.25, and further more preferably within a range of equal to or greater than 0.1 and smaller than 0.2. That is, it is desirable that a formula (1) below hold true.

$$X+0.03 \le x1 < X+0.3 \tag{1}$$

In a case of the maximal Al composition ratio x1 being different at least a portion of, or at each layer in some case, at each of the $Al_{x1}Ga_{1-x1}N$ layers 14-1, 14-3, . . . , 14-n, it is desirable that the formula (1) represented by the maximal Al composition ratio x1 be hold true relative to the maximal Al composition ratio x11, x13, . . . , x1n at the respective layers. That is, it is desirable that a formula (1-1) below hold true in the $Al_{x11}Ga_{1-x11}N$ layer 14-1, the $Al_{x13}Ga_{1-x13}N$ layer 14-3, . . . , and the $Al_{x1n}Ga_{1-x1n}N$ layer 14-n.

$$X+0.03 \le x11, x13, \ldots, x1n < X+0.3 \tag{1-1}$$

Moreover, if the minimal Al composition ratio x2 is small, in order to an equal to or greater than predetermined composition ratio of the average Al composition ratio X to obtain a desirable 2DEG concentration Ns, the maximal Al composition ratio x1 must be increased. In consideration of this point, it is desirable that the minimal Al composition ratio x2 be decreased relative to the average Al composition ratio X of the electron-supplying layer 14 within a range of equal to or greater than 0.03 and smaller than 0.2, preferably within a range of equal to or greater than 0.06 and smaller than 0.18, and more preferably within a range of equal to or greater than 0.1 and smaller than 0.15. That is, it is desirable that a formula (2) below hold true.

$$X-0.2 < x2 \le X-0.03 \tag{2}$$

In a case of the minimal Al composition ratio x2 being different at least at a portion of, or at each layer in some case, each of the $Al_{x2}Ga_{1-x2}N$ layers 14-2, 14-4, . . . , 14-(n–1), it is desirable that the formula (2) represented by the minimal Al composition ratio x2 hold true relative to the minimal Al composition ratio x22, x24, . . . x2(n–1) at the respective layers. That is, it is desirable that a formula (2-1) below hold true in the $Al_{x22}Ga_{1-x22}N$ layer 14-2, the $Al_{x24}Ga_{1-x24}N$ layer 14-4 . . . , and the $Al_{x2(n-1)}Ga_{1-x2(n-1)}N$ layer 14-(n–1).

$$X-0.2 \le x22, x24, \ldots, x2(n-1) < X-0.03 \tag{2-1}$$

As described above, by configuring the electron-supplying layer 14 by layering the AlGaN layer so that the Al composition ratio x increases and decreases continuously along the lamination direction and the depth direction in a triangle-wave-shape or a sine-wave-shape, it is possible to facilitate to seep the wave function of the 2DEG from the electron transition layer 13's side toward the etching sacrifice layer 91 and the semiconductor layer 92's side to the surface's side of the electron-supplying layer 14. Hereby the contact resistance can be reduced in the nitride semiconductor device having the electron-supplying layer 14 as such, and thus a good ohmic contact can be achieved. The Al composition ratio x1(x11 to x1n), x2(x22 to x2(n−1)) is $0<x2<X<x1\leq1$, and in consideration of feasibility of seep of the wave function of the 2DEG in the electron-supplying layer 14, it is preferable that the maximal Al composition ratio x1(x11 to x1n) be within a relatively low range of equal to or greater than 20% and smaller than 60% ($0.2\leq x1<0.6$), preferably equal to or greater than 20% and equal to or lower than 50% ($0.2\leq x1\leq 0.5$), and more preferably equal to or greater than 20% and equal to or lower than 40% ($0.2\leq x1\leq 0.4$). From a view point of achieving the average Al composition ratio X capable of obtaining a desirable 2DEG concentration Ns, it is preferable that the minimal Al composition ratio x2 (x22 to x2(n−1)) be greater than 0% and smaller than 20% ($0<x2<0.2$), preferably greater than 5% and smaller than 20% ($0.05<x2<0.20$), and more preferably equal to or greater than 10% and smaller than 20% ($0.10\leq x1<0.20$). Herein it is considered to set the average Al composition ratio X in the electron-supplying layer 14 to obtain the desirable 2DEG concentration Ns. For example, if the minimal Al composition ratio x2 is decreased to zero, in a case of adopting a pseudo alloy structure for the electron-supplying layer 14, the maximal Al composition ratio x1 must be increased to achieve approximately 15% of the average Al composition ratio X at which an electron mobility increases. On the other hand, if the maximal Al composition ratio x1 is increased, it is not preferable because the wave function of an electron of the 2DEG layer a hardly seeps, and thus the contact resistance increases. Moreover, when making these AlGaN layers, particularly the AlGaN layers having high and over 50% of Al compositions be subjected to crystal growth by, for example, MOCVD method, it is difficult to achieve good crystal quality. From this view point as such as well, it is preferable that the maximal Al composition ratio x1 and the minimal Al composition ratio x2 be set in the above-described range.

Moreover, the average Al composition ratio X of the electron-supplying layer 14 is determined in consideration of achieving a desirable 2DEG concentration at the 2DEG layer a at an interface with the electron transition layer 13 while supposing $0<X<1$. To be more specific, the average Al composition ratio X of the electron-supplying layer 14 is equal to or greater than 10% and equal to or lower than 40% ($0.1\leq X\leq 0.4$), preferably equal to or greater than 15% and equal to or lower than 35% ($0.15\leq X\leq 0.35$), and more preferably equal to or greater than 20% and equal to or lower than 30% ($0.2\leq X\leq 0.3$). From a view point of sheet resistance in the $Al_xGa_{1-x}N$ super-lattice layer and from a view point of lattice relaxation capable of freely layering relative to distortion, it is preferable that the average Al composition ratio X of the electron-supplying layer 14 be within the above-described ranges.

The thickness di (i=1, 2, 3, . . . , n) of the $Al_{x1}Ga_{1-x1}N$ layer 14-*i* of the maximal Al composition ratio x1 and the $Al_{x2}Ga_{1-x2}N$ layer 14-*i* of the minimal Al composition ratio x2 of the AlGaN layers configuring the electron-supplying layer 14 is equal to or greater than two atomic layers as the minimum thickness obtaining layered configuration, and moreover, from a view point that the wave function of the electron of the 2DEG layer a be seeped in accordance with a desirable average Al composition ratio, the thickness di is, specifically, for example, equal to or greater than 0.5 nm and equal to or smaller than 4.0 nm, preferably equal to or greater than 0.5 nm and equal to or smaller than 3.5 nm, and more preferably equal to or greater than 0.5 nm and equal to or smaller than 3.0 nm. In this Embodiment 9, the thickness di is, for example, approximately 1.5 nm respectively. It is preferable that the thickness di of each $Al_xGa_{1-x}N$ layer 14-*i* be equal to or smaller than a critical thickness for not producing a misfit dislocation. To be more specific, the critical thickness of the $Al_xGa_{1-x}N$ layer is approximately 5 nm in a case of the Al composition ratio x being 0.6 relative to the lattice constant of the GaN layer and is approximately 100 nm in a case of the Al composition ratio x being 0.1. The critical thickness is not limited to these thicknesses because the critical thicknesses differ in accordance with an adjacent layer in the layered structure. For the thickness, the number of layers (n), and the number of combinations (n/2) of each $Al_xGa_{1-x}N$ layers 14-1 to 14-*n*, optimal values are selected appropriately corresponding to concentration set for the 2DEG concentration Ns of the 2DEG layer a and design of the nitride semiconductor device.

For a lower limit of the thickness of the electron-supplying layer 14, and in consideration of configuring the electron-supplying layer 14 by an $Al_{x1}Ga_{1-x1}N/Al_{x2}Ga_{1-x2}N$ super-lattice layer in which one pair of the $Al_{x1}Ga_{1-x1}N$ layer of the maximal Al composition ratio x1 and the $Al_{x2}Ga_{1-x2}N$ layer of the minimal Al composition ratio x2 is layered, it is preferable that the thickness of the electron-supplying layer 14 be equal to or greater than 2 nm, and preferably equal to or greater than 5 nm in consideration of increasing the 2DEG concentration Ns of the 2DEG layer a, and more preferably equal to or greater than 10 nm. For an upper limit of the thickness of the electron-supplying layer 14, equal to or smaller than a critical thickness at which the misfit dislocation is not produced is preferable, and in consideration of a limit of the ohmic contact, the upper limit is equal to or smaller than 100 nm, preferably equal to or smaller than 50 nm, and more preferably equal to or smaller than 30 nm.

The etching sacrifice layer 91 shown in FIG. 15 is made of an $Al_YGa_{1-Y}N$ layer ($0<Y<1$) of an average Al composition ratio Y. Herein the average Al composition ratio Y of the etching sacrifice layer 91 is greater than an average Al composition ratio X of the electron-supplying layer 14 ($X<Y$). This is because, in a case where the semiconductor layer 92 provided on the $Al_YGa_{1-Y}N$ layer is made of a material, such as, for example, a GaN layer or the like, of which Al composition ratio is zero or extremely small, an etching rate relative to the GaN layer is extremely great such as approximately 100 times that of the AlGaN layer, and thus the AlGaN layer acts extremely effective as an etching stop against the GaN layer. As will be explained in detail below, the local Al composition ratio y of the AlGaN configuring the etching sacrifice layer 91 is configured so that the Al composition ratio y becomes equal to or smaller than maximal Al composition ratio x1 and equal to or greater than minimal Al composition ratio x2 in the AlGaN layer configuring the electron-supplying layer 14. Moreover, the local Al composition ratio y is configured to decrease and increase successively to describe a v-shaped profile along the lamination direction from the electron-supplying layer 14's side toward the semiconductor layer 92's side of the etching sacrifice layer 91.

The etching sacrifice layer 91 is configured so that its local Al composition ratio y decreases gently from the vicinity of the surface of the etching sacrifice layer 91 toward inside the semiconductor layer 92. By varying the local Al composition ratio y continuously or incrementally from the etching sacrifice layer 91 made of the AlGaN layer toward the semiconductor layer 92 made of the GaN layer, etching speed varies continuously or incrementally at, and from, a point that the etching reaches the etching sacrifice layer 91. Therefore, etching speed can be controlled at a time of over-etching to the etching sacrifice layer 91 when etching the semiconductor layer 92. Hereby, it is possible to stop the etching at the etching sacrifice layer 91 with good controllability without making the etching reach the electron-supplying layer 14. By providing the etching sacrifice layer 91, it is possible to prevent the $Al_{x1}Ga_{1-x1}N$ layer, of the electron-supplying layer 14, of which Al composition ratio x1 is relatively high, in the electron-supplying layer 14 from being exposed to the upper-most surface. Therefore, it is possible to prevent the electron-supplying layer 14 from increasing on-state voltage and contact resistance and deteriorating electric current collapse by surface oxidization or the like.

Herein it is preferable that the thickness of the etching sacrifice layer 91 be equal to or greater than thickness capable of controlling precisely the etching of the semiconductor layer 92 formed as its upper layer by controlling the etching speed at a time of over-etching, and to be more specific, for example, equal to or greater than 1 nm is preferable. It is preferable that the thickness of the etching sacrifice layer 91 be equal to or smaller than 12 nm in order to reduce the 2DEG concentration Ns of the 2DEG being produced thereinside to a degree at which affection to the nitride semiconductor device is ignorable. Therefore, the thickness of the etching sacrifice layer 91 is equal to or greater than 1 nm and equal to or smaller than 12 nm, and in this Embodiment 9, for example, approximately 4 nm.

The semiconductor layer 92 as the third semiconductor layer is provided on an upper layer of the etching sacrifice layer 91 or the electron-supplying layer 14 in accordance with the structure of the nitride semiconductor device produced from the semiconductor-layered substrate 10. For varying the 2DEG concentration Ns of the 2DEG layer a being produced in the electron transition layer 13 at least at two levels, the semiconductor layer 92 is made of a GROUP-III nitride compound semiconductor of which average bandgap is narrower than that of the electron-supplying layer 14, to be more specific, an $Al_zGa_{1-z}N$ layer of Al composition ratio z ($0 \leq z \leq 1$). The thickness of this semiconductor layer 92 is equal to or greater than 20 nm and equal to or smaller than 200 nm. Preferably, the thickness of the semiconductor layer 92 is equal to or greater than 20 nm and equal to or smaller than 100 nm capable of facilitating control of the 2DEG concentration by thickness-control using growth and etching. More preferably, the thickness of the semiconductor layer 92 is equal to or greater than 25 nm and equal to or smaller than 80 nm being unsusceptible to variation in the 2DEG concentration caused by variation in the thickness. Herein the semiconductor layer 92 in this Embodiment 9 is made of a GaN layer of which thickness is, for example, 30 nm.

The semiconductor stack according to this Embodiment 9 is configured with the above-described electron transition layer 13, the electron-supplying layer 14, the etching sacrifice layer 91, and the semiconductor layer 92. The semiconductor stack may be configured with the electron transition layer 13 and the electron-supplying layer 14 by the configuration of the nitride semiconductor device produced from the semiconductor-layered substrate 10. In a case of using the upper-most layer of the electron-supplying layer 14 as an etching sacrifice layer and without using the etching sacrifice layer 91, the semiconductor stack may be configured with the electron transition layer 13, the electron-supplying layer 14, and the semiconductor layer 92. As described above, the semiconductor-layered substrate 10 according to Embodiment 9 for producing the nitride semiconductor device according to the above-described Embodiment 1 to 8 is configured.

That is, the anode electrode 16 and the source electrode 56 as the first electrode are provided on at least a portion of semiconductor layer of the electron transition layer 13, the electron-supplying layer 14, the etching sacrifice layer 91, and the semiconductor layer 92. The cathode electrode 18 and the drain electrode 54, as the second electrode, being separated from the anode electrode 16 and the source electrode 56 are provided on at least a portion of semiconductor layer of the electron transition layer 13, the electron-supplying layer 14, the etching sacrifice layer 91, and the semiconductor layer 92. The anode wiring 17 and the source wiring 57 as the first wiring are provided on an upper layer of the anode electrode 16 and the source electrode 56 respectively. The cathode wiring 19 and the drain wiring 55 as the second wiring are provided on an upper layer of the cathode electrode 18 and the drain electrode 54 respectively. A low permittivity area is provided on a lower layer of a portion of at least one, other than a portion junctioned electrically with the semiconductor stack, of the first electrode and the second electrode. The low permittivity area is configured with a portion of which permittivity is lower than a permittivity of the nitride semiconductor configuring the semiconductor stack. Hereby the nitride semiconductor devices according to Embodiments 1 to 8 using the semiconductor-layered substrate 10 according to Embodiment 9 are configured.

Figure 17:
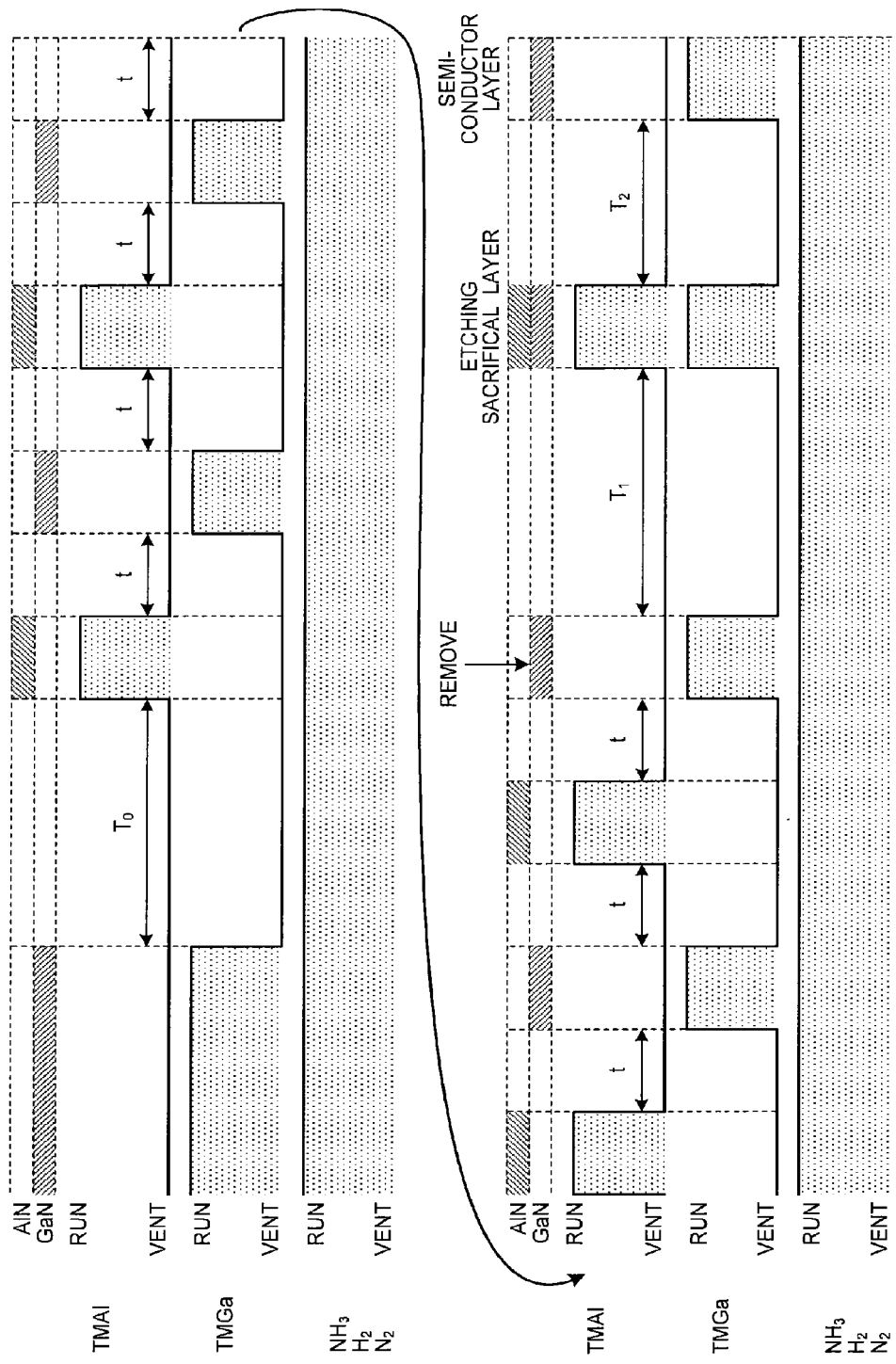
FIG. 17 is a sequence chart for explaining a production method of the semiconductor-layered substrate according to Embodiment 9.

Hereafter, a production method of the semiconductor-layered substrate 10 according to this Embodiment 9 will be explained. FIG. 17 is a sequence chart of gas being supplied when growing each layer on the substrate 11 and the buffer layer 12 of the semiconductor-layered substrate 10 according to this Embodiment 9 by MOCVD method. In FIG. 17, "RUN" and "VENT" indicate supplying state and supply-stopping state (exhausted state) of the gas to a reactor furnace (MOCVD reactor) of an MOCVD apparatus respectively.

As shown in FIGS. 15 and 17, in the production method of the semiconductor-layered substrate 10 according to Embodiment 9, for example, trimethylgallium (TMGa) as GROUP-III gas, ammonia ($NH_3$) as group-V gas, hydrogen ($H_2$) and nitrogen ($N_2$) as carrier gas are supplied respectively into the MOCVD reactor (not shown in the drawings) in which the substrate 11 having the buffer layer 12 is arranged. Hereby the electron transition layer 13 made of u-GaN layer is formed by growing GaN on the buffer layer 12. As an example of growth condition of the electron transition layer 13 made of u-GaN, and in consideration of reduction of impurity density, ambient pressure is a relatively high pressure of 200 Torr (26.7 kPa), molar ratio (V/III molar ratio) of group-V element (N) relative to GROUP-III element (Ga) is approximately 10000, and flow amount of $H_2$ gas as carrier gas is, for example, approximately 85 L/min.

Successively, while maintaining to supply $NH_3$, $H_2$, and $N_2$ to the MOCVD reactor, supply of TMGa is stopped. Herein $NH_3$, $H_2$, and $N_2$ are supplied always and continuously while the substrate 11 is arranged in the MOCVD reactor. The growth condition is changed during a predetermined time $T_0$ by a predetermined operation of the MOCVD apparatus, and successively inside the MOCVD reactor is stabilized. Herein, in this Embodiment 9, after changing the growth condition, for example, for 120 seconds and stabilizing, for example, for 60 seconds, additional discontinuation time, for example, for approximately 6 seconds is arranged. That is, the predetermined time $T_0$ in this Embodiment 9 is, for example, approximately 186 seconds (about three minutes).

After that, in a state where the supply of TMGa to the MOCVD reactor is stopped, for example, trimethylaluminum (TMAl) as GROUP-III gas is supplied to the MOCVD reactor. Hereby the $Al_xGa_{1-x}N$ layer 14-1 is grown on the electron transition layer 13. Herein $H_2$ in addition to $N_2$ and $NH_3$ is supplied to the MOCVD reactor during the above-described predetermined time $T_0$. Therefore, a surface of the u-GaN layer configuring the grown electron transition layer 13 is etched during the predetermined time $T_0$. In this state, nitrogen (N) is desorbed from, and on the other hand Ga remains on, the etched surface of the u-GaN layer. On the other hand, covalent bond energy of AlN is greater than covalent bond energy of GaN. Hereby, when TMAl is supplied to the MOCVD reactor, Ga is replaced with Al to cause crystal growth, dominated by AlN, on the electron transition layer 13, and thus the $Al_xGa_{1-x}N$ layer 14-1 made of AlGaN modified layer of which Al composition ratio x is relatively high is grown.

Then, while maintaining supply of $NH_3$, $H_2$, and $N_2$ to the MOCVD reactor, the supply of TMAl is stopped. Then the crystal growth is interrupted by interrupting the supply of growth gas to the MOCVD reactor for discontinuation time t, for example, 6 seconds. During this interruption, $H_2$ in addition to $N_2$ and $NH_3$ are supplied into the MOCVD reactor. Therefore, the surface of the grown $Al_xGa_{1-x}N$ layer 14-1 is etched during the discontinuation time t. In this state, nitrogen (N) is desorbed from, and on the other hand Al and Ga remain on, the etched surface of the $Al_xGa_{1-x}N$ layer 14-1.

Successively, in a state where the supply of TMAl to the MOCVD reactor is stopped, TMGa is supplied. Herein, since vapor pressure of Al is lower relative to vapor pressure of Ga under identical temperature condition, Ga atom tends to be desorbed easily relative to Al atom. Therefore, mainly Al remains on the surface of the etched surface of the $Al_xGa_{1-x}N$ layer 14-1. This remaining Al is coupled with GaN grown by TMGa and N. In addition, Ga is replaced with Al for reason similar to the above described reason. Hereby, crystal growth dominated by GaN is conducted on the $Al_xGa_{1-x}N$ layer 14-1, and thus the $Al_xGa_{1-x}N$ layer 14-2 made of an AlGaN modified layer of which Al composition ratio x is relatively low is grown.

After that, while maintaining supply of $NH_3$, $H_2$, and $N_2$ to the MOCVD reactor, the supply of TMGa is stopped. To be more specific, crystal growth is interrupted by interrupting the supply of growth gas (TMGa) for the discontinuation time t, for example, approximately 6 seconds. During this interruption of crystal growth, $H_2$ in addition to $N_2$ and $NH_3$ is supplied into the MOCVD reactor. Therefore, a surface of the grown $Al_xGa_{1-x}N$ layer 14-2 is etched during the discontinuation time t. In this state, nitrogen (N) is desorbed from, and on the other hand Al and Ga remains on, the etched surface of the $Al_xGa_{1-x}N$ layer 14-2.

After the lapse of the discontinuation time t, TMAl is supplied in a state of stopping the supply of TMGa to the MOCVD reactor. Hereby, crystal growth dominated by AlN is conducted on the $Al_xGa_{1-x}N$ layer 14-2 of which Al composition ratio x is relatively low. Then, similarly to growth of the above-described $Al_xGa_{1-x}N$ layer 14-1, the $Al_xGa_{1-x}N$ layer 14-3 made of an AlGaN modified layer of which Al composition ratio x is relatively high is grown. After that, the supply of TMAl into the MOCVD reactor is stopped.

The above-described supply and interruption of TMAl and supply and interruption of TMGa are repeated successively and alternately until a desirable $Al_xGa_{1-x}N$ layers 14-1 to 14-n are formed. Then, after growing the $Al_xGa_{1-x}N$ layer 14-n and interrupting the crystal growth for the discontinuation time t, TMGa is supplied in a state of stopping the supply of the TMAl to the MOCVD reactor. Hereby, the $Al_xGa_{1-x}N$ layer (not shown in the drawing) of which Al composition ratio x is relatively low is grown on the $Al_xGa_{1-x}N$ layer 14-n. As described above, by repeating crystal growths alternately across the discontinuation time t, the electron-supplying layer 14 made of AlGaN super-lattice layer of a pseudo alloy structure is formed on the electron transition layer 13.

Herein an example of growth condition of these $Al_xGa_{1-x}N$ layers 14-1 to 14-n will be explained. That is, flow amount of TMAl is for example, 200 μmol/min, and flow amount of TMGa is, for example, 160 μmol/min. Herein V/III mol ratio when supplying TMAl is, for example, 8000, and V/III mol ratio when supplying TMGa is, for example, 10000. Moreover, flow amount of $NH_3$ is, for example, 35 L/min, flow amount of $H_2$ gas is, for example, 50 L/min, and flow amount of $N_2$ gas is, for example, 15 L/min.

An example of atmospheric conditions inside the MOCVD reactor will be explained. That is, growth temperature is equal to or higher than 960° C. and equal to or lower than 1060° C., for example, 1020° C. In order to restrain vapor phase reaction between TMAl and $NH_3$, ambient pressure is set relatively low such as equal to or greater than 30 Torr (4.0 kPa) and equal to or lower than 200 Torr (26.7 kPa), for example, 50 Torr (6.67 kPa). Under this condition and in a case of growth by supplying TMAl, the growth speed is approximately 7 nm/min, and the growth speed in a case of growth by supplying TMGa is approximately 3 nm/min. Time for supplying TMAl and TMGa is calculated from these growth speeds and the respective desirable thickness at each of the $Al_xGa_{1-x}N$ layers 14-1 to 14-n to be applied when growing crystal. When varying the Al composition ratio, the flow amount of TMAl or TMGa is varied while fixing flow amount of $NH_3$. Hereby the respective Al composition ratios of the $Al_xGa_{1-x}N$ layers 14-1 to 14-n can be controlled at the desirable rate.

Then, while maintaining to supply $NH_3$, $H_2$, and $N_2$ to the MOCVD reactor, supply of TMGa is stopped. Then, during a predetermined time $T_1$, stopping supply of TMGa, changing of growth condition of the etching of sacrifice layer 91 in the MOCVD apparatus and stabilizing of the MOCVD apparatus are conducted successively. Herein, in this Embodiment 9, the interruption is conducted for, for example, 6 seconds, the changing of the growth condition is conducted for, for example, 120 seconds, and the stabilizing is conducted for, for example, 60 seconds. That is, the predetermined time $T_1$ in this Embodiment 9 is, for example, approximately 186 seconds. During this predetermined time $T_1$ as well, $NH_3$, $H_2$, and $N_2$ are supplied to the MOCVD reactor. Therefore, the $Al_xGa_{1-x}N$ layer on the upper-most layer formed on the $Al_xGa_{1-x}N$ layer 14-n during this predetermined time $T_1$ is removed by etching.

Then, after a lapse of the predetermined time $T_1$, TMGa and TMAl are supplied into the MOCVD reactor. Hereby the etching sacrifice layer 91 is formed on the electron-supplying layer 14. Herein an example of growth condition of the etching sacrifice layer 91 will be explained. That is, growth temperature is 960 to 1060° C., for example, 1020° C., and pressure is 30 to 200 Torr, for example, 60 Torr. In addition, V/III mol ratio for TMAl is approximately 8000 and V/III mol ratio for TMGa is approximately 10000. As an example of flow amount of each gas, flow amount of TMGa is, for example, 160 μmol/min and flow amount of TMAl is, for example, 200 μmol/min. Flow amount of $NH_3$ is, for example, 35 L/min, flow amount of $H_2$ as carrier gas is, for example, 50 L/min, and flow amount of $N_2$ is, for example, 15 L/min. After forming the desirable thickness of etching sacrifice layer 91, supplying of TMGa and TMAl into the MOCVD reactor is stopped.

Then, while maintaining to supply $NH_3$, $H_2$, and $N_2$ to the MOCVD reactor, supply of TMGa and TMAl is stopped. Then, during a predetermined time $T_2$, changing of growth condition of the semiconductor layer 92 in the MOCVD apparatus and stabilizing of the MOCVD apparatus are conducted successively. Herein, in this Embodiment 9, the changing of the growth condition is conducted for, for example, 120 seconds, and the stabilizing is conducted for, for example, 60 seconds. That is, the predetermined time $T_2$ in this Embodiment 9 is, for example, approximately 180 seconds. In this state, the surface of the AlGaN layer in the etching sacrifice layer 91 is etched to desorb Ga, and thus a state in which Al remains on the surface can be produced.

Then, after a lapse of the predetermined time $T_2$, the semiconductor layer 92 is formed on the etching sacrifice layer 91 by supplying TMGa into the MOCVD reactor. Hereby, it is possible to decrease the local Al composition ratio y gently at its etching sacrifice layer 91 from the vicinity of the surface of the etching sacrifice layer 91 toward inside the semiconductor layer 92. Herein, an example of growth condition of the semiconductor layer 92 is almost identical to the growth condition of the above-described electron transition layer 13 except that the V/III mol ratio is slightly higher, i.e., approximately 20000.

Figure 18:
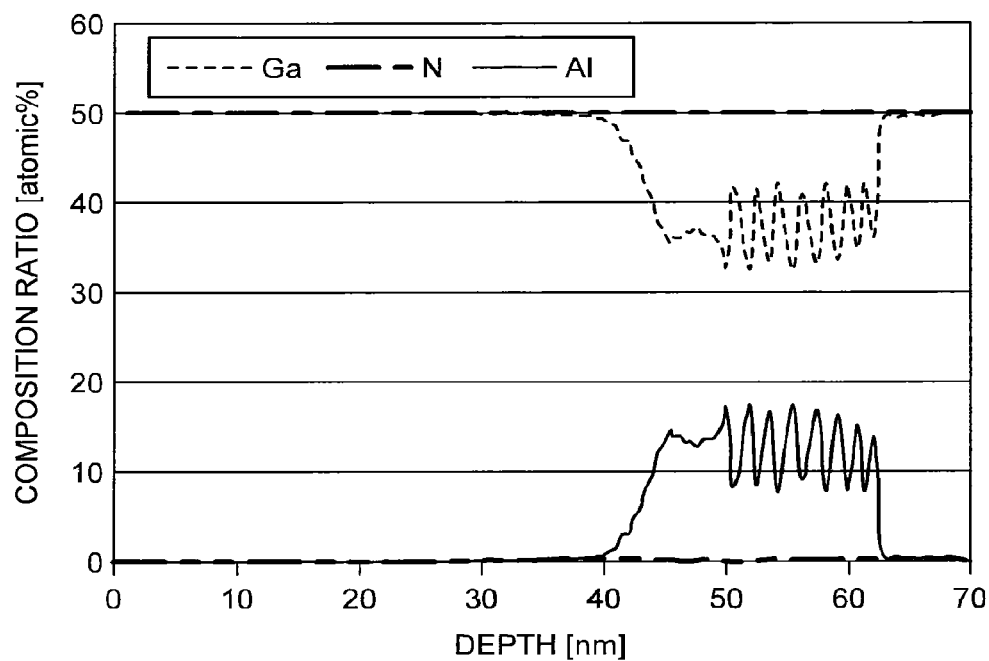
FIG. 18 is a graph showing measured values of composition ratios of Al, Ga, and N along a depth direction of the semiconductor-layered substrate according to Embodiment 9.
Figure 19:
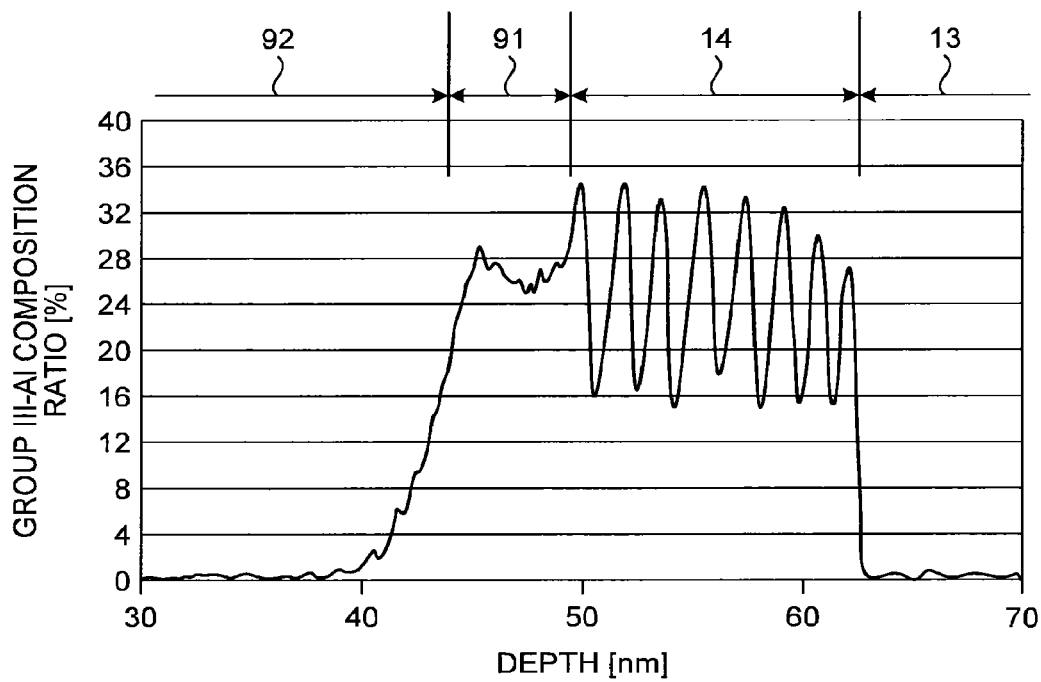
FIG. 19 is a graph showing measured values of Al composition ratios in group III along the depth direction of the semiconductor-layered substrate according to Embodiment 9.

As described above, the semiconductor-layered substrate 10 shown in FIG. 15 is formed. FIGS. 18 and 19 show results of analyzing a layered structure of the above-described and produced semiconductor-layered substrate 10 by using a three-dimensional atom probe (3DAP). FIG. 18 is a graph analyzing composition ratio of Al, Ga, and N along the depth direction of the semiconductor-layered substrate 10 shown in FIG. 15 where the total composition ratio of Al, Ga, and N is 100% and a content rate of N is 50%. FIG. 19 is a result of analyzing Al composition ratio x (%) (in FIG. 19, GROUP-III Al composition ratio (%)) along the depth direction of the semiconductor-layered substrate 10 shown in FIG. 15 in a case where the GROUP-III element (Al, Ga) and the group-V element (N) are of an identical ratio. Numerals in an upper portion of the graph correspond to reference numerals shown in FIG. 15.

From FIGS. 18 and 19, it is found that each AlGaN layer in the electron-supplying layer 14 is layered by the AlGaN layer of maximal Al composition ratio x1 and the AlGaN layer of minimal Al composition ratio x2 alternately. Also, it is found that, the average Al composition ratio X is approximately 24% (X=0.24), and by contrast, maximal Al composition ratio x1 is approximately 27% to 35% ($0.27 \leq x \leq 10.35$) and minimal Al composition ratio x2 is approximately 15% to 18% ($0.15 \leq x2 \leq 0.18$). When the inventors conducted an SBD production step by using this semiconductor-layered substrate 10 and measured characteristics of ohmic contact at a portion of an ohmic electrode by TLM method, it was confirmed that contact resistance value became approximately $5 \times 10^{-6}$ $\Omega \cdot cm^2$ and that the contact resistance can obtain a good ohmic contact of which contact resistance is extremely low. When the inventors produced various semiconductor-layered substrates 10 based on the above-described production method of the semiconductor-layered substrate 10 and analyzed by 3DAP method, it was confirmed that, by making the maximum maximal Al composition ratio x1 be equal to or greater than 20% and smaller than 60% ($0.2 \leq x1 < 0.6$), the semiconductor-layered substrate 10 having the electron-supplying layer 14 of an Al composition variation super-lattice structure where the minimum minimal Al composition ratio x2 is greater than 0% and smaller than 20% ($0 < x2 < 0.2$).

From FIG. 19, it is found that the local Al composition ratio y of the $Al_yGa_{1-y}N$ layer configuring the etching sacrifice layer 91 is equal to or smaller than maximal Al composition ratio x1 and equal to or greater than minimal Al composition ratio x2 in the AlGaN layer configuring the electron-supplying layer 14. Moreover, it is found that the local Al composition ratio y decreases and increases successively so that a v-shaped profile is described along the lamination direction of the etching sacrifice layer 91 from the electron-supplying layer 14's side toward the semiconductor layer 92's side, and decreases gently from a position at which it becomes maximum in the vicinity of the surface of the etching sacrifice layer 91 toward the semiconductor layer 92's side. It is considered that, the portion at which the Al composition ratio y in the vicinity of the surface of this etching sacrifice layer 91 is locally the maximum peak is produced by providing the predetermined time $T_2$ of discontinuation period after growing the etching sacrifice layer 91 in the above-described production method. As described above, since the Al composition ratio y varies continuously or incrementally from the etching sacrifice layer 91 toward the semiconductor layer 92, when etching the semiconductor layer 92, from a moment that the etching reaches the upper surface of the etching sacrifice layer 91, the etching speed varies continuous or incrementally in accordance with the Al composition ratio y. Hereby it is possible to control the etching speed by etching the surface of the etching sacrifice layer 91, and thus the etching can be stopped by the etching sacrifice layer 91 with good controllability.

Then, the SBD 1 according to Embodiment 1 is produced by using the above-described semiconductor-layered substrate 10 produced as such. That is, after growing the semiconductor layer 92, similarly to Embodiment 1, the 2DEG-non-produced area 13a (see FIG. 2) for restraining the 2DEG from being produced is formed by making the portion in which the cathode C is formed be subjected to ion injection with, for example, N, H, or Ar or the like. Then, the two-dimensional-electron-gas-controlling layer 15 is formed by etching the semiconductor layer 92 selectively by using the etching sacrifice layer 91 as an etching sacrifice. Herein the etching sacrifice layer 91 remained in the etching of the semiconductor layer 92 serves as a portion of the electron-supplying layer 14. Then, the recessed portion 15a is formed in an area in which the anode A is formed. Then, after forming a portion of the insulating film 20, the dielectric layer 21, and the contact portion 21a similarly to Embodiment 1, the cathode electrode 18, a portion, having a step-shaped portion, of the insulating film 20, and the anode electrode 16 are formed. Then, after forming the anode wiring 17 on the anode electrode 16 and the cathode wiring 19 on the cathode electrode 18 respectively, the remaining portion of the insulating film 20 is formed. By the above-described steps, the SBD 1 similar to that of the Embodiment 1 is produced. The nitride semiconductor devices according to Embodiments 2 to 8 can also be produced similarly from the semiconductor-layered substrate 10 according to Embodiment 9.

According to the above-described Embodiment 9, on-state resistance can be reduced in the nitride semiconductor device since access resistance can be reduced by increasing electron mobility and contact resistance can be reduced by facilitating the wave function of electron in the 2DEG layer to seep to the ohmic electrode's side by layering a plurality of, at least two different kinds of, AlGaN layers being $Al_{x2}Ga_{1-x2}N$ layer of which maximal Al composition ratio x1 is greater than the average Al composition ratio and the $Al_{x2}Ga_{1-x2}N$ layer of which minimal Al composition ratio x2 is smaller than the average Al composition ratio in the electron-supplying layer 14 in the nitride semiconductor device. Therefore, production cost can be reduced since element area of the nitride semiconductor device can be reduced by approximately 20% in a case of, while maintaining high carrier density (2DEG concentration Ns) in the two-dimensional electron gas in the electron transition layer 13, reducing on-state resistance by increasing electron mobility and attempting to achieve a nitride semiconductor device for power-switching use with identical rated current, down-sizing and minimalnization of the nitride semiconductor device can be realized, and in a case of producing by using semiconductor substrates in identical diameter, the number of chips obtained as products per semiconductor substrate can be increased. Then, it is possible to increase mobility of electron to reduce the on-state resistance while maintaining high carrier density in the two-dimensional electron gas in the electron transition layer 13.

Hereafter, a nitride semiconductor device according to Embodiment 10 of the present invention will be explained. Prior to explaining this Embodiment 10, keen examination conducted by the inventors to solve the above-described problems will be explained.

At first, a field plate structure is known (see N. Zhang, U. K. Mishra, "High Breakdown GaN HEMT with Overlapping Gate Structure", IEEE Electron Device Letters, vol. 21, no. 9, 2000, hereinafter to be referred to as Non-Patent Literature 2) formed, in order to increase voltage resistance of a semiconductor device, by providing a step-shape in which a schottky electrode is stranded on a surface-protecting film made of an insulator formed on a surface of a semiconductor layer in an element having an AlGaN/GaN heterojunction structure.

A nitride semiconductor device described in Japanese Patent No. 4888115 (hereinafter to be referred to as Patent Literature 6) is a field effect transistor and has a configuration having a multi-step field plate structure. A semiconductor device for electric power use described in Japanese Patent No. 4417677 (hereinafter to be referred to as Patent Literature 7) has a configuration relaxing electric field concentration by providing a field plate structure in a gate electrode portion and by providing a field plate structure in a source electrode portion.

However, the field effect transistor described in Patent Literature 6 merely disperses the electric field concentration portion by forming the field plate structure in a multi-step manner. Therefore, in this configuration, problems remain that, since there is a limit from a view point of restraining electric field in the whole gate electrode portion, electric current collapse cannot be lowered sufficiently and sufficient voltage resistance cannot be achieved. In the semiconductor device for electric power use described in Patent Literature 7 merely has a configuration dispersing the electric field intensity, a problem remains that, since the concentration of two-dimensional electron gas (2DEG) is uniform, the electric field intensity at an end portion of the gate electrode remains intense. These problems remain similarly in schottky barrier diode (SBD) of which anode electrode has a field plate structure. Then, Embodiment 10 below provides a nitride semiconductor device capable of high voltage resistance, reduction in electric current collapse, and reduction in leakage current more effectively.

The inventors conducted various experiments and studies. The inventors had an insight that, in the SBD having a conventional field plate structure as described in Non-Patent Literature 2, a cathode electrode-side end portion of a two-dimensional-electron-gas-controlling layer becomes an electric field concentration portion in which an electric field intensity is extremely high. Since, decrease in voltage resistance and increase in leakage current or the like occur if a large electric field is concentrated to the cathode electrode-side end portion of the two-dimensional-electron-gas-controlling layer, thus the two-dimensional-electron-gas-controlling layer may be damaged easily, and characteristics of the nitride semiconductor device are affected. Moreover, a problem occurs that on-state current decreases due to increase in on-state resistance caused by electric current collapse.

To address this, the inventors conducted keen examination again in consideration of the above-described points. As a result, the inventors reached an idea that it is preferable that the cathode electrode-side end portion of the two-dimensional-electron-gas-controlling layer be positioned in a lower area of the field plate portion. That is, the inventors reached an idea that, it is preferable that, a changing point P at which the 2DEG concentration increases from the anode electrode's side toward the cathode electrode's side be positioned in the lower area of the field plate portion.

According to an insight of the inventors, a bending portion and an end portion, at the cathode electrode's side, of the field plate portion may also tend to become the electric field concentration portion. Then, the inventors reached an idea that, in order to obtain an effect of dispersing electric field dispersing the electric field concentration, the electric field concentration portion of the two-dimensional-electron-gas-controlling area configured with the two-dimensional-electron-gas-controlling layer is positioned between electric field concentration portions being adjacent to each other in the field plate portion. That is, the inventors reached an idea that the changing point P at which the 2DEG concentration increases from the anode electrode's side toward the cathode electrode's side is positioned between the adjacent electric field concentration portions in the field plate portion. In order to achieve this configuration, it is preferable that the changing point P of the 2DEG concentration at the cathode electrode's side be separated, in terms of linear distance along the primary surface of the substrate, by equal to or greater than 1 μm, and preferably equal to or greater than 2 μm from an end portion at the cathode electrode's side of the field plate portion.

As described above, since the electric field concentration portion can be dispersed in the two-dimensional-electron-gas-controlling area, the electric current collapse can be restrained while a leakage current is reduced in the nitride semiconductor device, and the on-state resistance can be reduced. Embodiment 10 described below is thought of based the above-described keen examination.

Figure 20:
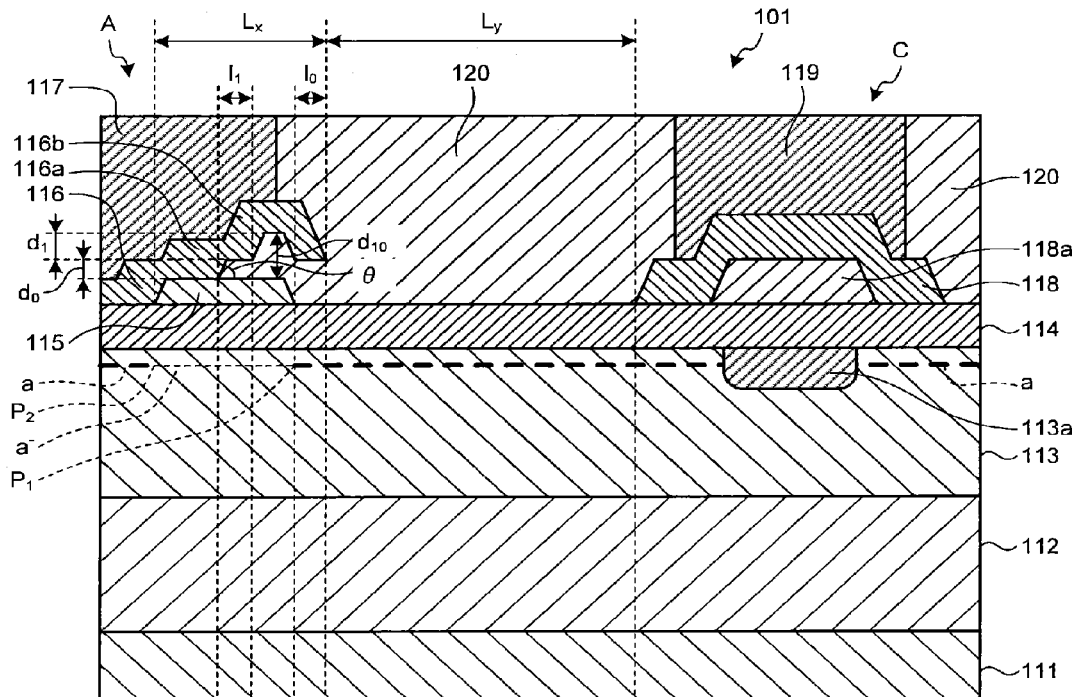
FIG. 20 is a graph showing a schematic cross-sectional view and electric field intensity of a semiconductor device as an SBD according to Embodiment 10 of the present invention.
Figure 20:
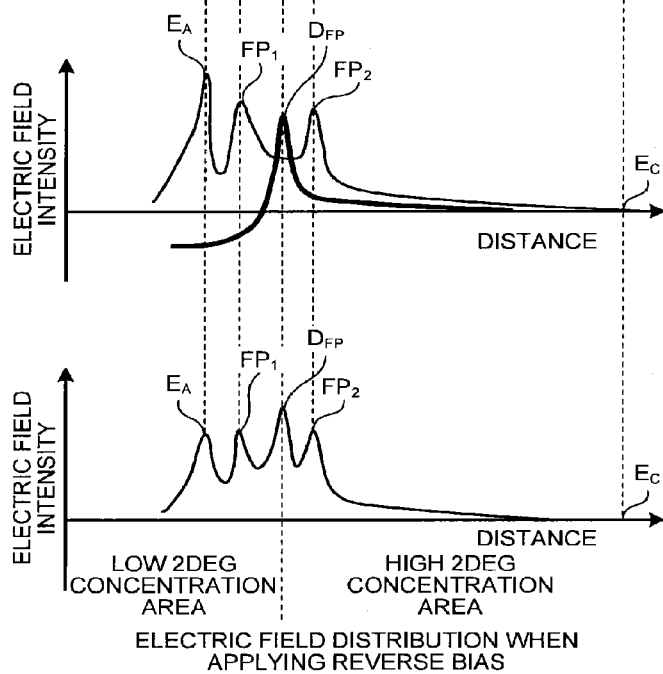

A nitride semiconductor device according to Embodiment 10 of the present invention will be explained. FIG. 20 is a schematic cross-sectional view of a schottky barrier diode (SBD) 101 as a semiconductor device according to Embodiment 10.

As shown in FIG. 20, in the SBD 101 according to the Embodiment 10, an electron transition layer 113, in a portion of which a 2DEG-non-produced area 113*a* is formed via the buffer layer 112, is provided on a primary surface of a substrate 111. An electron-supplying layer 114 is provided on the electron transition layer 113. The electron transition layer 113 and the electron-supplying layer 114 configure a portion of the semiconductor stack, and the 2DEG layer a is produced at an interface between the electron transition layer 113 and the electron-supplying layer 114 inside the semiconductor stack.

A two-dimensional-electron-gas-controlling layer 115 is provided selectively on a surface of the electron-supplying layer 114. An anode electrode 116 is provided to be stranded on the two-dimensional-electron-gas-controlling layer 115, and an anode wiring 117 is provided on the anode electrode 116. An anode A of the SBD 101 is configured with the anode electrode 116 and the anode wiring 117.

A cathode electrode 118 is provided on the electron-supplying layer 114, and a cathode wiring 119 is provide on the cathode electrode 118. A cathode C of the SBD 101 is configured with the cathode electrode 118 and the cathode wiring 119. A dielectric layer 118a as a low permittivity area is provided in an area which covers the 2DEG-non-produced area 113a, above the electron-supplying layer 114, between the electron-supplying layer 114 and the cathode electrode 118, and inside the cathode electrode 118 along the primary surface of the substrate 111.

The substrate 111 and the buffer layer 112 have structures that are similar to those of the substrate 11 and the buffer layer 12 in Embodiment 1 respectively. A base is configured with the substrate 111 and the buffer layer 112.

The electron transition layer 113, the electron-supplying layer 114, and the two-dimensional-electron-gas-controlling layer 115 have configurations that are similar to those of the electron transition layer 13, the electron-supplying layer 14, and the two-dimensional-electron-gas-controlling layer 15 according to Embodiment 1 respectively. In this Embodiment 10, the semiconductor stack is configured with the electron transition layer 113, the electron-supplying layer 114, and the two-dimensional-electron-gas-controlling layer 115. The semiconductor stack may be configured with further providing other semiconductor layer made of $In_xAl_yGa_{1-x-y}N$ ($0 \leq x \leq 1$, $0 \leq y \leq 1$, $0 \leq x+y \leq 1$) to an appropriate and necessary portion.

Moreover, 2DEG concentration of 2DEG inside the semiconductor stack is varied by the two-dimensional-electron-gas-controlling layer 115. Hereby, the 2DEG layer a$^-$ and the 2DEG layer a are produced at two levels in the semiconductor stack. In the 2DEG layer a$^-$, 2DEG concentration is low in a lower area of the two-dimensional-electron-gas-controlling layer 115. In the 2DEG layer a, 2DEG concentration is high from this 2DEG layer a$^-$ toward the cathode electrode 118 and across the changing point $P_1$ for 2DEG concentration. The area decreasing 2DEG concentration, herein the 2DEG layer a$^-$ in the semiconductor stack becomes the two-dimensional-electron-gas-controlling area. That is, in this Embodiment 10, the two-dimensional-electron-gas-controlling area in the electron transition layer 113 is defined by the two-dimensional-electron-gas-controlling layer 115. From reasons that are similar to those of Embodiment 1, it is preferable that 2DEG concentration inside the two-dimensional-electron-gas-controlling area be smaller than $7 \times 10^{12}$ cm$^{-2}$, and 2DEG concentration other than the two-dimensional-electron-gas-controlling area be equal to or greater than $7 \times 10^{12}$ cm$^{-2}$. As indicated by a bold solid line in a graph in the middle of FIG. 20, in a case of providing the two-dimensional-electron-gas-controlling layer 115 alone, an end portion, at the cathode electrode 118's side, of the two-dimensional-electron-gas-controlling layer 115, i.e., the vicinity of a position of the changing point $P_1$ along the surface of the electron-supplying layer 114 (two-dimensional-electron-gas-controlling layer end $D_{FP}$) becomes an electric field concentration portion, and in this portion, electric field intensity becomes maximal.

The anode electrode 116 as the first electrode has a layered structure of, for example, Ni/Au. Hereby, the anode electrode 116 makes a schottky contact with the 2DEG layer a produced in the electron transition layer 113 via the electron-supplying layer 114. Similarly to Embodiment 1, an area, in which the anode electrode 116 is formed, in the electron-supplying layer 114 may be removed by recess-etching, and the anode electrode 116 may make a schottky contact with the 2DEG layer a existing at a lower layer of the two-dimensional-electron-gas-controlling layer 115 laterally.

The anode electrode 116 is stranded on the two-dimensional-electron-gas-controlling layer 115 to form at least one step and extends to arch out toward the cathode electrode 118's side. In this Embodiment 10, for example, the anode electrode 116 is provided to make contact with a side surface of, and at a portion of an upper surface of, the two-dimensional-electron-gas-controlling layer 115. Other semiconductor layer or dielectric film may be disposed between the anode electrode 116 and the two-dimensional-electron-gas-controlling layer 115 to make the anode electrode 116 and the two-dimensional-electron-gas-controlling layer 115 not contact with each other.

The cathode electrode 118 as the second electrode has a layered structure made of, for example, Ti/Al. The cathode electrode 118 is provided on the electron-supplying layer 114 to cover the 2DEG-non-produced area 113a and the dielectric layer 118a along a plane which is in parallel with the primary surface of the substrate 111. Hereby, the cathode electrode 118 makes ohmic contact with the 2DEG layer a produced in the electron transition layer 113 at a portion (contact portion) at which the cathode electrode 118 makes contact with the electron-supplying layer 114 while sandwiching the dielectric layer 118a between the cathode electrode 118 and the electron-supplying layer 114.

An insulating film 120 is configured with, for example, SiO$_2$. The insulating film 120 protects surfaces of the two-dimensional-electron-gas-controlling layer 115, the anode electrode 116, the cathode electrode 118, and the electron-supplying layer 114 mainly. The insulating film 120 protects the surfaces of the two-dimensional-electron-gas-controlling layer 115, the anode electrode 116, surfaces of the anode wiring 117 and the cathode electrode 118, and the surfaces of the cathode wiring 119 and the electron-supplying layer 114.

Herein, in order to reduce electric field intensity at an end portion, at the cathode electrode 118's side, of the above-described two-dimensional-electron-gas-controlling layer 115, it is effective to increase the thickness of the insulating film 120 in an upper area of this end portion of the two-dimensional-electron-gas-controlling layer 115 and in a lower area of the anode electrode 116. However, by merely increasing the thickness of the insulating film 120, electric field is intensified at a position (anode end $E_A$) of the end portion, making a contact with the two-dimensional-electron-gas-controlling layer 115, of the anode electrode 116. In this case, leakage current increases and electric current collapse is deteriorated. Therefore, from a view point of dispersing electric field, it is not preferable to merely increase the thickness of the insulating film 120 between the end portion, at the cathode electrode 118's side, of the two-dimensional-electron-gas-controlling layer 115 and an end portion of the anode electrode 116.

To address this, in this Embodiment 10, field plate portions 116a, 116b are provided to the anode electrode 116 in a multi-step manner, for example, in two steps. The thickness of the insulating film 120 in lower areas of the field plate portions 116a, 116b of the anode electrode 116 is increased so as to increase continuously or incrementally from the anode electrode 116's side toward the cathode electrode 118's side. Hereby an effect of dispersing electric field can be obtained by the field plate portions 116a, 116b. Based on the above description, it is preferable that the thickness $d_{10}$ of the insulating film 120 in the upper area of the two-dimensional-electron-gas-controlling layer 115 and in the lower area of the field plate portion 116b be equal to or greater than 500 nm. By forming the field plate portions 116a, 116b and the insulating film 120 in their lower area as described above, it is possible to relax electric field applied to the end portion, at the cathode electrode 118's side, of the two-dimensional-electron-gas-controlling layer 115 while maintaining the effect of dispersing electric field.

Although the insulating film 120 is configured with $SiO_2$ in this Embodiment 10, other material, to be more specific, SiN and $Al_2O_3$ or the like may be used. The insulating film 120 may be configured with combining plural kinds of materials appropriately and layering successively. In this case as well, it is preferable that the thickness $d_{10}$ of the insulating film 120 on the two-dimensional-electron-gas-controlling layer 115 in the lower area of the field plate portion 116b be equal to or greater than 500 nm when being converted to the thickness of $SiO_2$. Herein, in a case of converting the thickness dr of a dielectric being other than $SiO_2$ and of relative permittivity ∈rx to the thickness d being converted to that of $SiO_2$ can be calculated in accordance with formula (3) below where ∈r $SiO_2$=3.9 to 4.1.

$$d=(\in rSiO_2/\in rx)dr \quad (3)$$

By configuring the anode electrode 116 in a multi-step manner, the position of the surface of the semiconductor stack corresponding to a bending-end portion, at the insulating film 120's side, of the anode electrode 116 (hereafter electrode edge portion), that is, the end portion, at which the thickness varies, of the step-shaped portion of the insulating film 120 (hereafter thickness-changing portion) becomes the electric field concentration portion. To be more specific, as indicated by a solid line in the graph in the middle of FIG. 20, in the direction of a plane which is in parallel with the primary surface of the substrate 111, the above-described anode end $E_A$, the bending portion of the field plate portion 116a (first field plate end $FP_1$), and the end portion, at the cathode electrode 118's side, of the field plate portion 116b (second field plate end $FP_2$) become the electric field concentration portion at which electric field intensity becomes maximal. As described above, the two-dimensional-electron-gas-controlling layer end $D_{FP}$ as well becomes the electric field concentration portion. Herein $E_C$ indicates electric field intensity at the position of the cathode electrode 118. Since the insulating film 120 being configured with dielectric is high voltage resistant against electric field concentration, but on the other hand, since the two-dimensional-electron-gas-controlling layer 115 is configured with a nitride semiconductor, the two-dimensional-electron-gas-controlling layer 115 is low in dielectric breakdown electrical field intensity relative to the insulating film 120 and low in voltage resistance against electric field. To address this, the electric field concentration must be dispersed in this portion of the two-dimensional-electron-gas-controlling layer 115.

If an interval between these electric field concentration portions along the primary surface of the substrate 111, electric fields in the respective electric field concentration portions interfere with each other, and the effect of dispersing electric field by the field plate portions 116a, 116b is weakened. Therefore, it is preferable that, between the electric field concentration portions of the end portion where the electric field concentration matters the most, at the cathode electrode 118's side, of the two-dimensional-electron-gas-controlling layer 115, that is, the changing point $P_1$ as the first changing point at the cathode electrode 118's side in the two-dimensional-electron-gas-controlling area and of the end portion, at the cathode electrode 118's side, of the field plate portion 116b in the anode electrode 116, respective electric fields be not affect mutually, since the maximal point of electric field does not exist which derives from superimposing of skirts of electric field distributions between them. To be more specific, the electric field intensity in an area between the changing point $P_1$ and the end portion, at the cathode electrode 118's side, of the field plate portion 116b is configured to be smaller than the electric field concentration portion of the electric field concentration portion of at least one of the changing point $P_1$ and the end portion, at the cathode electrode 118's side, of the field plate portion 116b.

In order to achieve a configuration as such, it is more preferable that, for example, in the electric field intensity distribution along the primary surface of the substrate 111 between the changing point $P_1$ and the end portion, at the cathode electrode 118's side, of the field plate portion 116b, the sum of respective full widths at half maximum at the electric field intensity distributions in the vicinity of the changing point $P_1$ and in the vicinity of the end portion, at the cathode electrode 118's side, of the field plate portion 116b be smaller than a distance between the changing point $P_1$ and the end portion, at the cathode electrode 118's side, of the field plate portion 116b.

Moreover, since the two-dimensional-electron-gas-controlling layer 115 is made of $In_uAl_xGa_{1-x-u}N$, where In composition ratio u and Al composition ratio x are within ranges of 0≤x≤1, 0≤u≤1, and 0≤x+u≤1, its relative permittivity is 8.5 to 13.5 and its bandgap energy is 1.9 to 6.2 eV. To address this, in order to obtain the above-described state in the high voltage resistant SBD 101, to be more specific, for example, it is preferable that an interval $I_0$ along the primary surface of the substrate 111 between the changing point $P_1$, at the cathode electrode 118's side, in the two-dimensional-electron-gas-controlling area and the end portion, at the cathode electrode 118's side, of the field plate portion 116b in the anode electrode 116 be equal to or greater than 1 μm, and preferably equal to or greater than 2 μm. For similar reasons, it is preferable that an interval $I_1$ along the primary surface of the substrate 111 between the electric field concentration portions such as the electrode edge portion and the thickness-changing portion or the like of the insulating film 120 in the anode electrode 116 be equal to or greater than 0.5 μm, and more preferably equal to or greater than 1 μm from a view point of restraining affection of electric current collapse caused by interference between the respective electric field concentration portions. Although it is preferable that the above-described intervals $l_0$, $l_1$ be applied to a semiconductor device having equal to or greater than 600 V of voltage resistance, the above-described intervals are not necessarily limited to a semiconductor device as such. In the two-dimensional-electron-gas-controlling layer 115 made of $In_uAl_xGa_{1-x-u}N$, where In composition ratio u and Al composition ratio x are within ranges of 0≤x≤1, $0 \leq u \leq 1$, and $0 \leq x+u \leq 1$, its relative permittivity is 8.5 to 10.7 and its bandgap energy is 2.8 to 6.2 eV. In this state, it is preferable that the interval $I_0$ along the primary surface of the substrate 111 between the changing point $P_1$, at the cathode electrode 118's side, in the two-dimensional-electron-gas-controlling area and the end portion, at the cathode electrode 118's side, of the field plate portion 116b in the anode electrode 116 be equal to or greater than 1 μm, and preferably equal to or greater than 2 μm since it is possible to disperse electric field concentration effectively.

Moreover, it is configured that the changing point $P_1$, at the cathode electrode 118's side, in the two-dimensional-electron-gas-controlling area is positioned along a plane which is in parallel with the primary surface of the substrate 111, between the end portion, at the cathode electrode 118's side, of the field plate portion 116b as the upper-most stage of the field plate structure in the anode electrode 116 and the bending-end portion of the field plate portion 116a which is lower by one stage from the upper-most stage, preferably at a middle portion in width direction. To be more specific, it is configured that the end portion, at the cathode electrode 118's side, of the two-dimensional-electron-gas-controlling layer 115 is positioned along the primary surface of the substrate 111 between the end portion, at the cathode electrode 118's side, of the field plate portion 116b and the electrode edge portion of the field plate portion 116a, more preferably at the middle portion in the width direction. In other words, it is preferable that the end portion, at the cathode electrode 118's side, of the two-dimensional-electron-gas-controlling layer 115 be positioned another electric field concentration portion, for example, other than the thickness-changing portion of the insulating film 120 and the electrode edge portion of the anode electrode 116, and preferably at the middle portion in the width direction of adjacent electric field concentration portions. Hereby, it is possible to obtain the effect of dispersing electric field in the two-dimensional-electron-gas-controlling area more effectively.

Herein a graph in a lower portion of FIG. 20 is a graph showing electric field distribution in which graphs indicated by the solid line and the bold solid line in the middle of FIG. 20 are combined. As shown in the graph in this lower portion, by making the end portion, at the cathode electrode 118's side, of the two-dimensional-electron-gas-controlling layer 115 be positioned between the electric field concentration portions dispersed by the anode electrode 116 and the field plate portions 116a, 116b along the primary surface of the substrate 111, it is possible to reduce electric field intensities of these electric field concentration portions while maintaining the effect of dispersing electric field by the field plate portions 116a, 116b. Moreover, since the electric field intensity of the end portion, at the cathode electrode 118's side, of the two-dimensional-electron-gas-controlling layer 115 can be reduced, it is possible to achieve reduction in electric current collapse and high voltage resistance in the SBD 101.

According to an insight of the inventors, if a bending angle of the bending portion of the anode electrode 116 is acute angle being equal to or smaller than 90 degrees, electric charge is concentrated on this bending portion and thus, electric field increases. Therefore, in order to restrain the electric field intensity in the anode electrode 116, it is preferable that an inclination angle θ in the vicinity of a thickness-changing portion in the step-shaped portion of the insulating film 120 be smaller than 90 degrees, and more preferably less than 60 degrees. Hereby, since the angle, in the lower portion, of the bending portion of the anode electrode 116 provided to arch out to the insulating film 120 is greater than 90 degrees, and preferably greater than 120 degrees, it is possible to restrain an increase in electric field intensity in the vicinity of the anode electrode 116.

An interval $L_y$ indicates an interval between the end portion, at the cathode electrode 118's side, of the field plate portion 116b and the end portion, at the anode electrode 116's side, of the cathode electrode 118 along the primary surface of the substrate 111. The interval $L_y$ is defined similarly even in a case that the shape of the cathode electrode 118 is not uniform on the electron-supplying layer 114, and thus, its shape is not limited. In addition, $L_x$ indicates an interval between the end portion, at the cathode electrode 118's side, of the field plate portion 116b and the changing point $P_2$, as the second changing point at the anode electrode 116's side, varying continuously from the end portion at the cathode electrode 118's side, of the field plate portion 116b among changing points of 2DEG concentration along the primary surface of the substrate 111. In addition, $L_y \geq L_x$ is preferable in order to prevent increase in on-state resistance which is caused by deterioration of electric current collapse caused by an increase in electric field intensity in a portion in a direction of a plane which is in parallel with the primary surface of the substrate 111, immediately beneath the end portion, at the cathode electrode 118's side, of the field plate portion 116b from electric field distribution when applying reverse bias to the SBD 101 in a case of a so-called anode ground in which the anode electrode 116 to which a low voltage is applied and the substrate 111 are identical in electric potential. Herein, in order to achieve equal to or greater than 600 V of voltage resistance in the SBD 101 according to this Embodiment 10, it is preferable that the interval $L_x$ be equal to or greater than 5 μm and equal to or smaller than 20 nm, and the interval $L_y$ be equal to or greater than 5 μm and equal to or smaller than 30 μm.

According to the insight found in the experiments by the inventors, it is possible to relax more electric field by increasing the steps of the insulating film 120 in lower areas of the field plate portions 116a, 116b respectively upward and incrementally. That is, from a view point of alleviating electric field, it is preferable that, a step $d_1$ of the insulating film 120 in the lower area of the field plate portion 116b be greater than thickness $d_0$ of the insulating film 120 in the lower area of the field plate portion 116a ($d_0 < d_1$).

As described above, the SBD 101 according to this Embodiment 10 is configured. This SBD 101 can be produced as follows.

That is, at first, the buffer layer 112, the electron transition layer 113, and the electron-supplying layer 114 are grown in this order on the substrate 111 by using crystal-grow method such as, for example, MOCVD method or the like. Then, a semiconductor layer to become the two-dimensional-electron-gas-controlling layer 115 is grown on the electron-supplying layer 114. When being grown, this semiconductor layer may be doped with impurity such as, for example, carbon or the like. Herein, to be more specific, growing of this semiconductor layer can be conducted as follows. That is, trimethylgallium (TMGa) and ammonia ($NH_3$) are introduced by predetermined flow amounts respectively (respectively, for example, 58 μmol/min and 12 L/min) by, for example, MOCVD method. Simultaneously to this, a semiconductor layer is grown epitaxially by flowing trimethylaluminum (TMAl) at a constant flow amount which is equal to or lower than 0.1% of flow amount of $NH_3$, at a growth temperature of, for example, 1050° C. After that, selective etching is conducted by dry-etching method such as, for example, reactive ion etching method or the like to remove a semiconductor layer selectively other than in the area becoming the two-dimensional-electron-gas-controlling area later, the two-dimensional-electron-gas-controlling layer 115 is formed.

After that, the cathode electrode 118 is formed by, for example, spattering method and lift-off method. Then, a portion of the insulating film 120 having a step-shaped portion is formed by using, for example, plasma-enhanced chemical vapor deposition (PECVD) method, photo-lithography technology, and etching technology successively and appropriately. Then, the anode electrode 116 is formed by spattering method and lift-off method. After that, a remaining portion of the insulating film 120 is formed to cover at least a portion of the anode electrode 116. The SBD 101 according to this Embodiment 10 is produced by the above-described steps.

According to the above-described Embodiment 10 of the present invention, the anode electrode 116 has the field plate portions 116a, 116b arching out to the insulating film 120 toward the cathode electrode 118 in the SBD 101. The thickness of the insulating film 120 in the lower areas of the field plate portions 116a, 116b are configured to increase continuously or incrementally at the cathode electrode 118's side relative to the anode electrode 116's side. The 2DEG concentration in the two-dimensional-electron-gas-controlling area inside the electron transition layer 113 is varied to be lower than 2DEG concentration in other 2DEG layer a across the changing points $P_1$ and $P_2$. The changing point $P_1$ at the position at the cathode electrode 118's side is inside the lower area from the field plate portions 116a, 116b toward the substrate 111. The interval $I_0$ between the changing point $P_1$ and the end portion, at the cathode electrode 118's side of the field plate portion 116b along the primary surface of the substrate 111 is equal to or greater than 1 μm. Therefore, it is possible to offset the position of the electric field concentration portion of the end portion, at the cathode electrode 118's side, of the two-dimensional-electron-gas-controlling layer 115 from other electric field concentration portion. Therefore, it is possible to obtain the effect of dispersing electric field in the portion of the two-dimensional-electron-gas-controlling layer 115, and it is possible to achieve high voltage resistance, reduction in electric current collapse, and reduction in leakage current more effectively in the SBD 101.

Figure 21:
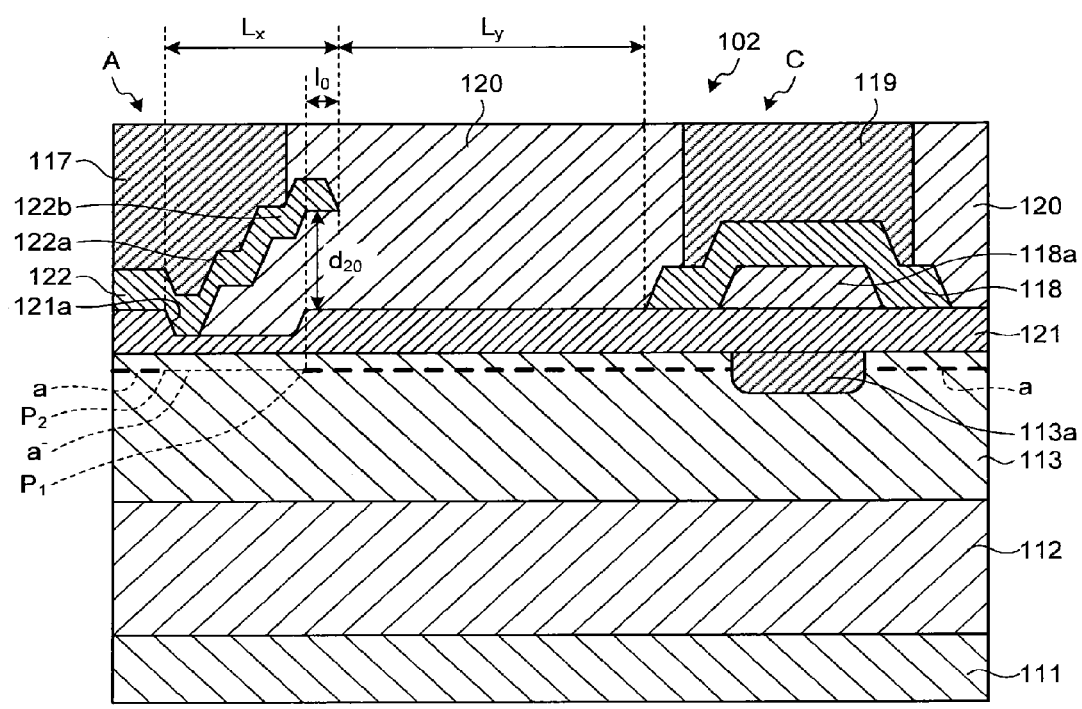
FIG. 21 is a schematic cross-sectional view of a semiconductor device as an SBD according to Embodiment 11 of the present invention.

Hereafter, an SBD 102 as a semiconductor device according to Embodiment 11 of the present invention will be explained. FIG. 21 is a schematic cross-sectional view showing the SBD 102 according to this Embodiment 11.

As shown in FIG. 21, in the SBD 102 according to Embodiment 11, an electron-supplying layer 121 in which a recessed portion 121a is formed selectively is provided on the electron transition layer 113. The 2DEG concentration is varied in the electron transition layer 113 by this recessed portion 121a, and thus the two-dimensional-electron-gas-controlling area including the 2DEG layer $a^-$ in which 2DEG concentration is low relative to other 2DEG layer a across the changing points $P_1$, $P_2$ is configured. The anode electrode 122 is partly provided inside the recessed portion 121a and arches out to the insulating film 120 in an upper area of the recessed portion 121a, and thus field plate portions 122a, 122b are provided. Then, for reasons similar to those of Embodiment 10, to be more specific, it is configured that the end portion, at the cathode electrode 118's side, of the recessed portion 121a, that is the changing point $P_1$ at the cathode electrode 118's side is positioned in lower areas of the field plate portions 122a, 122b, and the interval $I_0$ from the end portion, at the cathode electrode 118's side, of the field plate portion 122b is equal to or greater than 1 μm, preferably equal to or greater than 2 μm along the primary surface of the substrate 111.

The 2DEG concentration of the 2DEG layer $a^-$ of the electron transition layer 113 varies in accordance with the thickness of the electron-supplying layer 121 at a bottom surface portion of the recessed portion 121a. Herein, from a view point that the 2DEG concentration can be varied by a sufficient amount, it is preferable that the depth of the recessed portion 121a be equal to or greater than one fourth (¼) of the thickness of the electron-supplying layer 121. However, if the recessed portion 121a provided in the electron-supplying layer 121 reaches the electron transition layer 113, the 2DEG layer will be deleted. Since hereby it is difficult to control the 2DEG concentration, it is preferable that the depth of the recessed portion 121a be smaller than the thickness of the electron-supplying layer 121 in an area other than the recessed portion 121a. Moreover, for reasons similar to those in Embodiment 10, it is preferable that a thickness $d_{20}$ of the insulating film 120 in an upper area, at the cathode electrode 118's side, of the recessed portion 121a and a lower area of the field plate portion 122b be equal to or greater than 500 nm when being converted to the $SiO_2$ layer according to formula (3). Hereby, it is possible to relax electric field at the end portion, at the cathode electrode 118's side, of the recessed portion 121a while maintaining the effect of dispersing electric field. Explanations for other configuration which is similar to those in Embodiment 10, will be omitted.

The SBD 102 configured as described above can be produced as follows. At first, similarly to Embodiment 10, the buffer layer 112, the electron transition layer 113, and the electron-supplying layer 121 are grown on the substrate 111 in this order. Then, the recessed portion 121a is formed selectively in a portion, configuring the two-dimensional-electron-gas-controlling area, of the electron-supplying layer 121 by a lithography step and an etching step. After that, similarly to Embodiment 10, after forming the cathode electrode 118 and the insulating film 120 in this order on the electron-supplying layer 121, the anode electrode 122 is formed having two stages of field plate portions 122a, 122b so as to cover the upper area of the recessed portion 121a via the insulating film 120. Other steps are conducted similarly to Embodiment 10, and then the SBD 102 according to Embodiment 11 is produced.

According to the above-described Embodiment 11, since the field plate portions 122a, 122b are provided in the upper area of the two-dimensional-electron-gas-controlling area, and the interval $I_0$, between the end portion, at the cathode electrode 118's side, of the recessed portion 121a, that is, the changing point $P_1$, at the cathode electrode 118's side, among changing points defining the two-dimensional-electron-gas-controlling area, and the end portion, at the cathode electrode 118's side, of the field plate portion 122a is equal to or greater than 1 μm, an effect similar to that of Embodiment 10 can be obtained.

Figure 22:
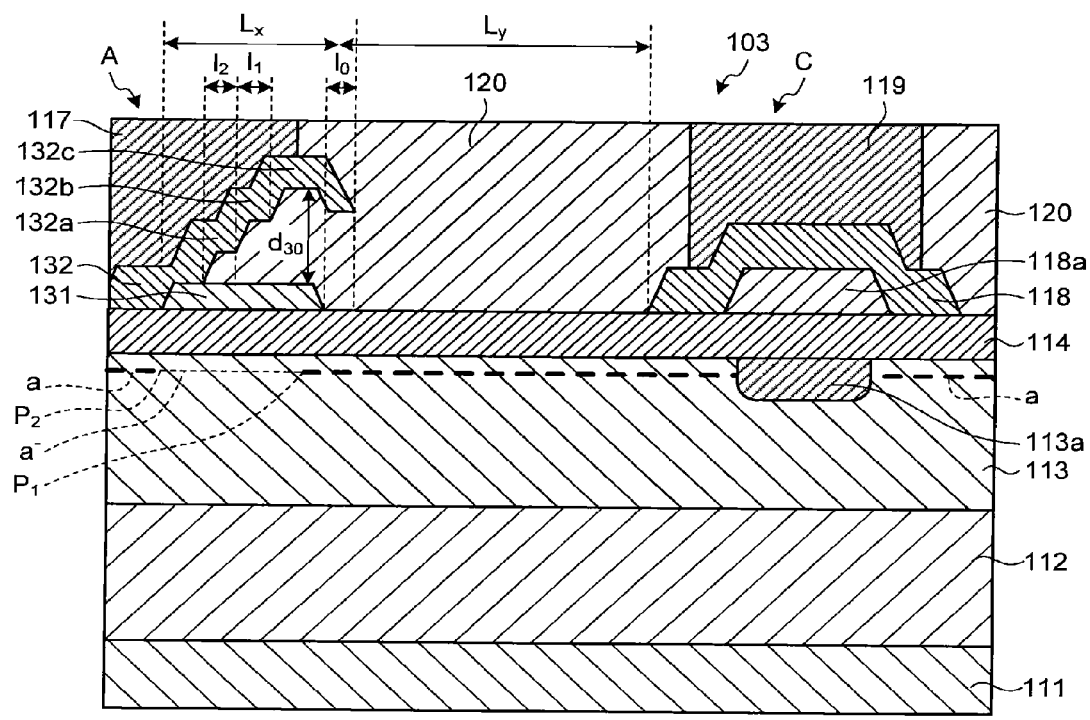
FIG. 22 is a schematic cross-sectional view of a semiconductor device as an SBD according to Embodiment 12 of the present invention.

Hereafter, an SBD 103 as a semiconductor device according to Embodiment 12 of the present invention will be explained. FIG. 22 is a schematic cross-sectional view of the SBD 103 according to Embodiment 12.

As shown in FIG. 22, in the SBD 103 according to Embodiment 12, an anode electrode 132 is provided on the electron-supplying layer 114, a two-dimensional-electron-gas-controlling layer 131, and the step-shaped portion of the insulating film 120. Unlike Embodiment 10, the anode electrode 132 is stranded on the two-dimensional-electron-gas-controlling layer 131 by one stage and has three stages of field plate portions 132a, 132b, 132c on the insulating film 120. That is, the anode electrode 132 has a four-stage field plate structure. The number of stages of the insulating film 120 in the lower area of the anode electrode 132 is not limited specifically, three stages are preferable in consideration of cost increased along with increase in production steps.

An end portion, at the cathode electrode 118's side, of an field plate portion 132c as the upper-most stage and an end portion, at the cathode electrode 118's side, of the two-dimensional-electron-gas-controlling layer 131 become the electric field concentration portion. To address this, and for reasons similar to those of Embodiment 10, it is preferable to configure so that the interval $I_0$ between the end portion, at the cathode electrode 118's side, of the field plate portion 132c and the end portion, at the cathode electrode 118's side, of the two-dimensional-electron-gas-controlling layer 131, that is, the changing point $P_1$ of the 2DEG concentration along the primary surface of the substrate 111 be equal to or greater than 1 μm, and preferably equal to or greater than 2 μm. Moreover, it is configured so that a thickness $d_{30}$ of the insulating film 120 in an upper area of the two-dimensional-electron-gas-controlling layer 131 and a lower area of the field plate portion 132c as the upper-most stage is equal to or greater than 500 nm when being converted to the $SiO_2$ layer. It is preferable that both the interval $I_1$ and an interval $I_2$ be equal to or greater than 1 μm, where the interval $I_1$ is an interval between the end portion making contact with upon the two-dimensional-electron-gas-controlling layer 131, at the cathode electrode 118's side, of the anode electrode 132 and the electrode edge portion of the field plate portion 132a, and the interval $I_2$ is an interval between electrode edge portions of the field plate portions 132a, 132b respectively. From a view point of capable of restraining affection of electric current collapse caused by interference between respective electric field concentration portions, it is preferable that both the interval $I_1$, $I_2$ be equal to or greater than 1 μm.

Herein $L_y$ indicates an interval between the end portion, at the cathode electrode 118's side, of the field plate portion 132c and the end portion, at the cathode electrode 118's side, of the cathode electrode 118, along the primary surface of the substrate 111, and $L_x$ indicates an interval between the end portion, at the cathode electrode 118's side, of the field plate portion 132c and the changing point $P_2$, at the anode electrode 132's side, being varied continuously from the end portion, at the cathode electrode 118's side, of the field plate portion 132c, along the primary surface of the substrate 111. In this case, in a case of anode ground when applying a reverse bias to the SBD 103, $L_y \geq L_x$ is preferable for reasons similar to those of Embodiment 10. Explanations for other configuration and production method, which are similar to those in Embodiment 10, will be omitted.

According to the above-described Embodiment 12 of the present invention, effects similar to those of Embodiments 10, 11 can be obtained.

Figure 23:
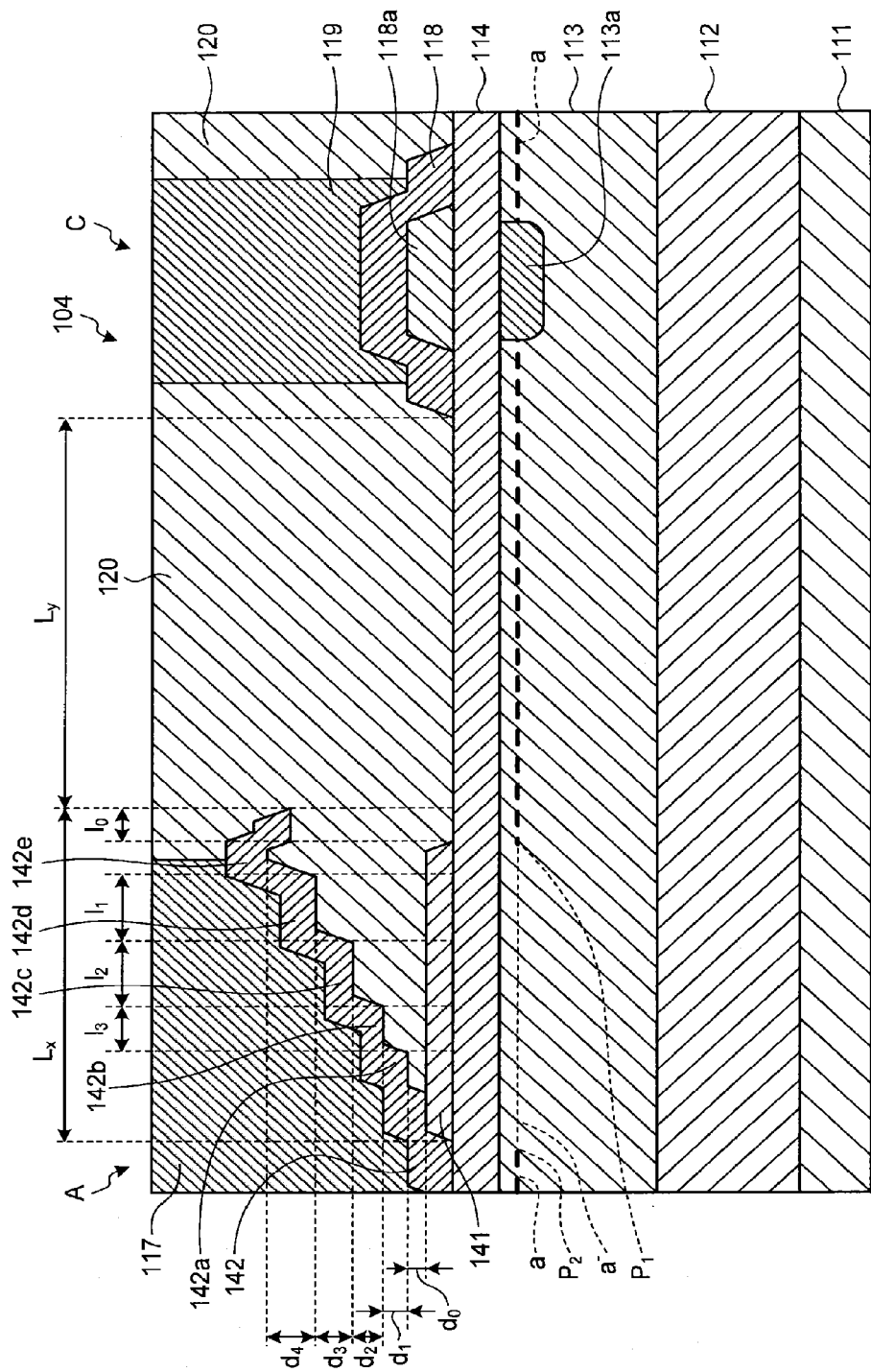
FIG. 23 is a schematic cross-sectional view of a semiconductor device as an SBD according to Embodiment 13 of the present invention.

Hereafter, an SBD 104 as a semiconductor device according to Embodiment 13 of the present invention will be explained. FIG. 23 is a schematic cross-sectional view showing the SBD 104.

As shown in FIG. 23, in the SBD 104 according to Embodiment 13, an anode electrode 142 is provided on the electron-supplying layer 114, the two-dimensional-electron-gas-controlling layer 141, and the step-shaped portion of the insulating film 120. The anode electrode 142 is stranded on the two-dimensional-electron-gas-controlling layer 141 by one stage, and unlike Embodiments 10 and 12, the anode electrode 142 has five stages of field plate portions 142a, 142b, 142c, 142d, 142e on the insulating film 120. That is, the anode electrode 142 has a six-stage field plate structure.

An end portion, at the cathode electrode 118's side, of the field plate portion 142e as the upper-most stage and an end portion, at the cathode electrode 118's side, of the two-dimensional-electron-gas-controlling layer 141 become electric field concentration portions. To address this, from reasons similar to those of Embodiment 10, it is preferable that the interval $I_0$ between the end portion, at the cathode electrode 118's side, of the field plate portion 142e and the end portion, at the cathode electrode 118's side, of the two-dimensional-electron-gas-controlling layer 141 and in parallel with the primary surface of the substrate 111, that is, the changing point $P_1$ of the 2DEG concentration be equal to or greater than 1 μm, and preferably equal to or greater than 2 μm.

Electrode edge portions of the field plate portions 142a to 142d as well become electric field concentration portions respectively. If a distance between the electric field concentration portions is close, electric fields interfere with each other, and thus, the effect, by the field plate structure, of dispersing electric field is weakened. To address this, it is preferable that any one of the interval $I_1$ between electrode edge portions of the respective field plate portions 142d, 142c, the interval $I_2$ between electrode edge portions of the respective field plate portions 142c, 142b, and the interval $I_3$ between electrode edge portions of the respective field plate portions 142b, 142a be equal to or greater than 0.5 μm, and more preferably equal to or greater than 1 μm.

By increasing the step of the insulating film 120 in the lower areas of the field plate portions 142a to 142e being formed in a step-shape upward and incrementally respectively, it is possible to relax the intensity of electric field more effectively. That is, $d_0$, $d_1$, $d_2$, $d_3$, $d_4$ indicate steps, of the insulating film 120, in the respective lower areas of the field plate portions 142b, 142c, 142d, 142e, and the respective steps may be identical, but $d_0 < d_1 < d_2 < d_3 < d_4$ is more preferable. From reasons similar to those of Embodiment 10, it is preferable that a thickness, when being converted to $SiO_2$, of $d_0 + d_1 + d_2 + d_3 + d_4$ as the thickness of the insulating film 120 in the lower area of the field plate portion 142e be equal to or greater than 500 nm.

Moreover, $L_y$ indicates an interval between the end portion, at the cathode electrode 118's side, of the field plate portion 142e and the end portion, at the anode electrode 142's side, of the cathode electrode 118, along the primary surface of the substrate 111. $L_x$ indicates an interval between the end portion, at the cathode electrode 118's side, of the field plate portion 142e, and the changing point $P_2$, at the anode electrode 142's side, varying continuously from the end portion, at the cathode electrode 118's side, of the two-dimensional-electron-gas-controlling layer 141. In a case of anode ground when applying reverse bias, $L_y \geq L_x$ is preferable for reasons similar to those of Embodiments 10, 11, 12. Explanations for other configuration and production method, which are similar to those in Embodiments 10, 12, will be omitted.

According to the above-described Embodiment 13 of the present invention, effects similar to those of Embodiments 10 to 12 can be obtained, and since the anode electrode 142 is of a multi-stage field plate structure by the field plate portions 142a to 142e, it is possible to disperse electric field applied to the 213 and relax electric field intensity in the electric field concentration portion more effectively.

Figure 24:
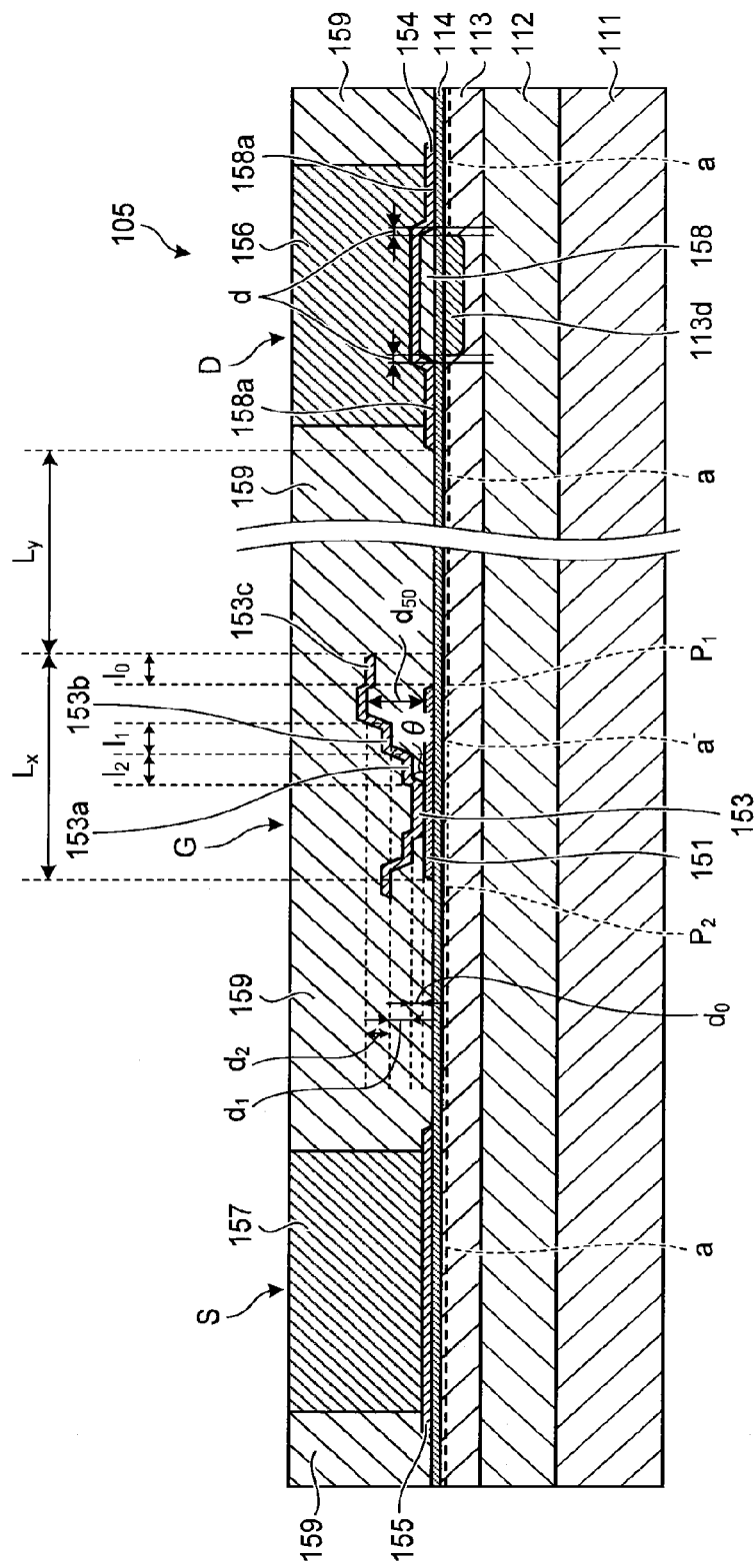
FIG. 24 is a schematic cross-sectional view of a semiconductor device as a HEMT-type field effect transistor according to Embodiment 14 of the present invention.

Hereafter, a HEMT-type field effect transistor as a semiconductor device according to Embodiment 14 of the present invention will be explained. FIG. 24 is a schematic cross-sectional view showing a HEMT 105 according to this Embodiment 14.

As shown in FIG. 24, the HEMT 105 according to Embodiment 14 includes the substrate 111, the buffer layer 112, the electron transition layer 113, the electron-supplying layer 114, a two-dimensional-electron-gas-controlling layer 151, a gate electrode 153, a drain electrode 154 and a drain wiring 156, a source electrode 155 and a source wiring 157, a dielectric layer 158, and an insulating film 159.

The two-dimensional-electron-gas-controlling layer 151 is provided selectively on the surface of the electron-supplying layer 114. The gate electrode 153 as the third electrode is provided on an upper layer of the two-dimensional-electron-gas-controlling layer 151, and thus the gate G of the HEMT 105 is configured.

The drain electrode 154 is provided selectively on the electron-supplying layer 114 separately from the gate electrode 153. The drain electrode 154 as the second electrode has a layered structure made of, for example, Ti/Al. The drain wiring 156 connected to the drain electrode 154 electrically is provided on the drain electrode 154. The drain D of the HEMT 105 is configured with the drain electrode 154 and the drain wiring 156.

A 2DEG-non-produced area 113d is provided in a portion of the electron transition layer 113 in an area, in which the drain D is formed. This 2DEG-non-produced area 113d is an area and into which impurity ion, for example, N or the like is injected and in which 2DEG is removed and thus no 2DEG is produced. The drain electrode 154 is provide on the electron-supplying layer 114 along a plane which is in parallel with the primary surface of the substrate 111 to cover the 2DEG-non-produced area 113d and the dielectric layer 158. By the configuration as such, the drain electrode 154 makes ohmic contact with the 2DEG layer a produced in the electron transition layer 113 through the contact portion 158a via the electron-supplying layer 114.

The source electrode 155 is provided selectively on the electron-supplying layer 114 and separately from the drain electrode 154 and the gate electrode 153. The source electrode 155 as the first electrode has a layered structure made of, for example, Ti/Al. Hereby, the source electrode 155 makes ohmic contact with the 2DEG layer a produced in the electron transition layer 113 via the electron-supplying layer 114. The source wiring 157 connected to the source electrode 155 electrically is provided on the source electrode 155. The source S of the HEMT 105 is configured with the source electrode 155 and the source wiring 157. The gate electrode 153 is disposed between the drain electrode 154 and the source electrode 155. In this Embodiment 14, the source electrode 155 as an ohmic electrode being other than the drain electrode 154 as the electrode at a side to which the dielectric layer 158 is provided is grounded, thus the source electrode 155 is identical in electric potential to that of the substrate 111 or the buffer layer 112.

The two-dimensional-electron-gas-controlling layer 151 as a portion of the third semiconductor layer is configured with a GROUP-III nitride compound semiconductor of which bandgap is narrower than that of the electron-supplying layer 114, to be more specific, for example, GaN for varying the concentration of 2DEG produced in the electron transition layer 113 locally. Herein the 2DEG concentration produced in the electron transition layer 113 is varied to decrease more if the thickness of the two-dimensional-electron-gas-controlling layer 151 increases more. Therefore, in this Embodiment 14, it is preferable that the thickness of the two-dimensional-electron-gas-controlling layer 115 be, for example, equal to or greater than 20 nm and equal to or smaller than 200 nm. From a view point of facilitating control of 2DEG concentration by thickness-control using growth and etching, it is preferable that the thickness of the two-dimensional-electron-gas-controlling layer 115 be equal to or greater than 20 nm and equal to or smaller than 100 nm. In order to restrain variation in 2DEG concentration caused by variation in thickness, it is more preferable that the thickness of the two-dimensional-electron-gas-controlling layer 115 be equal to or greater than 25 nm and equal to or smaller than 80 nm.

In this Embodiment 14, a semiconductor stack is configured with the electron transition layer 113, the electron-supplying layer 114, and the two-dimensional-electron-gas-controlling layer 151. The 2DEG concentration inside the semiconductor stack is varied by the two-dimensional-electron-gas-controlling layer 151. Hereby, the 2DEG layer $a^-$ in which 2DEG concentration in the lower area of the two-dimensional-electron-gas-controlling layer 151 across the changing points $P_1$, $P_2$ of the 2DEG concentration is low, that is, the two-dimensional-electron-gas-controlling area is defined. From a view point of electric field intensity for increasing voltage resistance of HEMT 105, it is preferable that the 2DEG concentration of the 2DEG layer $a^-$ in low concentration be equal to or smaller than $7 \times 10^{12}$ $cm^{-2}$. From a view point of reducing on-state resistance of the HEMT 105, it is preferable that the 2DEG concentration of the 2DEG layer a in high concentration be higher than $7 \times 10^{12}$ $cm^{-2}$.

The drain electrode 154 as the first electrode and the source electrode 155 as the second electrode are provided on the electron-supplying layer 114, and is configured with a layered structure of, for example, Ti/Al. Hereby the drain electrode 154 and the source electrode 155 make ohmic contact with the 2DEG layer a produced in the electron transition layer 113 via the electron-supplying layer 114.

The gate electrode 153 as the third electrode is disposed between the drain electrode 154 and the source electrode 155 and is provided to arch out above the two-dimensional-electron-gas-controlling layer 151 and the insulating film 159. This gate electrode 153 is configured with a layered structure of, for example, Ni/Au. Hereby the gate electrode 153 makes schottky contact with the 2DEG layer $a^-$ in which 2DEG concentration is reduced by the two-dimensional-electron-gas-controlling layer 151 via the two-dimensional-electron-gas-controlling layer 151 and the electron-supplying layer 114.

The insulating film 159 is configured with, for example, $SiO_2$. The insulating film 159 protects surfaces of the two-dimensional-electron-gas-controlling layer 151, the gate electrode 153, the drain electrode 154, the source electrode 155, and the electron-supplying layer 114 mainly. In order to reduce electric field intensity of the end portion, at the drain electrode 154's side, of the two-dimensional-electron-gas-controlling layer 151, it is effective to increase the thickness of the insulating film 159 disposed in an upper area of this two-dimensional-electron-gas-controlling layer 151 and a lower area of the gate electrode 153. However, by merely increasing the thickness of the insulating film 159 in this portion, electric field increases at a position of the end portion (gate end), contacting the two-dimensional-electron-gas-controlling layer 151, of the gate electrode 153. To address this, in this Embodiment 14, field plate portions 153a, 153b, 153c are provided in the gate electrode 153 to arch out and extend in a multi-stage manner, for example, in three-stage manner toward the drain electrode 154. Based on that, it is preferable that thickness $d_{50}$ of the insulating film 159 in an upper area of the two-dimensional-electron-gas-controlling layer 151 and a lower area of the field plate portion 153c be equal to or greater than 500 nm. Hereby, it is possible to relax electric field in a portion of the gate end of the two-dimensional-electron-gas-controlling layer 151 while maintaining the effect of dispersing electric field. In a case of configuring the insulating film 159 by combining appropriately, and layering successively, dielectric materials such as SiN and $Al_2O_3$ or the like being other than $SiO_2$ or plural kinds of materials, it is preferable that the thickness $d_{50}$ be equal to or greater than 500 nm when being converted to the thickness d converted to $SiO_2$ based on the above-described formula (3).

In a case of configuring the gate electrode 153 in a multi-stage manner, the electrode edge portion in the gate electrode 153, that is, the thickness-changing portion of the insulating film 159 becomes an electric field concentration portion. As described above, the end portion as well, at the drain electrode 154's side, of the two-dimensional-electron-gas-controlling layer 151 becomes an electric field concentration portion. If an interval between these electric field concentration portions is small, electric fields interfere with each other, and thus, the effect of dispersing electric field by the field plate portions 153a to 153c is weakened. Therefore, from reasons similar to those of Embodiment 10, it is preferable that the interval $I_0$ between the end portion at which electric field concentration matters the most, at the drain electrode 154's side, of the two-dimensional-electron-gas-controlling layer 151 and the end portion, at the drain electrode 154's side, of the field plate portion 153c of the gate electrode 153 along a plane which is in parallel with the primary surface of the substrate 111 be equal to or greater than 1 μm, and more preferably equal to or greater than 2 μm. The interval $I_1$ is an interval between respective electrode edge portions of the field plate portions 153b, 153a along a plane which is in parallel with the primary surface of the substrate 111, and the interval $I_2$ is an interval between the end portion, at the drain electrode 154's side, contacting upward of the two-dimensional-electron-gas-controlling layer 151 and the electrode edge portion of the field plate portion 153a. For similar reasons, it is preferable that both the interval $I_1$ and the interval $I_2$ be equal to or greater than 0.5 μm, and more preferably equal to or greater than 1 μm from view point of capable of restraining affection of electric current collapse caused by interference between respective electric field concentration portions. Although it is preferable that these interval $I_0$, $I_1$, $I_2$ be applied to the semiconductor device having voltage resistance of 600 V, but not necessarily limited only to the semiconductor device as such.

Moreover, it is configured so that the changing point $P_1$, at the drain electrode 154's side, in an area in which two-dimensional electron gas is positioned along the primary surface of the substrate 111 between the end portion, at the drain electrode 154's side, of the field plate portion 153c as the upper-most stage in the field plate structure of the gate electrode 153 and the bending-end portion of the field plate portion 153b which is lower by one stage from the upper-most stage, preferably in a middle section in a width direction. To be more specific, it is configured so that the end portion, at the drain electrode 154's side, of the two-dimensional-electron-gas-controlling layer 151 is positioned along the primary surface of the substrate 111 between the end portion, at the drain electrode 154's side, of the field plate portion 153b and the electrode edge portion of the field plate portion 153b, preferably in a middle portion in width direction. In other words, it is preferable that the end portion, at the drain electrode 154's side, of the two-dimensional-electron-gas-controlling layer 151 be positioned in other electric field concentration portion, for example, other than beneath the thickness-changing portion of the insulating film 159 and the electrode edge portion of the gate electrode 153, preferably in a middle portion in width direction of adjacent electric field concentration portions. Hereby, it is possible to obtain the effect of dispersing electric field more effectively in the area in which two-dimensional electron gas is controlled.

If an angle of the electrode edge portion of the gate electrode 153 is acute angle being equal to or smaller than 90 degrees, electric charge is concentrated on this bending portion and thus, electric field increases. Therefore, in order to restrain the electric field intensity in the gate electrode 153, it is preferable that an inclination angle θ in the vicinity of a thickness-changing portion in the step-shaped portion of the insulating film 159 be smaller than 90 degrees, and more preferably smaller than 60 degrees. Hereby, since the angles of the electrode edge portions of the field plate portions 153a, 153b, 153c provided to arch out to the insulating film 159 is of an obtuse angle, that is, greater than 90 degrees, and preferably greater than 120 degrees, it is possible to restrain an increase in electric field intensity in the gate electrode 153.

Herein $L_y$ is an interval between the end portion, at the drain electrode 154's side, of the field plate portion 153c and the end portion, at the gate electrode 153's side, of this drain electrode 154 along the direction of the primary surface of the substrate 111. The interval $L_y$ is defined similarly even in a case that the shape of the drain electrode 154 is not uniform on the electron-supplying layer 114, and thus, its shape is not limited. In addition, $L_x$ indicates an interval between the end portion, at the drain electrode 154's side, of the field plate portion 153c and the changing point $P_2$, at the source electrode 155's side, varying continuously from the changing point $P_1$ beneath the end portion, at the drain electrode 154's side, of the two-dimensional-electron-gas-controlling layer 151 along the primary surface of the substrate 111. In this case, $L_y \geq L_x$ is preferable in order to prevent increase in order to prevent increase in on-state resistance which is caused by deterioration of electric current collapse caused by an increase in electric field intensity in a portion in a direction of a plane which is in parallel with the primary surface of the substrate 111, immediately beneath the end portion, at the drain electrode 154's side, of the field plate portion 153c from electric field distribution when turning off power for the HEMT 105. Herein, in order to achieve equal to or greater than 600 V of voltage resistance in the HEMT 105 according to this Embodiment 14, it is preferable that the interval $L_x$ be equal to or greater than 5 μm and equal to or smaller than 20 nm, and the interval $L_y$ be equal to or greater than 5 μm and equal to or smaller than 30 μm.

Moreover, by increasing steps of the insulating film 159 upward and incrementally respectively in the lower areas of the field plate portions 153a, 153b, 153c being formed in a step shape, it is possible to relax electric field more effectively. That is, when $d_0$, $d_1$, and $d_2$ indicate steps of the insulating film 159 in lower areas of the respective field plate portions 153a, 153b, 153c, the respectively steps may be identical, and $d_0 < d_1 < d_2$ is more preferable. Explanations for other configuration and production method of the semiconductor device, which are similar to those in Embodiments 10 to 13, will be omitted.

According to the above-described Embodiment 14 of the present invention, in the HEMT 105, it is possible to offset the electric field concentration portion of the end portion, at the drain electrode 154's side, of the two-dimensional-electron-gas-controlling layer 151 from other electric field concentration portion positioned at the electrode edge portions of the field plate portions 153a to 153c. Therefore, it is possible to disperse electric field in the two-dimensional-electron-gas-controlling layer 151 and improve high voltage resistance, reduction in electric current collapse, and reduction in leakage current in the HEMT 105 more effectively, and thus, it is possible to obtain effects similar to those of Embodiments 10 to 13.

Figure 25:
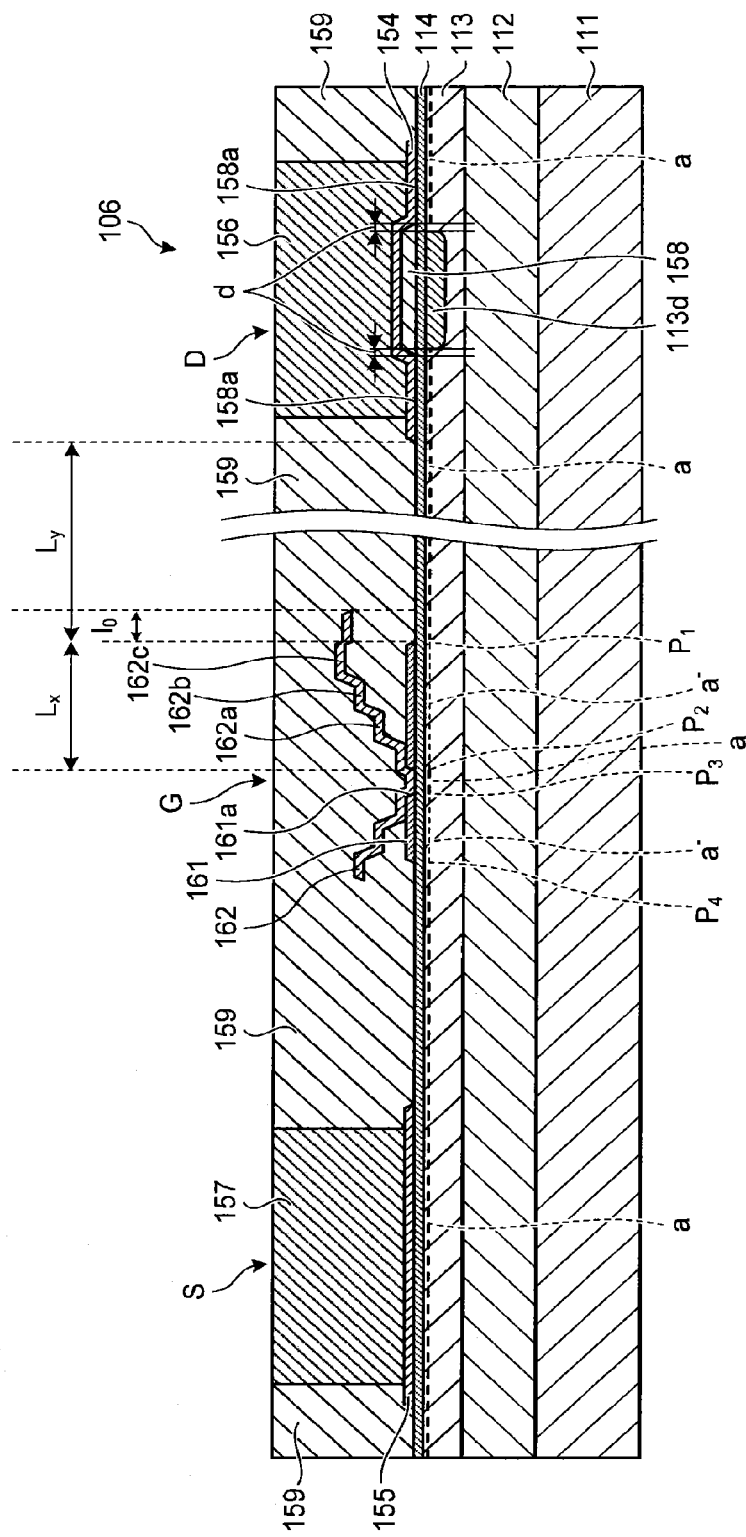
FIG. 25 is a schematic cross-sectional view of a semiconductor device as a HEMT-type field effect transistor according to Embodiment 15 of the present invention.

Hereafter, a HEMT 106 as a semiconductor device according to Embodiment 15 will be explained. FIG. 25 is a schematic cross-sectional view of the HEMT 106 according to this Embodiment 15.

As shown in FIG. 25, and unlike Embodiment 14, a recessed portion 161a is formed in a two-dimensional-electron-gas-controlling layer 161 in the HEMT 106 according to Embodiment 15. The recessed portion 161a is formed in the two-dimensional-electron-gas-controlling layer 161 by conventionally known lithography step and etching step.

The gate electrode 162 in which the field plate portions 162a, 162b, 162c are extended to arch out to the insulating film 159 toward the drain electrode 154's side are provided on the two-dimensional-electron-gas-controlling layer 161 so as to contact the electron-supplying layer 114 directly through the recessed portion 161a. Hereby, the 2DEG layer $a^-$ in which 2DEG concentration is low is produced in the electron transition layer 113 in a lower area of the two-dimensional-electron-gas-controlling layer 161. In this case, four changing points $P_1$, $P_2$, $P_3$, $P_4$ exist from the drain electrode 154's side in the electron transition layer 113, an area being continuous between the changing points $P_1$ and $P_2$ and an area being continuous between the changing points $P_3$ and $P_4$ configure the two-dimensional-electron-gas-controlling area made of the 2DEG layer $a^-$ in which 2DEG concentration is low. For reasons similar to those of Embodiment 10, it is preferable that the interval $I_0$ between the end portion, being closest to the drain electrode 154's side, of the two-dimensional-electron-gas-controlling layer 161, at which electric field concentration matters the most, that is, the position of the changing point $P_1$, and the end portion, at the drain electrode 154's side, of the field plate portion 162c of the gate electrode 162 along a plane which is in parallel with the primary surface of the substrate 111 be equal to or greater than 1 μm, and more preferably equal to or greater than 2 μm.

Moreover, $L_y$ indicates an interval between the end portion, at the drain electrode 154's side, of the gate electrode 162 and the end portion, at the gate electrode 162's side, of the drain electrode 154, along the direction of the primary surface of the substrate 111. $L_x$ indicates an interval between the end portion, at the drain electrode 154's side, of the field plate portion 162c, and the other changing point $P_2$, at source electrode 155's side, of the 2DEG layer $a^-$ varying continuously from the changing point $P_1$ beneath the end portion, at the drain electrode 154's side, of the two-dimensional-electron-gas-controlling layer 161 along the direction of the primary surface of the substrate 111. In this case, $L_y \geq L_x$ is preferable for reasons similar to those of Embodiment 14. Herein, in order to achieve equal to or greater than 600 V of voltage resistance in the HEMT 106 according to this Embodiment 15, it is preferable that the interval $L_x$ be equal to or greater than 5 μm and equal to or smaller than 20 nm, and the interval $L_y$ be equal to or greater than 5 μm and equal to or smaller than 30 μm. Explanations for other configuration and production method, which are similar to those in Embodiment 14, will be omitted.

According to this Embodiment 15, effects similar to those of Embodiment 14 can be obtained.

According to the above-described nitride semiconductor devices according to Embodiments 10 to 15, it is possible to achieve high voltage resistance, reduction in electric current collapse, and reduction in leakage current more effectively.

Hereafter, a nitride semiconductor device according to Embodiments 16 to 20 of the present invention will be explained. At first, problems in a conventional nitride semiconductor device will be explained. That is, Japanese Patent No. 4584293 and Japanese Patent No. 4691060 (hereinafter to be referred to as Patent Literature 8 and 9, respectively) describe a configuration of providing an equipotential plane in an epitaxial layer of a field effect transistor. To be more specific, Patent Literature 8 describes a GaN-HEMT as an electron-supplying layer, in which Al composition decreases toward a surface incrementally and n-type donor-doped AlGaN is used, and in which an SiC substrate is used for a substrate for restraining decline in efficiency in operation as an amplifier. Patent Literature 9 describes a configuration of forming a portion of or an entire buffer layer formed on a Sapphire substrate with an n-type conductive GaN layer for restraining electric current collapse. This Patent Literature 9 describes a GaN-based hetero junction field effect transistor of which electric potential of a conductive semiconductor layer is controlled to be identical with a source electrode.

However, various experiments conducted by the inventors shows that, in the semiconductor device described in Patent Literature 9, an electron in an n-type GaN buffer layer is dispersed in a surface direction, and thus an entire epitaxial layer becomes an n-GaN layer. Therefore, it is evident that, in the semiconductor device described in Patent Literature 9, electric current collapse can be restrained but it is difficult to restrain leakage current. To address this, in the embodiments below, a nitride semiconductor device, a diode, and a field effect transistor capable of restraining electric current collapse and leakage current even in a case of using an insulating substrate as a substrate will be provided.

Herein, prior to explaining Embodiments 16 to 20, keen examination conducted by the inventors to solve the above-described problem will be explained. At first, the inventors studied a method of relaxing an electric field in a nitride semiconductor device using an insulating substrate. Originally, electric field relaxation is difficult in a semiconductor device using an insulating substrate for the following reasons.

That is, in a case of using a conductive substrate such as an Si substrate or the like for a substrate for the nitride semiconductor device, it is possible to relax an electric field applied to a semiconductor layer configuring the nitride semiconductor device by making this conductive substrate be grounded. On the other hand, when an insulating substrate such as a Sapphire substrate or the like is used for a substrate for the nitride semiconductor device, this insulating substrate cannot be grounded. Therefore, an electric field produced in the nitride semiconductor device is concentrated on the semiconductor layer's side at which an electrode or the like is provided, and thus it is not possible to relax the electric field. In this case, in order to relax the electric field applied to the semiconductor layer, structures of a gate electrode, a source electrode, and an anode electrode or the like, that is, a field plate structure at a surface's side must be complex. In other words, when an insulating substrate is used as a substrate, a large electric field is applied to a portion of a field plate structure provided at the surface's side of the nitride semiconductor device relative to a case of using a conductive substrate as a substrate.

As described in Patent Literature 9, the Applicant of the subject application proposed a method of restraining electric current collapse by a method of configuring a portion of, or an entire, buffer layer on the substrate by an n-type conductive layer, to be more specific, an n-GaN layer. In order to improve the technology proposed in Patent Literature 9, the inventors conducted other various experiments to the nitride semiconductor device described in Patent Literature 9.

Then, the inventors thought that an electric current collapse can be restrained if a configuration similar to that of the nitride semiconductor device using a grounded conductive substrate is achieved even if it is a nitride semiconductor device using an insulating substrate. That is, a so-called back field plate structure provided at a substrate's side similar to a field plate structure at a surface's side in the nitride semiconductor device using the conductive substrate were studied. The inventors thought a method of providing a back field plate structure using an n-type conductive layer and 2DEG at a substrate' side being a back surface's side when using the insulating substrate as a substrate of the nitride semiconductor device. The inventors thought that, if the n-type conductive layer and 2DEG are connected to outside electrically, even if it is the nitride semiconductor device using the insulating substrate, an electric field applied to the semiconductor layer can be relaxed and electric current collapse can be restrained similarly to the case of using the conductive substrate. Hereby, a nitride semiconductor device such as an SBD, a HEMT, or an FET or the like being reduced in cost and having a high switching characteristics can be achieved.

However, experiments and studies conducted by the inventors regarding the nitride semiconductor device as such showed that a phenomenon occurred in which an electron in an n-type conductive layer and 2DEG is dispersed in a surface direction in this nitride semiconductor device. The inventors found a problem that, an entire buffer layer and electron transition layer of a nitride semiconductor device may become n-type possibly, then full depletion at a reverse bias is difficult, and thus, leakage current may increase. To address this, the inventors conducted experiments and studies for a specific configuration based on the above-described studies, and then studied a method of restraining leakage current while restraining electric current collapse.

At first, the inventors studied a method of restraining a carrier from being dispersed because the carrier may be dispersed to a surface's side if a conductive layer exists at an upper layer of an insulating substrate in the back field plate structure as described above. As a result of the study, the inventors thought that, in order to restrain the carrier from being dispersed, equal to or greater than 300 meV of offset may exist as an energy barrier in a case that the carrier is an electron. Then the inventors studied a configuration of providing this offset, and conceived a plurality of methods for preventing the carrier of a conductive layer from being dispersed to the surface's side.

Firstly, the inventors thought a method of providing another semiconductor layer making hetero junction to the conductive layer and making use of a band-offset between a conductance band and a valence at the hetero junction. In this case, in order to prevent dispersion of the carrier of the conductive layer to the surface's side, it is desirable that the another semiconductor layer making hetero junction to the conductive layer at the surface's side be greater in bandgap relative to the conductive layer.

Secondly, the inventors thought a method of providing an offset to a carrier from the conductive layer by providing another semiconductor layer making homo pn junction to the conductive layer. To be more specific, in a case of the conductive layer being an n-GaN layer, another semiconductor layer is a p-GaN layer. Similarly, in a case that the conductive layer is made of an n-AlGaN layer, another semiconductor layer is a p-AlGaN layer of which Al composition ratio is identical. Hereby, it is possible to achieve equal to or greater than 300 meV of offset to the electron between the conductive layer and another semiconductor layer at the surface's side.

Thirdly, the inventors thought a method of providing an offset to a carrier from a conductive layer by providing another p-type semiconductor layer making hetero pn junction to the conductive layer in a case that the conductive layer is an n-type semiconductor layer. To be more specific, the inventors studied a case that a bandgap of another p-type semiconductor layer is great relative to a bandgap of the n-type semiconductor layer being the conductive layer and a that a bandgap of another p-type semiconductor layer is small relative to a bandgap of the n-type semiconductor layer being the conductive layer.

For configuration in the case that the bandgap of the p-type semiconductor layer is great and that the conductive layer is an n-GaN layer, it is desirable that the p-type semiconductor layer be an $Al_xGa_{1-x}N$ layer $(0<x\leq 1)$ being doped with p-type impurity. Herein, in a case of using Mg as p-type impurity, it is preferable that its Mg concentration be equal to or greater than $1.0\times10^{16}$ cm$^{-3}$ and smaller than $5.0\times10^{19}$ cm$^{-3}$. If the Al composition ratio x of the $Al_xGa_{1-x}N$ layer is zero, it is a configuration similar to a case of providing another semiconductor layer making homo pn junction to the above-described conductive layer. On the other hand, for a configuration in a case that a bandgap of the p-type semiconductor layer is small, a case is considered in which a semiconductor layer (core-formed layer) at a lower layer of the conductive layer is an AlN layer. In this case, a configuration is desirable that the conductive layer be an n-AlGaN layer of which conductive layer is doped with n-type impurity, and a p-type semiconductor layer at an upper layer of the conductive layer be a p-AlGaN layer, and preferably a p-GaN layer, of which bandgap is small than that of the conductive layer.

Moreover, in a case of using an insulating substrate as a substrate, in order to provide a back field plate structure using an n-type conductive layer and 2DEG, it is necessary to fix electric potentials of the n-type conductive layer and a produced 2DEG layer. Then, the inventors studied a method as well for fixing the electric potential of the conductive layer.

At first, in order to fix the electric potential of the conductive layer, it must be avoided that at least one of the n-type conductive layer and the 2DEG layer is in a state of not being connected electrically with an outer pad and an electrode fixed at a predetermined electric potential or grounded (herein, float). For that purpose, a contact structure is necessary for making the n-type conductive layer including the 2DEG layer be conducted to outside. For this contact structure, two cases are considered. In one case, contact is made from a surface (upper surface)'s side on which a semiconductor layer including a conductive layer is layered to the insulating substrate, and in the other case, contact is made from a back surface (bottom surface)'s side opposite to the surface to the insulating substrate. Moreover, the inventors found that, in order to form the contact structure making contact from the surface's side, an etching sacrifice layer is necessary when a contact hole is formed in the contact structure. To address this, the inventors also thought that an $Al_xGa_{1-x}N$ layer of which Al composition ratio x is relatively great is in combined use as an etching sacrifice layer in various configurations for providing the above-described offset. The present invention is conceived based on the above-described various studies.

Figure 26:
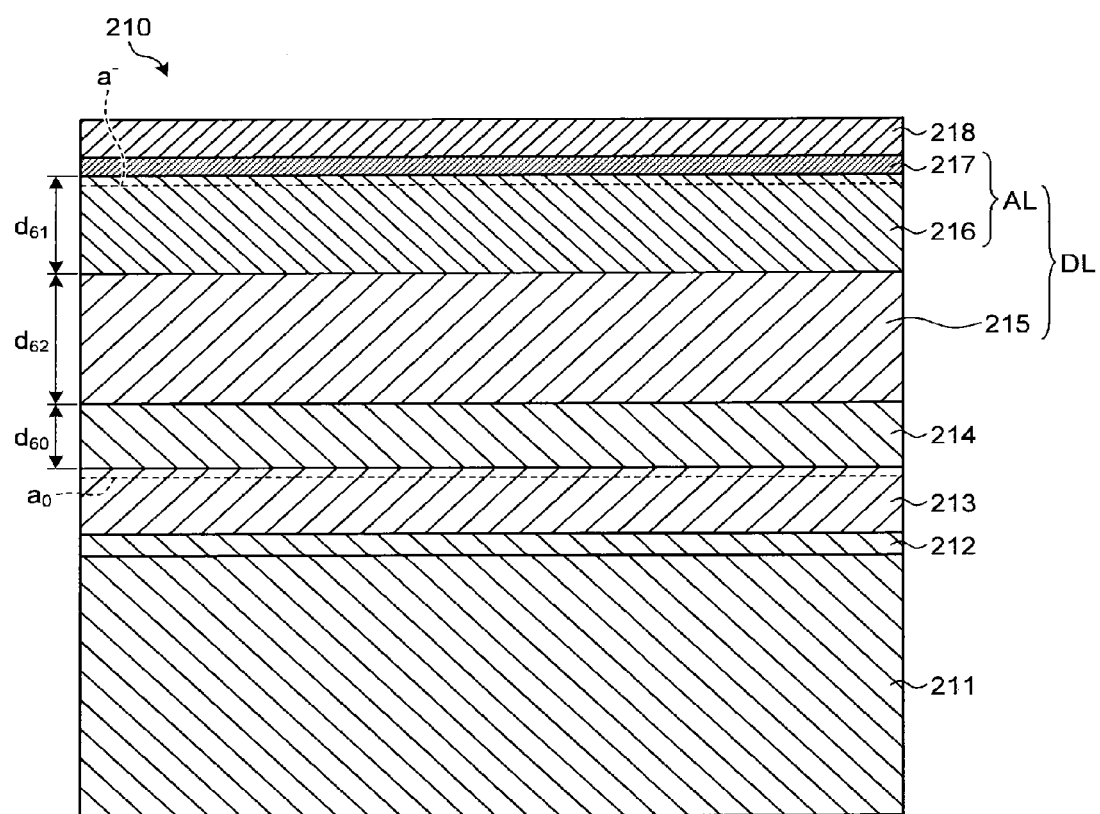
FIG. 26 is a schematic cross-sectional view showing semiconductor-layered substrates according to Embodiments 16 to 20 of the present invention.

FIG. 26 is a cross-sectional view showing a configuration of a semiconductor-layered substrate for producing a nitride semiconductor device according to Embodiments 16 to 20 which will be explained below. That is, a semiconductor-layered substrate 210 is configured with layering a core-formed layer 212, a n-type conductive layer 213, an anti-diffusion layer 214, a high resistance buffer layer 215, an electron transition layer 216, an electron-supplying layer 217, and a semiconductor layer 218 on a Sapphire substrate 211 in this order. An active layer AL is configured with the electron transition layer 216 and the electron-supplying layer 217, and a device layer DL is configured with the active layer AL and the high resistance buffer layer 215.

The Sapphire substrate 211 configures an insulating substrate. The core-formed layer 212 is made of, for example, a GaN layer and an AlN layer or the like being grown at a low temperature. It may be configured not to provide the core-formed layer 212, and there is a case as well in which the core-formed layer 212 is a portion of the n-type conductive layer 213 on an upper layer thereof.

The n-type conductive layer 213 provided at an upper layer of the core-formed layer 212 is made of an $Al_yGa_{1-y}N$ layer ($0 \leq y \leq 1$) with an Al composition ratio y being doped with n-type impurity, and typically an n-GaN layer. Herein, for production methods of this n-type conductive layer 213, for example, three methods below are possible. That is, firstly, an n-$Al_yGa_{1-y}N$ layer is formed by growing an $Al_yGa_{1-y}N$ while doping with, for example, Si, tellurium (Te), oxygen (O), or sulfur (S) as n-type impurities by, for example, MOCVD method. Herein, it is preferable that, in order to make the n-type conductive layer 213 act as a back field plate structure, a doping amount of the n-type impurity be equal to or greater than $5.0 \times 10^{16}$ cm$^{-3}$ and equal to or smaller than $1.0 \times 10^{20}$ cm$^{-3}$. Secondly, an n-$Al_yGa_{1-y}N$ layer is formed by dispersing oxygen (O) from Sapphire ($Al_2O_3$) of the Sapphire substrate 211 when growing the $Al_yGa_{1-y}N$. In this case, in order to make oxygen concentration be equal to or greater than $5.0 \times 10^{16}$ cm$^{-3}$, it is preferable that the growth temperature be controlled at a high temperature of equal to or higher than 1000° C. and equal to or lower than 1500° C. Thirdly, an n-$Al_yGa_{1-y}N$ layer is formed by making a nitrogen hole in the $Al_yGa_{1-y}N$ layer by increasing ambient temperature after growing $Al_yGa_{1-y}N$.

The anti-diffusion layer 214 is a layer for not making an electron be dispersed to an upper layer's side from the n-type conductive layer 213 and made of an $Al_xGa_{1-x}N$ layer with, Al composition ratio x, for example. In order to restrain from an electron from being dispersed to an upper layer's side by tunnel effect, it is preferable that thickness $d_{60}$ of the anti-diffusion layer 214 be equal to or greater than 10 nm ($d_{60} \geq 10$ nm).

Herein, in a case that the n-type conductive layer 213 is made of an n-$Al_yGa_{1-y}N$ layer ($0 \leq y < 1$), it is preferable that the anti-diffusion layer 214 have a bandgap which is greater than the bandgap of the n-type conductive layer 213. That is, as described above, if it is possible to achieve equal to or greater than 300 meV of offset between the n-type conductive layer 213 and the anti-diffusion layer 214, it is possible to restrain an electron from being dispersed. For that purpose, it is preferable that the Al composition ratio x of the anti-diffusion layer 214 be greater than the Al composition ratio y of the n-type conductive layer 213 by equal to or greater than 0.2 ($0 < y+0.2 \leq x \leq 1$). For example, in a case that the n-type conductive layer 213 is made of an n-GaN layer, the anti-diffusion layer 214 is an $Al_xGa_{1-x}N$ layer ($0.2 \leq x \leq 1$). Hereby, it is possible to restrain an electron from being dispersed from the n-type conductive layer 213 to the high resistance buffer layer 215's side at an upper layer's side by making use of band-offset at the hetero junction.

In a case that the n-type conductive layer 213 is made of an n-$Al_zGa_{1-z}N$ layer ($0 \leq z \leq 1$), the anti-diffusion layer 214 may be configured with a p-$Al_zGa_{1-z}N$ layer ($0 \leq z \leq 1$) making homo pn junction with the n-type conductive layer 213 and being doped with p-type impurity. Typically, in a case that the n-type conductive layer 213 is made of an n-GaN layer, it is preferable that the anti-diffusion layer 214 be a p-GaN layer. Herein, for p-type impurity with which the anti-diffusion layer 214 is doped, for example, Mg or the like is used. When doping the anti-diffusion layer 214 with Mg, it is preferable that an Mg concentration be equal to or greater than $1.0 \times 10^{16}$ cm$^{-3}$. Hereby it is possible to achieve equal to or greater than 3 eV, which is greater than 300 meV, of offset to an electron by a dispersing electric potential of pn junction between the n-type conductive layer 213 and the anti-diffusion layer 214. Moreover, in order not to make a cluster defect in the anti-diffusion layer 214, it is preferable that the Mg concentration be smaller than $5.0 \times 10^{19}$ cm$^{-3}$. As described above, it is possible to restrain an electron from being dispersed to the high resistance buffer layer 215's side by making the p-type anti-diffusion layer 214 make homo pn junction with the n-type conductive layer 213.

Moreover, in a case that the n-type conductive layer 213 is made of an n-$Al_yGa_{1-y}N$ layer ($0 \leq y < 1$), it is possible to configure the anti-diffusion layer 214 by a p-$Al_xGa_{1-x}N$ layer ($0 \leq y < x < 1$) having a bandgap which is greater than a bandgap of the n-type conductive layer 213 and being doped with p-type impurity. As described above, it is possible to achieve a greater offset to an electron between the n-type conductive layer 213 and the anti-diffusion layer 214 by forming a single hetero pn junction. In this case as well, in a case of using Mg as p-type impurity, for the above-described reason, it is preferable that Mg element concentration be equal to or greater than $1.0 \times 10^{16}$ cm$^{-3}$ and smaller than $5.0 \times 10^{19}$ cm$^{-3}$.

On the other hand, in a case that the core-formed layer 212 is made of an AlN layer, it is possible that the n-type conductive layer 213 is configured with an n-$Al_yGa_{1-y}N$ layer ($0 < Y < 1$) and the anti-diffusion layer 214 is configured with a p-$Al_xGa_{1-x}N$ layer ($0 \leq X < Y < 1$) of which bandgap is smaller than the bandgap of the n-type conductive layer 213. In this case, since a junction between the n-type conductive layer 213 and the anti-diffusion layer 214 becomes a pn junction, it is possible to restrain an electron from being dispersed from the n-type conductive layer 213 to an upper layer's side.

The high resistance buffer layer 215 provided on the above-described anti-diffusion layer 214 is a highly resistant buffer layer with a predetermined thickness $d_{62}$, and is made of an AlGaN layer, and preferably a GaN layer, which is doped with impurity, for example, C, Fe, ruthenium (Ru) or the like. Herein, it is preferable that the impurity density with which the high resistance buffer layer 215 is doped be equal to or greater than $1 \times 10^{18}$ cm$^{-3}$ and equal to or smaller than $1 \times 10^{20}$ cm$^{-3}$. Various semiconductor layers which will be necessary to configure a nitride semiconductor device may be provided in this high resistance buffer layer 215.

The electron transition layer 216 is made of an undoped GaN layer (u-GaN layer) with a predetermined thickness $d_{61}$. For a material configuring the electron transition layer 216, a material other than GaN may be used, and in a case of using AlGaN, it is preferable that its Al composition ratio be equal to or lower than 5%.

The electron-supplying layer 217 has a pseudo alloy structure of an $Al_xGa_{1-x}N$ with, for example, average Al composition ratio X. To be more specific, the electron-supplying layer 217 is configured with a super-lattice layer in which at least two kinds of GROUP-III nitride compound semiconductors, being different in Al composition ratio and bandgap, by a plurality of layers, preferably equal to or greater than four layers. It is configured that a bandgap of the electron-supplying layer 217 is greater than a bandgap of the electron transition layer 216. Hereby, a two-dimensional electron gas (2DEG) layer a⁻ being used as an electric current path is produced at an interface between the electron transition layer 216 and the electron-supplying layer 217, that is, inside the active layer AL in the device layer DL.

The thickness of the device layer DL configured with the high resistance buffer layer 215, the electron transition layer 216, and the electron-supplying layer 217 is determined in accordance with voltage resistance Vr on a data sheet obtained for various nitride semiconductor devices produced from the semiconductor-layered substrate 210. To be more specific, respective thicknesses $d_{61}$, $d_{62}$ of the electron transition layer 216 and the high resistance buffer layer 215 configuring the device layer DL are determined by a formula (4) below. Herein the formula (4) indicates magnitude of electric field intensity Er between an electrode to which a high voltage is applied and a substrate of an element with voltage resistance Vr in a case that an electric field distribution is uniform at the respective thicknesses $d_{61}$, $d_{62}$ of the electron transition layer 216 and the high resistance buffer layer 215.

$$Er < \frac{Vr}{d_{61} + \frac{\varepsilon_{GaN}}{\varepsilon_{AlGaN}} d_{62}} \quad (4)$$

In the formula (4), $\varepsilon_{GaN}$ is permittivity of GaN ($\varepsilon_{GaN}$=9.5), and $\varepsilon_{AlGaN}$ is permittivity of $Al_vGa_{1-v}N$ with Al composition ratio v ($\varepsilon_{AlGaN}$=9.5 to 0.7 v).

Herein, in formula (4), from a view point of restraining electric current collapse, it is preferable that the thickness $d_{61}$ of the electron transition layer 216 be equal to or greater than 200 nm ($d_1 \geq 200$ nm). From a view point of achieving the voltage resistance Vr, it is preferable that the electric field intensity Er be equal to or smaller than 3.3 MV/cm (Er≤3.3 MV/cm). From a view point of restraining dynamic electric current collapse, it is more preferable that the electric field intensity Er be equal to or smaller than 2.0 MV/cm (Er≤2.0 MV/cm), and further more preferable that the electric field intensity Er be equal to or smaller than 1.5 MV/cm (Er≤1.5 MV/cm). Then, the thickness $d_{62}$ of the high resistance buffer layer 215 is determined based on the limits for these thickness $d_{61}$ and the electric field intensity Er. Since the thickness of the electron-supplying layer 217 is extremely small relative to thickness ($d_{61}+d_{62}$) of the electron transition layer 216 and the high resistance buffer layer 215, the thickness of the device layer DL can be approximated to $d_{61}+d_{62}$. From a view point of requiring reduction in dislocation of the device layer DL, it is preferable that the thickness be equal to or greater than 3 μm ($d_{61}+d_{62} \geq 3$ μm). Moreover, in a case that the voltage resistance Vr of the nitride semiconductor device being required is equal to or greater than 600 V (Vr≥600V), it is preferable that the thickness of the device layer DL be equal to or greater than 4 μm ($d_{61}+d_{62} \geq 4$ μm). Hereby, it is possible to make the electric field intensity Er applied to the semiconductor layer configuring the device layer DL equal to or smaller than 1.5 MV/cm.

The semiconductor layer 218 as the third semiconductor layer is provided at an upper layer of the electron-supplying layer 217 corresponding to the structure of the nitride semiconductor device produced from the semiconductor-layered substrate 210. The semiconductor layer 218 makes the 2DEG concentration of the 2DEG layer a produced in the electron transition layer 216 vary. Therefore, the semiconductor layer 218 is configured with a GROUP-III nitride compound semiconductor of which bandgap is smaller than average bandgap of the electron-supplying layer 217, to be more specific, an $Al_wGa_{1-w}N$ layer with Al composition ratio w ($0 \leq w < 1$), typically, for example, a GaN layer.

As described above, the semiconductor-layered substrate 210 according to Embodiments of the present invention is configured. Hereafter, a nitride semiconductor device produced from the above-described semiconductor-layered substrate 210 will be explained.

Figure 27:
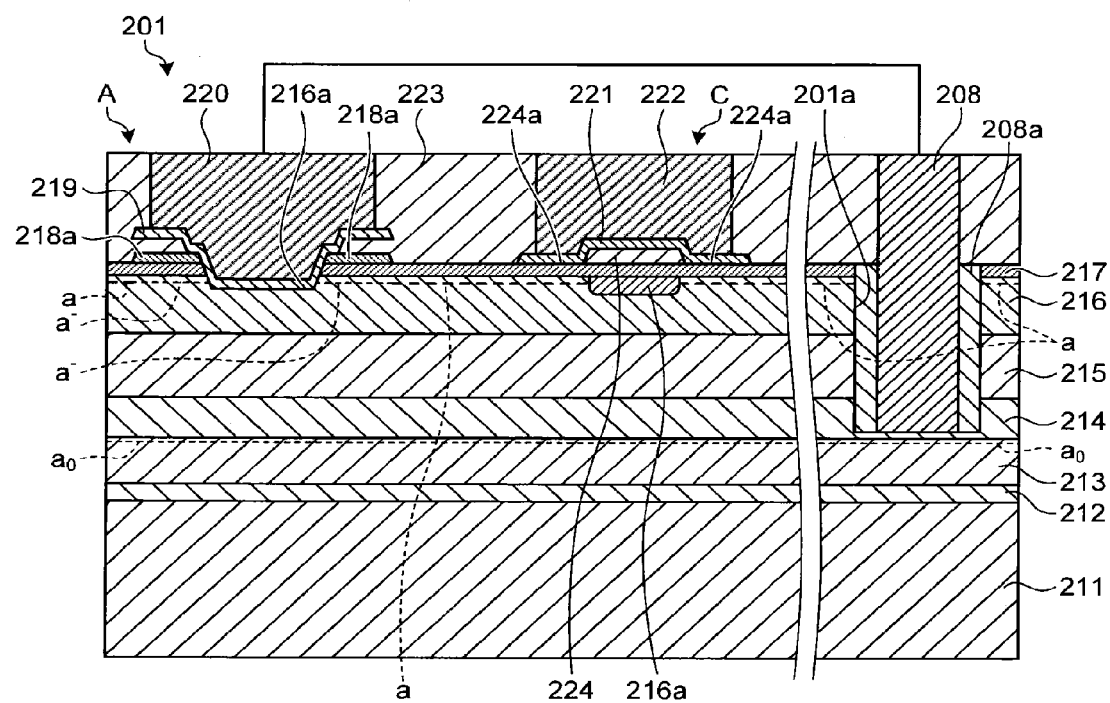
FIG. 27 is a cross-sectional view showing the SBD and a contact structure according to Embodiment 16 of the present invention.

At first, an SBD 201 as a nitride semiconductor device according to Embodiment 16 will be explained. FIG. 27 is a schematic cross-sectional view showing the SBD 201 according to this Embodiment 16.

As shown in FIG. 27, the SBD 201 according to this Embodiment 16 is configured to have, a two-dimensional-electron-gas-controlling layer 218a, an anode electrode 219, an anode wiring 220, a cathode electrode 221, a cathode wiring 222, an insulating film 223, and a dielectric layer 224 similar to those of Embodiment 1 in addition to the structure of the above-described semiconductor-layered substrate 210. A 2DEG-non-produced area 216a in which 2DEG is not produced is formed in a portion of the electron transition layer 216. The dielectric layer 224 is provided in an area covering the 2DEG-non-produced area 216a and separated from the insulating film 223 by the contact portion 224a. The anode electrode 219 is provided to cover upward of the recessed portion 216b reaching the electron-supplying layer 217 and the electron transition layer 216 at lower layers. The anode electrode 219, being produced at an interface between the electron transition layer 216 and the electron-supplying layer 217, makes schottky contact with the 2DEG layer a⁻ being reduced in 2DEG concentration from a side surface. The cathode electrode 221 makes ohmic contact, through the contact portion 224a and via the electron-supplying layer 217, with the 2DEG layer a produced in the electron transition layer 216.

In this SBD 201, since the two-dimensional-electron-gas-controlling layer 218a is provided, the 2DEG concentration of the 2DEG layer a⁻ used for operation of the SBD 201 is lower than the 2DEG concentration in the 2DEG layer a other than the 2DEG layer a⁻. Hereby, electric field concentration is relaxed in a portion in which the two-dimensional-electron-gas-controlling layer 218a is provided, and thus, the electric field intensity Er is reduced. For the reason similar to that of Embodiment 1, it is preferable that the thickness of the two-dimensional-electron-gas-controlling layer 218a, that is, the thickness of the semiconductor layer 218 in the semiconductor-layered substrate 210 be, for example, equal to or greater than 20 nm and equal to or smaller than 200 nm, and more preferably equal to or greater than 20 nm and equal to or smaller than 100 nm, and furthermore preferably equal to or greater than 25 nm and equal to or smaller than 80 nm.

This two-dimensional-electron-gas-controlling layer 218a is formed by using the electron-supplying layer 217 as an etching stop layer being over-etched and by etching the semiconductor layer 218 in the semiconductor-layered substrate 210. An etching sacrifice layer, of which etching selection ratio is extremely low relative to the semiconductor layer 218, may be provided on the electron-supplying layer 217. In this Embodiment 16, the semiconductor stack is configured to include the electron transition layer 216, the electron-supplying layer 217, the two-dimensional-electron-gas-controlling layer 218a, and if necessary, an etching sacrifice layer (not shown in the drawings).

In an upper layer of the Sapphire substrate 211 being identical to that of the SBD 201 configured as described above, a contact hole 201a is formed which penetrates the electron-supplying layer 217, the electron transition layer 216, and the high resistance buffer layer 215 and reaches the anti-diffusion layer 214. Herein, when forming the contact hole 201a, in a case that the anti-diffusion layer 214 is configured with a material of which etching selection ratio is low relative to the high resistance buffer layer 215, an etching depth of the contact hole 201a can be controlled by using this anti-diffusion layer 214 as an etching sacrifice layer. To be more specific, in a case that the electron transition layer 216 and the high resistance buffer layer 215 are made of GaN layers and the anti-diffusion layer 214 is made of an AlGaN layer, since the etching selection ratio of the GaN layer is approximately fifty times the AlGaN layer, it is possible to use the anti-diffusion layer 214 as an etching sacrifice layer preferably. The contact hole 201a may be formed to penetrate the anti-diffusion layer 214 corresponding to the material configuring the anti-diffusion layer 214 to reach the n-type conductive layer 213 at a further lower layer.

A contact insulating film 208a made of, for example, SiO$_2$ or Al$_2$O$_3$ is provided at an inner wall of the contact hole 201a. A contact electrode 208 made of, for example, Ti/Al or the like is provided at inside the contact hole 201a via the contact insulating film 208a. That is, the contact electrode 208 is insulated, by the contact insulating film 208a, from the device layer DL made of the electron-supplying layer 217, the electron transition layer 216, and the high resistance buffer layer 215. In a case that a 2DEG layer $a_0$ is formed at an interface between the n-type conductive layer 213 and the anti-diffusion layer 214, the contact electrode 208 makes ohmic contact with, and is connected electrically to, the 2DEG layer $a_0$ via the anti-diffusion layer 214. That is, in a portion in which the thickness of a portion, being etched, of the anti-diffusion layer 214 decreases, a wave function of an electron seeps from the n-type conductive layer 213, and then connected electrically. On the other hand, in a case that the contact hole 201a is formed to reach the n-type conductive layer 213, regardless of generation of the 2DEG layer $a_0$, the contact electrode 208 is connected with the n-type conductive layer 213 or the 2DEG layer $a_0$ electrically. The contact electrode 208 is connected to, for example, the anode electrode 219 electrically. Herein, an outline of a method of connecting the contact electrode 208 to the anode electrode 219 will be explained below.

That is, a semiconductor device provided with numerous SBDs 201 is provided with an SBD element area, a cathode pad connected to the cathode electrode 221, and an anode pad connected to the anode electrode 219 and grounded (see FIG. 1) on a same substrate. Then, the contact electrode 208 connected to the anode pad is provided in an area in which the anode pad is formed. Hereby, the contact electrode 208 is connected to the anode electrode 219 electrically. As described above, since at least one of the n-type conductive layer 213 and the 2DEG layer $a_0$ shown in FIG. 27 is connected to the anode electrode 219 electrically, it is possible to avoid that the n-type conductive layer 213 and the 2DEG layer $a_0$ are floated. Since a back field plate structure relative to the device layer DL is formed by the n-type conductive layer 213, electric field concentration can be relaxed at the end of anode electrode 219 by dispersing electric field applied in the lamination direction, and since electric field applied to the electron-supplying layer 217 and the electron transition layer 216 immediately beneath the end portion of the anode electrode 219 can be reduced, it is possible to restrain electric current collapse in the SBD 201.

According to the above-described Embodiment 16, since the n-type conductive layer 213 is provided at a lower layer's side of the high resistance buffer layer 215 of the device layer DL, an effect of electric field relaxation by the back field plate structure is obtained. That is, even in a case of using an insulating substrate as a substrate of an nitride semiconductor device, electric current collapse can be reduced. In a case that the anti-diffusion layer 214 is configured with an AlGaN layer, the anti-diffusion layer 214 can be used as an etching sacrifice layer when forming the contact electrode 208, and dislocation in the high resistance buffer layer 215 and the electron transition layer 216 provided at upper layers thereof can be reduced.

By using the Sapphire substrate 211 as the substrate of the nitride semiconductor device, an advantageous effect below can be obtained in comparison to a case of using an Si substrate as a substrate. That is, since it is not necessary to form an AlN layer preventing Si being a substrate material and Ga configuring a semiconductor layer from reacting and to form a thick buffer layer containing Al, it is not necessary to use a great amount of Al material for growing the semiconductor layer. Therefore, it is possible to reduce production of particle and maintenance cost for a production apparatus, and thus, production yield is improved. Since the Sapphire substrate 211 is hard in comparison to the Si substrate, it is possible to reduce process defect such as cracking or the like during a production process. For the thickness of an Al wiring in a high voltage resistant nitride semiconductor device, approximately 3 µm is a limit for a case of using the Si substrate in view of warping of a wafer, but in contrast, greater than 3 µm is possible in a case of using the Sapphire substrate 211. As described above, in the nitride semiconductor device using the Sapphire substrate, wiring width can be decreased since wiring thickness can be increased relatively in comparison to a case of using the Si substrate. Therefore, a drain-source capacity Cds can be reduced, and thus, it is possible to attempt improvement in switching loss. Although, in a case of growing a GaN layer on the Si substrate, the limit of its thickness is approximately 4 µm, in a case of growing the GaN layer on the Sapphire substrate 211, its thickness can be equal to or greater than 5 µm.

Even in a case that the n-type conductive layer 213 is provided as a portion of a buffer layer configuring a nitride semiconductor device, leakage current can be reduced because the contact electrode 208 is provided.

Figure 28:
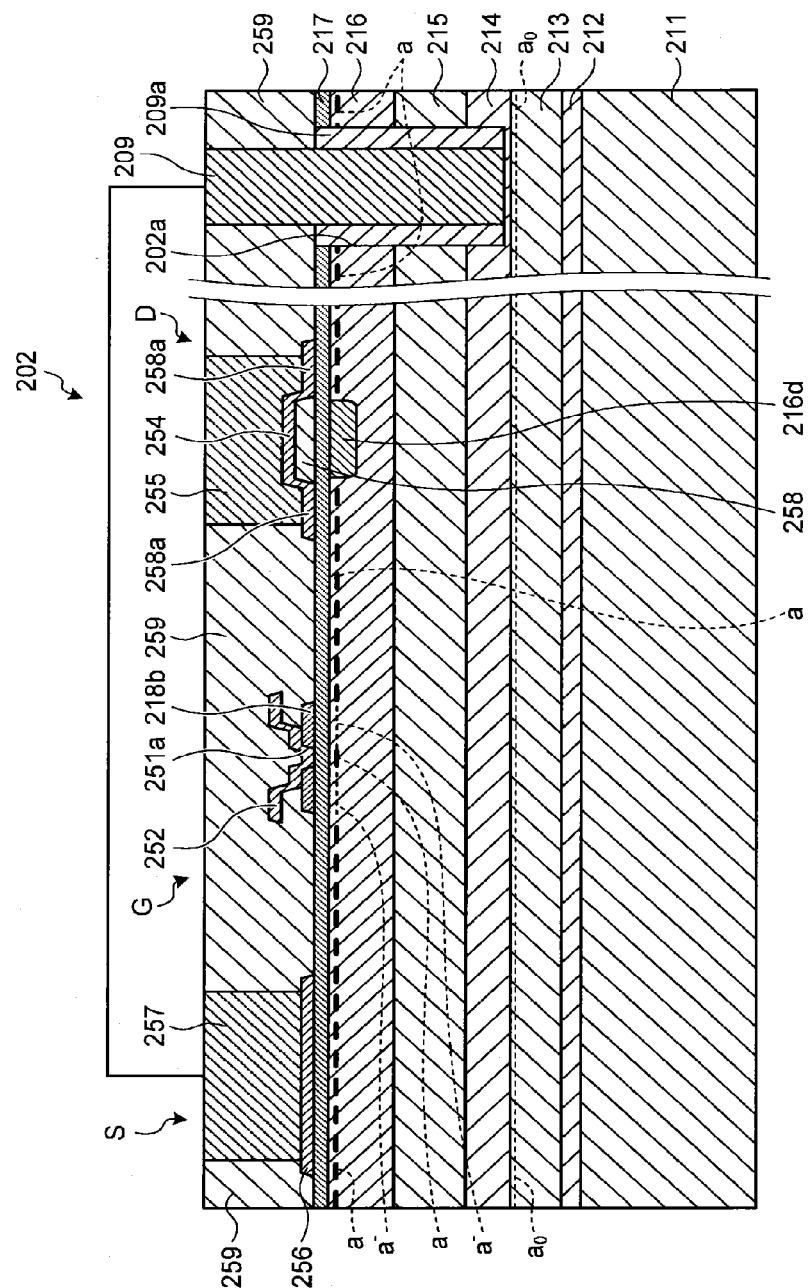
FIG. 28 is a cross-sectional view showing a HEMT and contact structure according to Embodiment 17 of the present invention.

Hereafter, a HEMT-type field effect transistor as a nitride semiconductor device according to Embodiment 17 of the present invention will be explained. FIG. 28 is a schematic cross-sectional view showing a HEMT 202 according to this Embodiment 17.

As shown in FIG. 28, the HEMT 202 according to Embodiment 17 has the structure of the semiconductor-layered substrate 210 according to the above-described embodiments. A two-dimensional-electron-gas-controlling layer 218b made of a portion of the semiconductor layer 218, a gate electrode 252, a drain electrode 254 and a drain wiring 255, a source electrode 256 and a source wiring 257, a dielectric layer 258, and an insulating film 259 similar to those of Embodiment 5 are provided on an upper layer of the semiconductor-layered substrate 210. A 2DEG-non-produced area 216d in which 2DEG is not produced is formed in a portion of the electron transition layer 216. The dielectric layer 258 is provided in an area covering the 2DEG-non-produced area 216d and is separated from the insulating film 259 by the contact portion 258a.

A contact hole 202a similar to the contact hole 201a of Embodiment 16 is formed in a portion of an upper layer of the Sapphire substrate 211 that is identical to the HEMT 202 configured as above described. A contact insulating film 209a is provided at an inner wall of the contact hole 202a, and a contact electrode 209 is provided inside thereof. Explanations for the contact hole 202a, the contact electrode 209, and the contact insulating film 209a, which are similar to those in Embodiment 16, will be omitted.

The contact electrode 209 is connected to, for example, the source electrode 256 electrically. Herein, a method of connecting the contact electrode 209 to the source electrode 256 will be explained below.

That is, a semiconductor device provided with numerous HEMTs 202 is provided with an FET element area in which the HEMT 202 is disposed, a drain pad connected to the drain electrode 254, a source pad connected to the source electrode 256, and a gate pad connected to the gate electrode 252 on a same substrate (see FIG. 10). By providing the contact electrode 209 connected to the source pad in the area, in which the source pad among these is formed, the contact electrode 209 is connected to the source electrode 256 electrically via the source pad. Hereby, as shown in FIG. 28, at least one of the n-type conductive layer 213 and the 2DEG layer $a_0$ and the source electrode 256 are connected electrically through the contact electrode 209. Therefore, by making the source electrode 256 and the source pad be grounded, it is possible to avoid the n-type conductive layer 213 and the 2DEG layer $a_0$ from being floated. Therefore, it is possible to restrain electric current collapse in the HEMT 202.

In the above-described Embodiment 17, since it is possible to obtain an effect similar to that of Embodiment 16 and the Sapphire substrate 211 is used for a substrate, dislocation density of the GaN layer or the AlGaN layer configuring the electron transition layer 216 and the high resistance buffer layer 215 is decreased by approximately one digit in comparison to a case of growing the GaN layer and the AlGaN layer on the Si substrate. Hereby, it is possible to increase mobility of an electron in the 2DEG layers a, a$^-$, and thus improve switching characteristics of the HEMT 202.

Figure 29:
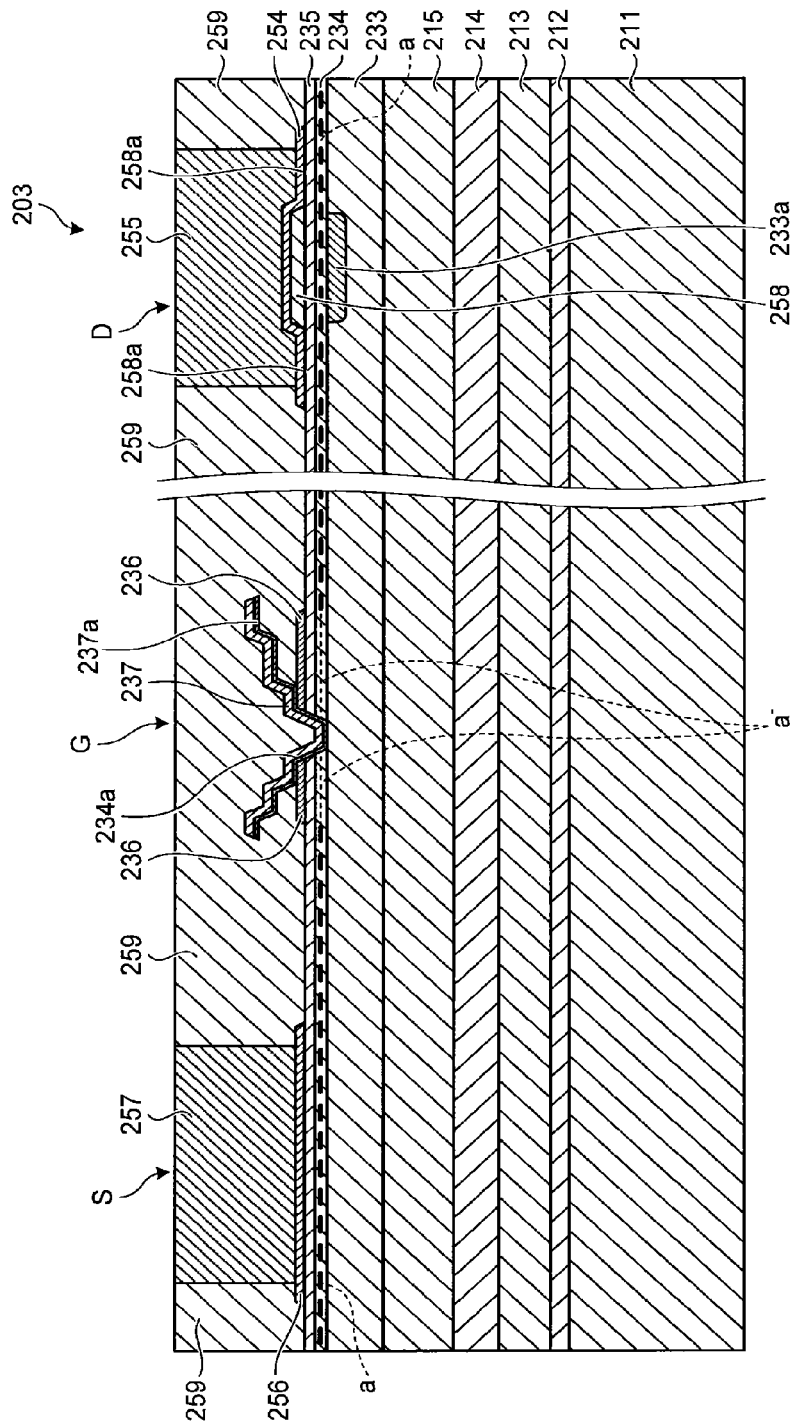
FIG. 29 is a cross-sectional view showing a MIS-HEMT according to Embodiment 18 of the present invention.

Hereafter, a Metal Insulator Semiconductor (MIS-HEMT) as a nitride semiconductor device according to Embodiment 18 of the present invention will be explained. FIG. 29 is a schematic cross-sectional view showing an MIS-HEMT 203 as the nitride semiconductor device according to this Embodiment 18.

As shown in FIG. 29, in the MIS-HEMT 203 according to Embodiment 18, a p-type channel layer 233, an electron transition layer 234, an electron-supplying layer 235, and a two-dimensional-electron-gas-controlling layer 236 are provided and layered in this order on the high resistance buffer layer 215 of the semiconductor-layered substrate 210 according to Embodiments. The electron transition layer 234, the electron-supplying layer 235, and the two-dimensional-electron-gas-controlling layer 236 have configurations that are similar to those of the electron transition layer 216, the electron-supplying layer 217, and the two-dimensional-electron-gas-controlling layer 218b in Embodiment 17 respectively. The two-dimensional-electron-gas-controlling layer 236 serves as an electric field relaxation layer relaxing electric field concentration of each semiconductor layer configuring the MIS-HEMT 203. A 2DEG-non-produced area 233a in which 2DEG is not produced is formed in a portion of the electron transition layer 233. The dielectric layer 258 is provided in an area covering the 2DEG-non-produced area 233a and separated from the insulating film 259 by the contact portion 258a.

The p-type channel layer 233 is configured with a p-GaN layer as a GaN layer being doped with p-type impurity, for example, Mg or the like. The p-type channel layer 233 may be configured with a p-AlGaN layer being doped with p-type impurity and being equal to or smaller than 5% in Al composition ratio. It is preferable that the thickness of this p-type channel layer 233 be equal to or greater than 200 nm. Hereby it is possible to obtain equal to or greater than 200 nm of distance between the high resistance buffer layer 215 and the gate electrode 237 including impurity such as carbon (C) or the like. The device layer DL is configured with this p-type channel layer 233, the electron transition layer 234, and the electron-supplying layer 235. For reasons similar to the above-described reason, it is preferable that the thickness of this device layer DL be equal to or greater than 4 µm. The semiconductor stack according to Embodiment 18 is configured with these device layer DL and two-dimensional-electron-gas-controlling layer 236.

The source S configured with the source electrode 256 and the source wiring 257 and the drain D configured with the drain electrode 254 and the drain wiring 255 have configurations similar to the source S and the drain D according to Embodiment 17 respectively. A recessed portion 234a being formed in depth reaching the p-type channel layer 233 is provided in an area, in which a gate is formed between the source electrode 256 and the drain electrode 254. The gate electrode 237 as the third electrode is provided on this recessed portion 234a via the gate insulating film 237a. The gate electrode 237 has a field plate portion which is stranded on the two-dimensional-electron-gas-controlling layer 236 toward both sides of the source electrode 256 and the drain electrode 254 and extends in a multi-step shape, for example, in two steps to the insulating film 259.

Herein, the gate electrode 237 is configured with metal material of which work function is equal to or greater than 4.5 eV, more specifically, for example, titanium nitride (TiN). The gate insulating film 237a at a lower layer of the gate electrode 237 is configured with at least one layer of, and preferably a plurality of insulating films made of oxide films or the like. The lower-most layer configuring the gate insulating film 237a and being among the plurality of insulating films is configured with insulating material containing Al and made of, to be more specific, for example, an $Al_2O_3$ layer or an AlN layer. An insulating film at an upper layer of the lower-most layer is configured with insulating material containing Si, to be more specific, for example, an $SiO_2$ layer or an SiN layer. Hereby the insulating film containing Al at the lower-most layer of the gate insulating film 237a becomes a reaction barrier between Si contained in the insulating film at an upper layer's side and Ga contained in the p-type channel layer 233 to prevent reaction of Si and Ga, and thus, a defect is restrained from being produced.

Although being omitted in the drawings, a contact hole, a contact insulating film, and a contact electrode connected to the source electrode 256 or the source wiring 257 similar to those of Embodiment 17 are provided in a portion of an upper layer of the Sapphire substrate 211 which is identical to the MIS-HEMT 203 configured as described above.

In the MIS-HEMT 203 configured as described above, the electron-supplying layer 235 is not provided in an area immediately beneath the gate electrode 237 in the p-type channel layer 233. Therefore, the 2DEG layers a, a⁻ are produced at an interface between the electron transition layer 234 and the electron-supplying layer 235, but by contrast, the 2DEG layers a, a⁻ are not produced immediately beneath the gate electrode 237. By applying equal to or greater than threshold voltage Vth of positive voltage to the gate electrode 237 in this state, a inversion layer (not shown in the drawing) becoming an electron layer is formed in the p-type channel layer 233 immediately beneath the gate electrode 237. This inversion layer is coupled with the 2DEG layer a⁻ produced around the recessed portion 234a of the gate electrode 237, and a drain current flows. Hereby, a normally-off MIS-type field-effect transistor is operated while making use of 2DEG.

Herein, according to an insight obtained from experiments by the inventors, if the concentration of Mg as p-type impurity is equal to or greater than $1.0 \times 10^{17}$ cm$^{-3}$ in a portion of the 2DEG layer a in the electron transition layer 234, a phenomenon occurs that the 2DEG concentration decreases to a large degree in the 2DEG layer a. As the concentration not decreasing the 2DEG concentration, it is preferable that Mg element concentration in an area of the 2DEG layer a be equal to or smaller than $1.0 \times 10^{17}$ cm$^{-3}$. In order to achieve this Mg element concentration, it is desirable that the Mg element concentration in the p-type channel layer 233 at its lower layer be equal to or smaller than $1.0 \times 10^{18}$ cm$^{-3}$. Detail of experiments conducted by the inventors will be explained later.

Moreover, the inventors conducted keen examination regarding the gate electrode 237, the gate insulating film 237a, and the p-type channel layer 233 in the MIS-HEMT 203. This keen examination will be explained below.

At first, in a case of configuring the gate insulating film 237a by at least two insulating films including an insulating film containing Al such as, for example, $Al_2O_3$ or the like as the lower-most layer, and an insulating film containing Si, for example, $SiO_2$ or the like is at an upper layer's side, the inventors measured threshold voltage Vth of the gate electrode 237 by varying the thickness of the lower-most layer. As a result, it was found that the threshold voltage Vth increases along with an increase in the thickness of the lower-most layer of the gate insulating film 237a. Moreover, it was found that it was possible to make the threshold voltage Vth of the gate electrode 237 be positive voltage if the thickness at the upper layer's side of the gate insulating film 237a is made equal to or greater than a predetermined thickness and the thickness of the insulating film at the lower-most layer is made equal to or greater than 3 nm. In other words, by configuring the gate insulating film 237a by at least two insulating films, the threshold voltage Vth depends on the total thickness of the gate insulating film 237a. Based on that, since it is possible to make the threshold voltage Vth of the gate electrode 237 be positive voltage by making the thickness of the gate insulating film 237a equal to or greater than a predetermined thickness, a normally-off operation can be achieved in the MIS-HEMT 203. That is, in a case that the thickness of the insulating film containing Al at the lower-most layer of the gate insulating film 237a is small, or in a case that any insulating film containing Al does not exist, a stable normally-off operation cannot be achieved in the MIS-HEMT 203.

If the thickness of the gate insulating film 237a is smaller than a predetermined thickness, not only an electric field applied to the gate insulating film 237a when the gate voltage is increased increases, but also a normally-off operation cannot be achieved. Therefore, in order to control the threshold voltage Vth at equal to or greater than 2 V, as the threshold voltage Vth, of the gate electrode 237, being capable of conducting normally-off operation stably, it is preferable that the thickness of the gate insulating film 237a be equal to or greater than 30 nm when being converted to $SiO_2$ layer. Herein, the thickness of the gate insulating film 237a converted to $SiO_2$ layer is, (thickness of the gate insulating film 237a)×((permittivity of $SiO_2$ layer)/(permittivity of gate insulating film 237a)).

Based on the above-described examination, the inventors conducted further examination for the threshold voltage Vth of the gate electrode 237 assuming that the gate insulating film 237a is equal to or greater than a predetermined thickness capable of normally-off operation. That is, the inventors measured variation in the threshold voltage Vth in the gate electrode 237 in a case that the p-type channel layer 233 is configured with GaN or Si, and acceptor concentration Na of activated acceptor (hole) is varied.

As a result, it was found that the threshold voltage Vth increased monotonously along with increase in the acceptor concentration Na. That is, if the acceptor concentration Na is equal to or greater than $1.0 \times 10^{15}$ cm$^{-3}$, the threshold voltage Vth can be controlled by varying the acceptor concentration Na. As described above, the threshold voltage Vth increases and decreases along with increase and decrease in the thickness of the gate insulating film 237a, particularly the thickness of the insulating film containing Al at the lower-most layer.

Also, it was found that the threshold voltage Vth of the gate electrode 237 is great in a case of configuring the p-type channel layer 233 by GaN in comparison to a case that the p-type channel layer 233 is configured with Si. To be more specific, if the p-type channel layer 233 is configured with Si, acceptor concentration must be approximately $7.0 \times 10^{17}$ cm$^{-3}$ for making the threshold voltage Vth approximately 3 V. On the other hand, if the p-type channel layer 233 is configured with GaN, the threshold voltage Vth can be approximately 3 V even if acceptor concentration is equal to or greater than $1.0 \times 10^{15}$ cm$^{-3}$. That is, in GaN of which bandgap is great in comparison to that of Si, the threshold voltage Vth of an inversion layer immediately beneath the above-described gate electrode 237 can be increased easily. According to an insight of the inventors, it is extremely difficult to make acceptor concentration smaller than $1.0 \times 10^{15}$ cm$^{-3}$ in production of a semiconductor layer. Therefore, in a case that the p-type channel layer 233 is configured with a p-GaN layer, acceptor concentration Na may be equal to or greater than $1.0 \times 10^{-15}$ cm$^{-3}$ which is achievable in production. In this case, element concentration of Mg as p-type impurity is equal to or greater than $3.0 \times 10^{15}$ cm$^{-3}$.

Moreover, the inventors conducted various examinations in a case that the p-type channel layer 233 is configured with a p-GaN layer and Mg was used as doping p-type impurity. As a result, it was found that an effective acceptor concentration increases monotonously along with increase in doping amount (Mg element concentration) of Mg. Also, it was found as well that activation rate is approximately 30% in a case that Mg element concentration is $1.0 \times 10^{17}$ cm$^{-3}$, and by contrast, the activation rate decreases to approximately 1% if Mg element concentration is increased to $1.0\times10^{19}$ cm$^{-3}$. This is considered because Mg element doping with the GaN layer produces a defect.

To address this, the inventors conducted examination for a case in which the GaN layer is doped with Mg as p-type impurity. Then, it was found that, in a case of growing the electron transition layer 234 made of an undoped GaN layer on the p-type channel layer 233, a profile is obtained in which acceptor concentration Na (Mg element concentration) decreases gradually from the p-type channel layer 233 toward the surface of the electron transition layer 234. As characteristics, Mg element tends to be segregated on a surface of a semiconductor layer, when Mg element concentration of the p-type channel layer 233 is increased, Mg element concentration is linked to be increased in the electron transition layer 234. On the other hand, if Mg element in high concentration equal to or greater than $1.0\times10^{17}$ cm$^{-3}$ exists in an area, in which the 2DEG layers a, a$^-$ of the electron transition layer 234 made of undoped GaN layer are formed, a phenomenon occurs that 2DEG concentrations of the 2DEG layers a, a$^-$ decrease. Therefore, the Mg element concentration of the electron transition layer 234 is controlled at equal to or smaller than $1.0\times10^{17}$ cm$^{-3}$ by making the Mg element concentration of the p-type channel layer 233 equal to or smaller than $1.0\times10^{18}$ cm$^{-3}$ to restrain the 2DEG concentration from being decreased in the 2DEG layers a, a$^-$. Hereby it is possible to restrain switching characteristics in the MIS-HEMT 203 from being reduced.

By the MIS-HEMT 203 according to Embodiment 18 configured as described above, it is possible to achieve an effect similar to those of Embodiments 16, 17 and obtain a normally-off-type field effect transistor conducting normally-off operation stably.

Figure 30:
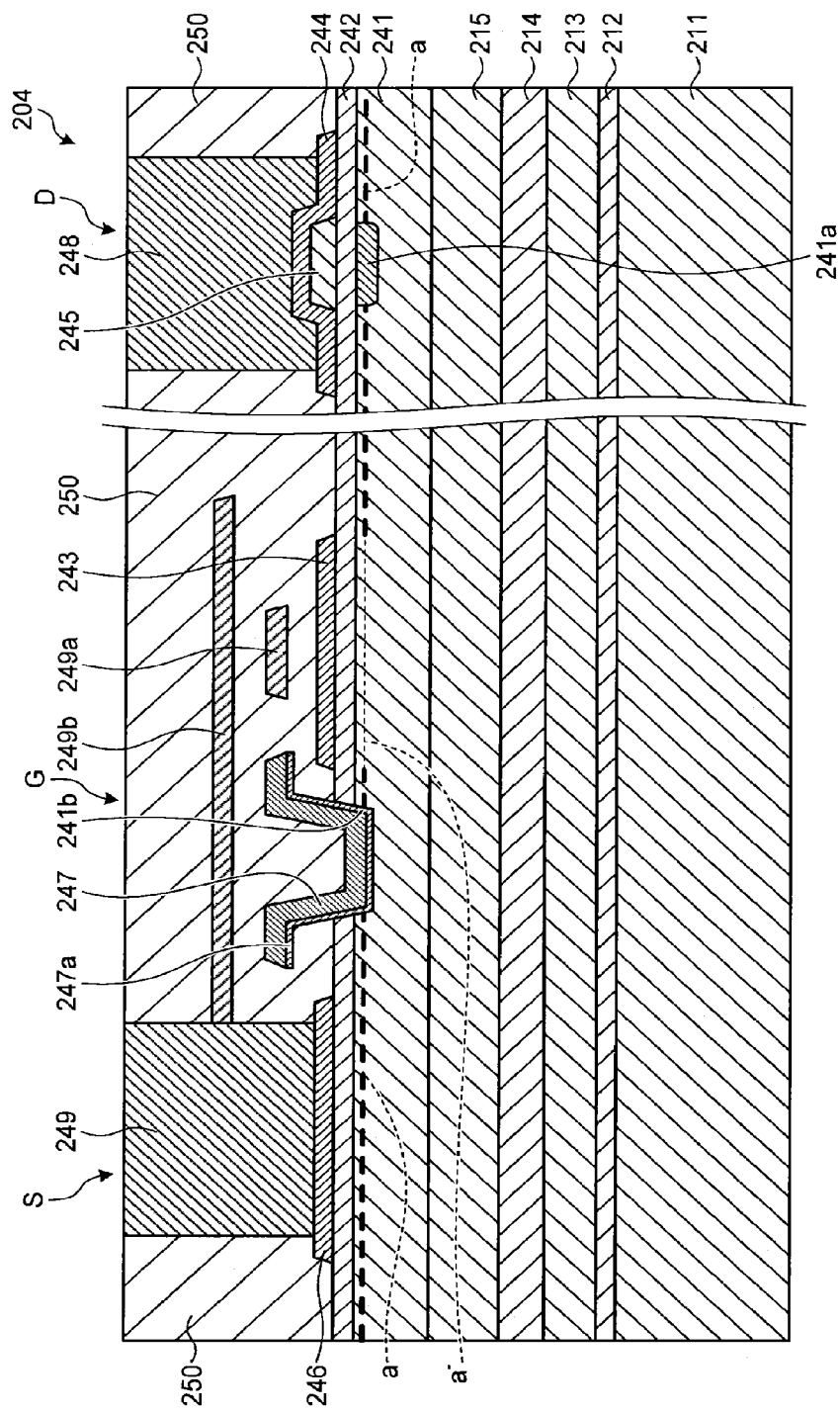
FIG. 30 is a cross-sectional view showing a MOS-HEMT according to Embodiment 19 of the present invention.

Hereafter, an MOS-HEMT as a nitride semiconductor device according to Embodiment 19 of the present invention will be explained. FIG. 30 is a schematic cross-sectional view showing a MOS-HEMT 204 as a nitride semiconductor device according to this Embodiment 19.

As shown in FIG. 30, in the MOS-HEMT 204 according to Embodiment 19, an electron transition layer 241, an electron-supplying layer 242, and a two-dimensional-electron-gas-controlling layer 243 are layered on the high resistance buffer layer 215 in the above-described semiconductor-layered substrate 210 in this order. The electron transition layer 241, the electron-supplying layer 242, and the two-dimensional-electron-gas-controlling layer 243 have configurations similar to those of the electron transition layer 216, the electron-supplying layer 217, and the two-dimensional-electron-gas-controlling layer 218b in Embodiment 17 respectively. The two-dimensional-electron-gas-controlling layer 243 serves as an electric field relaxation layer for relaxing electric field intensity in each semiconductor layer configuring the MOS-HEMT 204. In this Embodiment 19, a semiconductor stack is configured with these electron transition layer 241, electron-supplying layer 242, and two-dimensional-electron-gas-controlling layer 243.

The drain D configured with the drain electrode 244 and the drain wiring 248 has a configuration similar to that of the drain D in Embodiment 17. Similarly, the dielectric layer 245 and the 2DEG-non-produced area 241a have configurations similar to those of the dielectric layer 258 and the 2DEG-non-produced area 216a in Embodiment 17 respectively.

The source electrode 246 is provided separately from the drain electrode 244 on the electron-supplying layer 242 selectively. The source electrode 246 as the first electrode has a layered structure made of, for example, Ti/Al. Hereby, the source electrode 246 makes ohmic contact with the 2DEG layer a produced in the electron transition layer 241 via the electron-supplying layer 242. The source wiring 249 connected to the source electrode 246 electrically is provided on the source electrode 246, and the source S of the MOS-HEMT 204 is configured with the source electrode 246 and the source wiring 249.

A recessed portion 241b formed to be in depth reaching the electron transition layer 241 is provided in an area, in which a gate between the source electrode 246 and the drain electrode 244 is formed. The gate electrode 247 is provided on this recessed portion 241b via a gate insulating film 247a such as, for example, gate oxide film or the like. The gate electrode 247 has a multi-stage field plate portion (GFP portion) extending to both sides at the source electrode 246's side and the drain electrode 244's side while being stranded on the insulating film 250 in a step shape. The gate electrode 247 is made of, for example, TiN. The gate insulating film 247a at a lower layer is made of an oxide film such as, for example, SiO$_2$ layer and Al$_2$O$_3$ layer or the like or an Al$_2$O$_3$/SiO$_2$ layered film. Hereby, the gate electrode 247 is configured to be capable of controlling the 2DEG layer a produced in the electron transition layer 241 via the gate insulating film 247a and the electron-supplying layer 242.

The end portion, at the gate electrode 247's side, of the two-dimensional-electron-gas-controlling layer 243 is positioned at a lower layer of the GFP portion of the gate electrode 247 via a portion of the insulating film 250. Although the GFP portion of the gate electrode 247 may be stranded so that the gate insulating film 247a contacts the two-dimensional-electron-gas-controlling layer 243, from a view point of restraining fluctuation in threshold voltage of the gate electrode 247, it is preferable that the insulating film 250 be interposed between the gate electrode 247 and the two-dimensional-electron-gas-controlling layer 243.

A first source field plate layer (first SFP layer) 249a is formed at an upper layer of the two-dimensional-electron-gas-controlling layer 243 in a form of a plane which is in parallel with, and via, the insulating film 250. The first SFP layer 249a is conducted to be an electric potential identical to that of the source electrode 246 or the gate electrode 247. The source wiring 249 is further provided with a second source field plate layer (second SFP layer) 249b. This second SFP layer 249b is provided at an upper layer of the first SFP layer 249a and the gate electrode 247 via the insulating film 250. The end portion, at the drain electrode 244's side, of the two-dimensional-electron-gas-controlling layer 243 is positioned at a lower layer of the second SFP layer 249b via the insulating film 250.

Although not shown in the drawings, a contact hole, a contact insulating film, and a contact electrode similar to those in Embodiment 17 are provided in a portion at an upper layer of the Sapphire substrate 211 that is identical to the MOS-HEMT 204 configured as described above. This contact electrode is connected to the source electrode 246 or the source wiring 249 electrically.

According to the MOS-HEMT 204 according to Embodiment 19 configured as described above, an effect similar to those of Embodiments 16 to 18 can be obtained.

Figure 31:
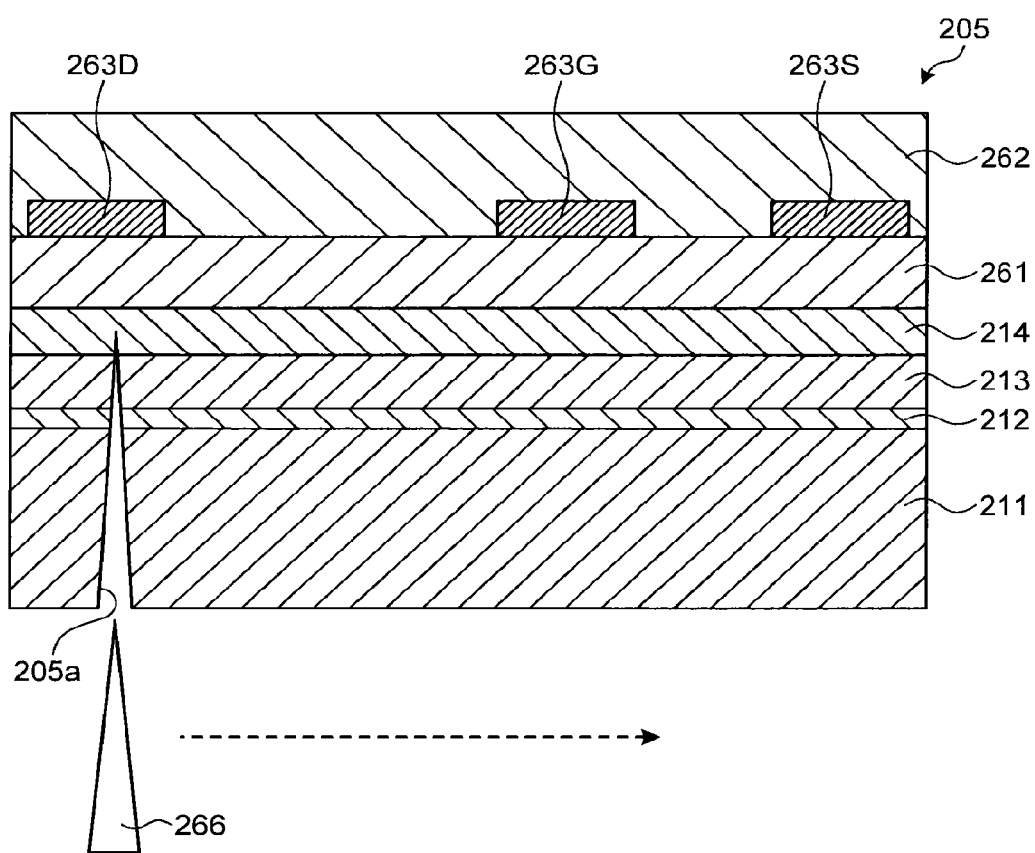
FIG. 31 is a schematic diagrammatic view of a nitride semiconductor device and a laser beam working machine for explaining a method of forming a embedding hole to a Sapphire substrate according to Embodiment 20 of the present invention.
Figure 32:
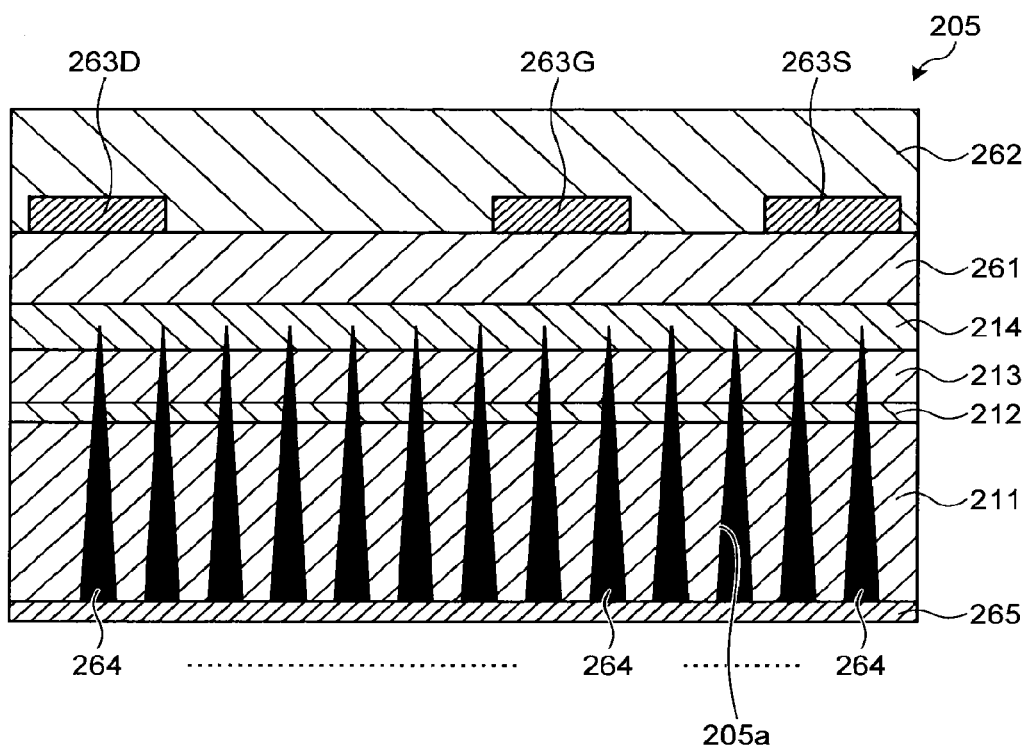
FIG. 32 is a schematic diagrammatic view showing a nitride semiconductor device and a laser beam working machine for explaining a method of forming a radiation portion in a Sapphire substrate of Embodiment 20 of the present invention.
Figure 33:
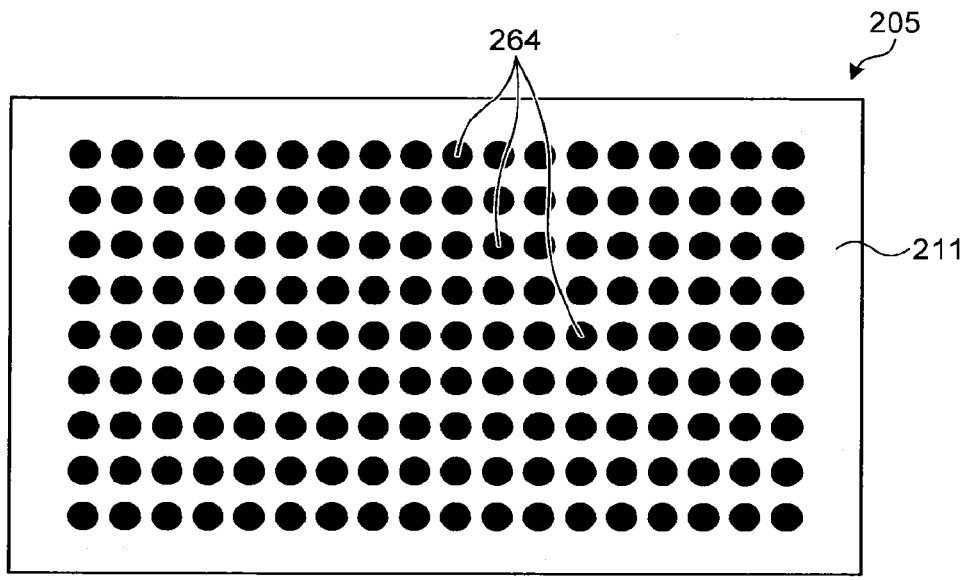
FIG. 33 is a plan view, viewed from the Sapphire substrate's side, of an example of a pattern of the radiation portion produced in Embodiment 20 of the present invention.
Figure 34:
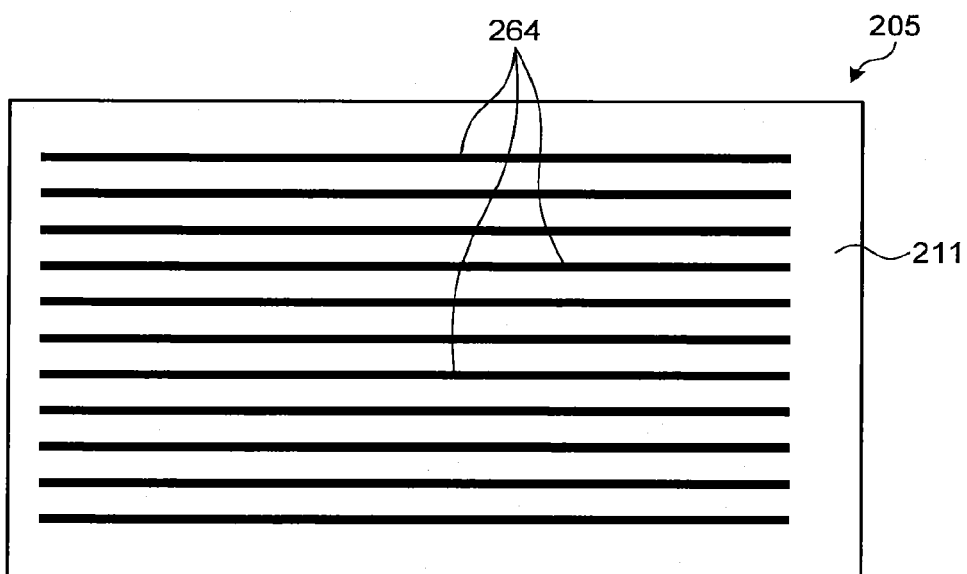
FIG. 34 is a plan view, viewed from the Sapphire substrate's side, of another example of the pattern of the radiation portion manufactured in Embodiment 20 of the present invention.

Hereafter, a production method of a nitride semiconductor device according to Embodiment 20 of the present invention will be explained. FIG. 31 is a schematic diagrammatic view for explaining this production method of a nitride semiconductor device, and FIG. 32 is a cross-sectional view showing a nitride semiconductor device produced by this production method. FIGS. 33 and 34 are plan views, viewed from a substrate's side, of the nitride semiconductor device.

Problems found by the inventors in the nitride semiconductor device using a substrate such as a Sapphire substrate or the like will be explained. That is, in a case of producing a nitride semiconductor element by using a substrate such as a Sapphire substrate 211 or the like, there was a problem that heat dissipation of the Sapphire substrate 211 was low in comparison to the Si substrate. This is caused by the thermal conductivity of Sapphire being ⅓ relative to thermal conductivity of Si.

In order to improve the problem of heat dissipation of the Sapphire substrate 211 as such, making the Sapphire substrate 211 thin is considered. To be more specific, in order to obtain heat dissipation similar to that of an Si substrate of which thickness of a wafer is 100 µm, a method is considered in which the thickness of a wafer of the Sapphire substrate 211 is made approximately ⅓ of the Si substrate, that is, approximately 30 µm. However, there was possibility that, if the thickness of the wafer was decreased, handling capability in a production step for a semiconductor device is worsened, and thus a problem of chipping or the like occurred in subsequent steps.

To address this, the inventors conducted keen examinations for making both improvement in heat dissipation in the Sapphire substrate 211 and conservation of handling capability possible. Then, the inventors thought a method of forming a embedding hole in a back surface, at a side opposite to a side on which semiconductor is layered by ablation against a grinded Sapphire substrate 211, and then embedding a material, such as metal or the like, of which thermal conductivity is high into this embedding hole.

That is, as shown in FIG. 31, a nitride semiconductor device 205 is assumed in which, a core-formed layer 212, an n-type conductive layer 213, and a anti-diffusion layer 214 are layered in this order on the Sapphire substrate 211, and on this upper layer, a device layer 261, a source electrode 263S, a gate electrode 263G and a drain electrode 263D, and an insulating film 262 are further provided in this order. Then a laser light 266 is irradiated from a laser beam working machine to a back surface's side of the Sapphire substrate 211 in this nitride semiconductor device 205 to conduct laser ablation. For a laser beam working machine, an apparatus, for example, a femtosecond laser oscillator or the like can be used which is capable of emitting a ultrashort pulsed-laser of which pulse width is between sub-pico second and several tens of femtoseconds. Hereby, laser ablation can be conducted in high speed to the Sapphire substrate 211 and each layered semiconductor layer, and a embedding hole 205a as a substrate contact hole can be formed with good controllability. Moreover, since the embedding hole 205a, as a non-through hole of which depth is controlled, can be formed by adjusting a light-condensing-point's diameter of the laser light 266 in the laser beam working machine, the embedding hole 205a can be formed without damaging the device layer 261 at the surface's side.

After that, and after evaporating a metal film such as Cu or the like on the formed embedding hole 205a by for example, spattering method as shown in FIG. 32, a metal such as Cu or the like is buried inside the embedding hole 205a by, for example, plating method. Hereby, a radiation portion 264 made of metal is formed in a portion of the embedding hole 205a of the Sapphire substrate 211. The radiation portion 264 being configured with metal has conductivity and is high in thermal conductivity. Therefore, since heat conducted from a semiconductor layer layered on the Sapphire substrate 211 is radiated to outside through mainly the radiation portion 264, the heat dissipation of the Sapphire substrate 211 can be improved. By adhering the back surface of this Sapphire substrate 211 to the conductive plate 265 made of, for example, a copper plate or the like, with solder or the like, heat produced when operating the nitride semiconductor device 205 is conducted can be radiated thermally to the conductive plate 265's side through the radiation portion 264 and then radiated to outside.

Moreover, as shown in FIG. 32, since the embedding hole 205a reaching the anti-diffusion layer 214 can be formed by adjusting a light-condensing-point's diameter of the laser light 266 radiated from the laser beam working machine, it is possible to connect the radiation portion 264 to the n-type conductive layer 213 and the anti-diffusion layer 214 electrically. Even if the embedding hole 205a reaching the n-type conductive layer 213 is formed by adjusting a light-condensing-point's diameter of the laser light 266 radiated from the laser beam working machine, the radiation portion 264 can be connected to the n-type conductive layer 213 electrically. In a case that this back surface of the Sapphire substrate 211 is adhered to the conductive plate 265, the n-type conductive layer 213 or the 2DEG layer (not shown in FIG. 32) can be connected to outside electrically through this conductive plate 265, a so-called back contact having a function similar to the contact electrode in Embodiments 16 to 19 can be achieved. Hereby, it is possible to avoid float of the n-type conductive layer 213 or the 2DEG layer, and thus, it is possible to restrain electric current collapse and decrease leakage current similarly to Embodiments 16 to 19.

For a planar shape pattern for the embedding hole 205a and the radiation portion 264 being formed by laser ablation according to this Embodiment 20, an arrayed-shape shown in FIG. 33 and a parallel-line shape shown in FIG. 34 are possible, and a latticed shape may be also possible.

According to the above-described production method of the semiconductor device according to Embodiment 20, since heat can be easily radiated through a metal of which thermal conductivity is high in comparison to an insulating substrate by forming the embedding hole 205a in a portion of the back surface of the Sapphire substrate 211 and embedding a metal in the embedding hole 205a to provide the radiation portion 264, heat dissipation can be improved in the nitride semiconductor device 205. Since this radiation portion 264 can be used as a back contact electrode by making the embedding hole 205a reach the n-type conductive layer 213 and connect the embedding hole 205a electrically, it is possible to make the n-type conductive layer 213 be grounded via the Sapphire substrate 211 and be connected to an external electrode.

According to the nitride semiconductor device according to the above-described Embodiments 16 to 20, even in a case of using an insulating substrate as a substrate, it is possible to restrain electric current collapse and restrain leakage current.

Although embodiments of the present invention have been explained specifically, the present invention is not limited to the above-described embodiments, and various modifications are possible based on technical idea of the present invention. For example, numbers described in the above-described embodiments are mere examples, numbers which are other than the above-described numbers may be used if necessary. The present invention is not limited by the above-described embodiments. The present invention also includes a configuration combining the above-described elements appropriately. Further effects or modifications can be derived by those skilled in the art easily.

In the above-described embodiments, the electron-supplying layer is configured with $Al_xGa_yIn_zN$ ($0 \leq x,y,z \leq 1$, $x+y+z=1$), and the electron transition layer and the two-dimensional-electron-gas-controlling layer are configured with GaN. However, materials for configuring these layers are not limited to the above-described materials. That is, the electron-supplying layer may be configured with a GROUP-III nitride compound semiconductor of which bandgap is broader than that of the electron transition layer. The two-dimensional-electron-gas-controlling layer may be configured with a GROUP-III nitride compound semiconductor of which bandgap is narrower than that of the electron-supplying layer. Herein, the GROUP-III nitride compound semiconductor is indicated by a chemical formula of $Al_xIn_yGa_{1-x-y}As_uP_vN_{1-u-v}$ (where $0 \leq x \leq 1$, $0 \leq y \leq 1$, $x+y \leq 1$, $0 \leq u < 1$, $0 \leq v < 1$, and $0 \leq u+v < 1$).

For example, in the above-described embodiments, although a configuration of providing the etching sacrifice layer 91 on an upper layer of the electron-supplying layer 14 is explained, the upper-most layer of the electron-supplying layer 14 can be used as an etching sacrifice layer made of an $Al_xGa_{1-x}N$ layer of which Al composition ratio x is greater than an average Al composition ratio X. This $Al_xGa_{1-x}N$ layer of the upper-most layer serves as an etching sacrifice layer for preventing the electron-supplying layer 14 from being over-etched when etching the field plate layer or the like formed on a further upper layer. For serving as such, it is preferable that the thickness of the $Al_xGa_{1-x}N$ layer at the upper-most layer of the electron-supplying layer 14 be equal to or greater than 1 nm. In order to make the $Al_xGa_{1-x}N$ layer a portion of the electron-supplying layer 14 of the AlGaN super-lattice layer, it is preferable that the thickness thereof be equal to or smaller than 10 nm. In order to make oxidation not problematic in a case of exposing at the upper-most layer when being etched as an etching sacrifice layer, it is preferable that Al composition ratio x be $0 < x \leq 0.35$.

It is possible to adopt various pseudo alloy structures, other than the above-described embodiments, belonging to the scope of the present invention to an electron-supplying layer in accordance with structural design based on desirable characteristics for a semiconductor device.

Lower electrode layers of the anode electrode of a diode and the gate electrode of a transistor are electrodes making schottky contact with the electron-supplying layer 14. Therefore, various metal material, other than the above-described Ti, satisfying the above-described conditions may be used such as a metal film containing at least one of a metal film containing at least one of, for example, nickel (Ni), platinum (Pt), palladium (Pd), tungsten (W), Au, argent (Ag), copper (Cu), tantalum (Ta), and aluminum (Al), or a metal film made of alloy containing at least one of, for example, Ti, Ni, Pt, Pd, W, Au, Ag, Cu, Ta, and Al, or such as a metal film or the like made of a nitride alloy containing at least Ti, W, and Ta. The upper electrode layers of the anode electrode of the diode and the gate electrode of the transistor are made of metal of which work function is smaller than that of the lower electrode layer, and various metal material satisfying this condition may be used.

The cathode electrode of the diode and the source electrode and the drain electrode of the transistor are electrodes at which the electron-supplying layer 14 makes ohmic contact or at which contact is made in a state of sufficiently low contact resistance. Therefore, various metal material, other than the above-described Ti, satisfying the above-described conditions may be used such as a metal film containing at least one of a metal film containing at least one of, for example, Ti, Al, Si, lead (Pb), chrome (Cr), indium (In), and Ta, a metal film made of alloy containing at least one of, for example, Ti, Al, Si, Pb, Cr, In, and Ta, a metal film made of silicide alloy containing at least one of, for example, Ti, Al, Si, and Ta, or such as a metal film or the like made of a nitride alloy containing at least one of Ti, W, and Ta.

Although, in the above-described embodiments, an SBD and a HEMT or the like are exemplified as the semiconductor device according to the present invention, the present invention is not limited to this, and can be adapted to various semiconductor devices. When adapting the present invention to these FETs, it is possible to provide an insulating film such as an oxide film or the like between the gate electrode and the field plate layer.

Although, in the above-described embodiments, the cathode electrode, the source electrode, and the drain electrode are formed at a surface of the electron-supplying layer, it is not necessarily limited to this, and an electrode can be provided on at least one layer of semiconductor stack containing the electron transition layer, the electron-supplying layer, the field plate layer, and other layer if necessary. That is, an electrode may be provided on other layer configuring the semiconductor stack. To be more specific, it is possible to provide the cathode electrode, the drain electrode, and the source electrode on the surface of the electron-supplying layer via a nitride semiconductor layer such as an insulating layer and a field plate layer or the like, or via layered layers of these. It is also possible that a recessed portion is formed by removing, by etching, a portion of an area, in which an electrode of an electron-supplying layer is formed, until reaching the electron transition layer, and then the cathode electrode, the drain electrode, or the source electrode is provided on this surface of the recessed portion or via a predetermined layer on the surface of the recessed portion.

Although, in the above-described Embodiment 1 to 4, the SBD is configured so that a dielectric layer for reducing wiring capacity is provided at a lower layer of an electrode at an opposite side to a grounded electrode, it may be configured to provide a dielectric layer and a 2DEG-non-produced area formed by ion injection or a recessed portion at lower layers of respective electrodes in an area in which the anode A is formed and an area in which the cathode C is formed by combining these Embodiment 1 to 4 appropriately. In this case, since not only a capacity between the grounded electrode and a base is reduced but also a capacity between the anode A and the cathode C is reduced, it is possible to reduce an entire capacity of the SBD and capacitive charge.

Similarly, although, in the above-described Embodiments 5 to 7, the HEMT is configured so that a dielectric layer for reducing wiring capacity is provided at a lower layer of an ohmic electrode at an opposite side to a grounded ohmic electrode, it may be configured to provide a dielectric layer and a 2DEG-non-produced area formed by ion injection or a recessed portion at lower layers of respective electrodes in an area in which the drain D is formed and an area in which the source S is formed by combining the above-described Embodiments 5 to 7 appropriately. In this case, one of the source electrode and the drain electrode may be identical to the base in electric potential if the base is grounded, and it is preferable to select an electrode of which parasitic capacity is smaller. For example, in a case of grounding the source electrode, if the base is grounded, and if the dielectric layer and the 2DEG-non-produced area formed by ion injection or a recessed portion at lower layers of respective electrodes in an area in which the drain D is formed and an area in which the source S formed, it is possible to reduce a capacity between the drain D and the source S, and thus, it is possible to reduce input capacity and output capacity of the HEMT.

A configuration similar to the recessed portion 13e and the dielectric layer 61 provided at a lower layer of the drain electrode 54 in the above-described Embodiment 6 may be provided at a lower layer of the source electrode 56, and in this case, the drain D of the HEMT is grounded to be identical to the substrate 11 and the buffer layer 12 in electric potential.

In the above-described embodiments, the dielectric layers 21, 22, 23, 24, 58, 61, and 62 are configured with, but not necessarily limited to, a single layer made of dielectric, it may be configured to layer dielectric layers made of a plurality of materials and to configure a dielectric layer in which a plurality of dielectric materials are mixed.

In the above-described Embodiments 14, 15, the end portion of the gate electrode is a multi-step-stair-like structure in which the end portion of the gate electrode is stranded on, and arches out to, the insulating film 159 toward the drain electrode's side and the source electrode's side. However, the present invention is not necessarily limited to the structure as such, a multi-step-stair-like structure may be possible in which only one side, to which at least high voltage is applied, of the end portions of the gate electrode, to be more specific, for example, only the end portion at the drain electrode's side of the gate electrode is stranded on, and arches out to, the insulating film 159.

In the above-described Embodiments 14, 15, the configuration in which a multi-step-stair-like field plate portion is provided in the gate electrode is explained. However, a field plate structure in a field effect transistor is not necessarily limited to only an aspect in which a field plate structure is provided in a gate electrode. To be more specific, for example, in the present invention, the field plate structure described in Patent Literature 7 can be adapted preferably to the aspect in which the field plate structure is provided in a source electrode. In this case, the end portion, at the drain electrode's side of the field plate structure, of the source electrode is one of electric field concentration portions. In a case that this electric field concentration portion is at a side being the closest to the drain electrode in the electric field concentration portion produced in one semiconductor device, it is preferable that a changing point P, at the drain electrode's side, of the 2DEG concentration be separated by equal to or greater than 1 µm, and preferably equal to or greater than 2 µm, from the end portion, at the drain electrode's side of the field plate structure, of the source electrode.

In the above-described embodiments, a two-dimensional-electron-gas-controlling area may be configured with combining Embodiments 10, 11 appropriately and providing the two-dimensional-electron-gas-controlling layer 115 and the recessed portion 121a adjacently. In this case, 2DEG concentration is varied at three levels. In this case as well, in order to disperse an electric field concentration portion to relax electric field intensity, a two-dimensional-electron-gas-controlling area is configured to be within a lower area of the field plate portion, and an interval $I_0$ between an end portion, at the anode electrode's side, of the two-dimensional-electron-gas-controlling area and an end portion, at the cathode electrode's side, of the upper-most stage of field plate along a plane which is in parallel with a primary surface of the substrate 111 is equal to or greater than 1 µm, and preferably equal to or greater than 2 µm. A similar configuration may be adapted in the HEMT-type FET.

The first SFP layer 249a being formed in, but not necessarily limited to, a planar-shape in the above-described Embodiment 19 may be configured in a step-shape having a plurality of steps toward the drain electrode 244's side.

In place of the Sapphire substrate being used as, but not necessarily limited to, an insulating substrate in the above-described Embodiments 16 to 20, a substrate may be used, a surface of which an insulating film with a thick $SiO_2$ layer or the like is provided, such as, for example, heat-resistant glass substrate and Si substrate or the like.

According to the embodiments, parasitic capacity and on-state resistance caused by wiring can be reduced for ensuring a wiring width, and is capable of being high voltage resistant and maintaining large current.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A nitride semiconductor device comprising:
a base having, at least a portion thereof, a conductive portion;
a semiconductor stack configured with a plurality of semiconductor layers being made of nitride semiconductors provided on the base;
a first electrode provided on at least a portion of a semiconductor layer of the semiconductor layers configuring the semiconductor stack;
a second electrode provided on at least a portion of a semiconductor layer of the semiconductor layers configuring the semiconductor stack separately from the first electrode;
a first wiring provided at an upper layer of the first electrode;
a second wiring provided at an upper layer of the second electrode; and
a dielectric layer having a permittivity lower than permittivities of the nitride semiconductors configuring the semiconductor stack and being formed at a lower layer of a portion where at least one of the first electrode and the second electrode is disposed, the portion being other than a portion where the at least one of the first electrode and the second electrode is junctioned with the semiconductor stack electrically, wherein
the semiconductor stack has a configuration of partly producing a two-dimensional electron gas,
the dielectric layer and a two-dimensional-electron-gas-non-produced area, where the two-dimensional electron gas is not to be produced, are disposed so as to overlap within a plane, which is in parallel with a primary surface of the base, at the lower layer of the portion where at least one of the first electrode and the second electrode is disposed, the portion being other than the portion where the at least one of the first electrode and the second electrode is junctioned with the semiconductor stack, and
a perimeter portion of the dielectric layer along a width direction of the second electrode is configured to be outside a perimeter portion of the two-dimensional-electron-gas-non-produced area in the semiconductor stack.

2. The nitride semiconductor device according to claim 1, wherein the dielectric layer contains at least one kind of element selected from a group consisting of silicon, oxygen, nitrogen, carbon, fluorine, and boron.

3. The nitride semiconductor device according to claim 1, wherein the dielectric layer is made of a gap of which permittivity is lower than the permittivity of the nitride semiconductor configuring the semiconductor stack.

4. The nitride semiconductor device according to claim 1, wherein, when a predetermined one, being provided with the dielectric layer at a lower layer thereof, of the first electrode and the second electrode is selected, the other one of the first electrode and the second electrode is configured to be identical to a conductive portion of the base in electric potential.

5. The nitride semiconductor device according to claim 1, wherein the perimeter portion of the low permittivity area along the width direction of the second electrode is configured to be outside the perimeter portion of the two-dimensional-electron-gas-non-produced area within a range of equal to or greater than 0.5 μm and equal to or lower than 3.0 μm.

6. The nitride semiconductor device according to claim 1, wherein the two-dimensional-electron-gas-non-produced area is configured with an area containing impurity in a portion of the semiconductor stack.

7. The nitride semiconductor device according to claim 1, wherein the two-dimensional-electron-gas-non-produced area is configured with a recessed portion provided in a portion of the semiconductor stack.

8. The nitride semiconductor device according to claim 1, wherein the electrode, being provided with the dielectric layer at the lower layer thereof, of the first electrode and the second electrode is an ohmic electrode.

9. The nitride semiconductor device according to claim 1, wherein the semiconductor stack has a first semiconductor layer and a second semiconductor layer, the first semiconductor layer is made of a nitride semiconductor, and the second semiconductor layer is made of at least one kind of nitride semiconductor being formed on the first semiconductor layer and being broader than the first semiconductor layer in bandgap in average.

10. The nitride semiconductor device according to claim 9, wherein the semiconductor stack includes a third semiconductor layer made of a nitride semiconductor being formed selectively on the second semiconductor layer and being narrower than the second semiconductor layer in bandgap in average.

11. The nitride semiconductor device according to claim 1, wherein
the semiconductor stack has a first semiconductor layer and a second semiconductor layer, the first semiconductor layer is made of a nitride semiconductor provided on the base, the second semiconductor layer having a structure in which at least one layer of nitride semiconductor layer being provided at an upper layer of the first semiconductor layer and containing aluminum, the second semiconductor layer has an average Al composition ratio X and is broader than the first semiconductor layer in bandgap in average,
the second semiconductor layer is configured with layering a first nitride semiconductor layer and a second nitride semiconductor layer at least one time alternately, the first nitride semiconductor layer contains a nitride semiconductor of which maximal Al composition ratio is higher than the average Al composition ratio X, the second nitride semiconductor layer contains a nitride semiconductor of which minimal Al composition ratio is lower than the average Al composition ratio X, and
the maximal Al composition ratio of the first nitride semiconductor layer is higher than the average Al composition ratio X by a range of equal to or greater than 0.03 and smaller than 0.3.

12. The nitride semiconductor device according to claim 11, wherein an Al composition ratio of the second semiconductor layer increases and decreases continuously so as to increase and then decrease in this order in the first nitride semiconductor layer and across the maximal Al composition ratio and decrease and then increase in this order in the second nitride semiconductor layer across the minimal Al composition ratio along a lamination direction from the primary surface of the base toward a top surface of the second semiconductor layer.

13. The nitride semiconductor device according to claim 11, wherein the maximal Al composition ratio of the first nitride semiconductor layer is equal to or greater than 0.2 and smaller than 0.6.

14. The nitride semiconductor device according to claim 11, wherein the minimal Al composition ratio of the second nitride semiconductor layer is lower than the average Al composition ratio X of the second semiconductor layer by a range of equal to or greater than 0.03 and smaller than 0.2.

15. The nitride semiconductor device according to claim 11, wherein the minimal Al composition ratio of the second nitride semiconductor layer is greater than zero and smaller than 0.2.

16. The nitride semiconductor device according to claim 11, wherein the average Al composition ratio X of the second nitride semiconductor layer is equal to or greater than 0.1 and equal to or lower than 0.4.

17. The nitride semiconductor device according to claim 11, wherein a thickness of the second semiconductor layer is equal to or greater than 2 nm.

18. The nitride semiconductor device according to claim 11, wherein a thickness of the second semiconductor layer is equal to or lower than 30 nm.

19. The nitride semiconductor device according to claim 11, wherein the second semiconductor layer is configured in which the first nitride semiconductor layer and the second nitride semiconductor layer are layered alternately by equal to or more than 5 times and equal to or fewer than 10 times, the first nitride semiconductor layer contains a nitride semiconductor in at least one pattern of the maximal Al composition ratio being higher than the average Al composition ratio X of the second semiconductor layer, the second nitride semiconductor layer contains a nitride semiconductor in at least one pattern of the minimal Al composition ratio being lower than the average Al composition ratio X of the second semiconductor layer.

20. The nitride semiconductor device according to claim 11, wherein the semiconductor stack has an etching sacrifice layer made of AlYGa1-YN of which average Al composition ratio Y is lower than a maximum Al composition ratio and higher than a minimum Al composition ratio of a plurality of nitride semiconductor layers configuring the second semiconductor layer on the second semiconductor layer.

21. The nitride semiconductor device according to claim 20, wherein a thickness of the etching sacrifice layer is equal to or greater than 1 nm and equal to or lower than 12 nm.

22. The nitride semiconductor device according to claim 1, further comprising an insulating film provided on at least the semiconductor stack, wherein
the semiconductor stack has a two-dimensional-electron-gas-controlling area in which a two-dimensional electron gas concentration varies partially at least at two levels, the first electrode has a field plate portion arching out to the insulating film toward the second electrode's side, the two-dimensional electron gas concentration in the two-dimensional-electron-gas-controlling area is varied to be lower than a two-dimensional electron gas concentration in an area other than the two-dimensional-electron-gas-controlling area across a changing point as a border between the two-dimensional-electron-gas-controlling area and the area other than the two-dimensional-electron-gas-controlling area, a first changing point, positioned at the second electrode's side, of the changing point along a primary surface of the base is inside a lower area from the field plate portion toward the base, and an electric field intensity between the first changing point and an end portion, at the second electrode's side, of the field plate portion is lower than an electric field intensity of an electric field concentration portion at least one of the first changing point and the end portion, at the second electrode's side, of the field plate portion.

23. The nitride semiconductor device according to claim 22, wherein, in an electric field intensity distribution between the first changing point and the end portion, at the second electrode's side, of the field plate portion along the primary surface of the base, a sum of half width at half maximum of the respective electric field intensities in the vicinity of the first changing point and in the vicinity of the end portion, at the second electrode's side, of the field plate portion is smaller than a distance between the first changing point and the end portion, at the second electrode's side, of the field plate portion.

24. The nitride semiconductor device according to claim 22, wherein the plurality of the semiconductor layers in the semiconductor stack are made of InuAlxGa1-x-uN ($0 \leq x \leq 1$, $0 \leq u \leq 1$, $0 \leq x+u \leq 1$) respectively, and an interval between the first changing point and the end portion, at the second electrode's side, of the field plate portion is equal to or greater than 1 μm.

25. The nitride semiconductor device according to claim 22, wherein a thickness, at the second electrode's side, of the insulating film in a lower area from the field plate portion toward the base's side is configured to not decrease or to increase continuously or incrementally in comparison to a thickness of the first electrode's side.

26. The nitride semiconductor device according to claim 22, wherein the insulating film in the lower area of the field plate portion has a plurality of steps having smaller than 90 degrees of inclination angle.

27. The nitride semiconductor device according to claim 1, further comprising, on at least a portion of layers configuring the semiconductor stack, a third electrode provided separately from the first electrode and the second electrode and an insulating film provided on at least the semiconductor stack, wherein the semiconductor stack has a two-dimensional-electron-gas-controlling area in which two-dimensional electron gas concentration is varied partially at least at two levels, at least one of the first electrode and the third electrode has a field plate portion arching out to the insulating film toward the second electrode's side, the two-dimensional electron gas concentration inside the two-dimensional-electron-gas-controlling area is varied to be lower than a two-dimensional electron gas concentration in an area other than the two-dimensional-electron-gas-controlling area across a changing point at a border between the two-dimensional-electron-gas-controlling area and the area other than the two-dimensional-electron-gas-controlling area, a first changing point, positioned at the second electrode's side, of the changing point along a primary surface of the base is inside a lower area from the field plate portion toward the base, and an electric field intensity between the first changing point and an end portion, at the second electrode's side, of the field plate portion is lower than an electric field intensity of an electric field concentration portion at least one of the first changing point and the end portion, at the second electrode's side, of the field plate portion.

28. The nitride semiconductor device according to claim 27, wherein, in an electric field intensity distribution between the first changing point and the end portion, at the second electrode's side, of the field plate portion along the primary surface of the base, a sum of half width at half maximum of the respective electric field intensities in the vicinity of the first changing point and in the vicinity of the end portion, at the second electrode's side, of the field plate portion is smaller than a distance between the first changing point and the end portion, at the second electrode's side, of the field plate portion.

29. The nitride semiconductor device according to claim 27, wherein the plurality of the semiconductor layers in the semiconductor stack are made of InuAlxGa1-x-uN ($0 \leq x \leq 1$, $0 \leq u \leq 1$, $0 \leq x+u \leq 1$) respectively, and an interval between the first changing point and the end portion, at the second electrode's side, of the field plate portion is equal to or greater than 1 μm.

30. The nitride semiconductor device according to claim 27, wherein a thickness, at the second electrode's side, of the insulating film in a lower area from the field plate portion toward the base's side is configured to not decrease or to increase continuously or incrementally in comparison to a thickness of the first electrode's side.

31. The nitride semiconductor device according to claim 27, wherein the insulating film in the lower area of the field plate portion has a plurality of steps having smaller than 90 degrees of inclination angle.

32. The nitride semiconductor device according to claim 1, wherein the base has an insulating substrate, an n-type conductive layer provided at an upper layer of the insulating substrate, and an anti-diffusion layer restraining dispersion of a carrier from the n-type conductive layer to the upper layer, the nitride semiconductor device further comprises a device layer configured to have a buffer layer provided at an upper layer of the anti-diffusion layer and the semiconductor stack in which a two-dimensional electron gas layer is produced, and a thickness of the device layer is equal to or greater than 3 μm.

33. The nitride semiconductor device according to claim 32, wherein the insulating substrate is a Sapphire substrate.

34. The nitride semiconductor device according to claim 32, wherein the n-type conductive layer is identical to the first electrode in electric potential.

35. The nitride semiconductor device according to claim 32, wherein the anti-diffusion layer is made of a semiconductor layer of which bandgap is greater than a bandgap of the n-type conductive layer.

36. The nitride semiconductor device, according to claim 35, wherein the n-type conductive layer is configured with an AlYGa1-YN layer having an Al composition ratio y ($0 \leq y < 1$), and the anti-diffusion layer is made of an AlxGa1-xN layer ($0 < y+0.2 \leq x \leq 1$) having an Al composition ratio x being greater than the an Al composition ratio y of the n-type conductive layer by equal to or greater than 0.2.

37. The nitride semiconductor device according to claim 32, wherein the anti-diffusion layer is a p-type semiconductor layer doped with a p-type impurity.

38. The nitride semiconductor device according to claim 37, wherein a carrier concentration of the p-type impurity is equal to or greater than $1.0 \times 10^{16}$ cm-3 and smaller than $5.0 \times 10^{19}$ cm-3.

39. The nitride semiconductor device according to claim 32, wherein a contact hole reaching from the device layer to at least the anti-diffusion layer is formed, and a contact electrode connected to the n-type conductive layer electrically through the contact hole is provided.

40. The nitride semiconductor device according to claim 32, wherein a substrate contact hole reaching at least the n-type conductive layer is formed to the insulating substrate and the n-type conductive layer, and the n-type conductive layer or other two-dimensional electron gas layer produced in the n-type conductive layer is grounded via a conductive material embedded in the substrate contact hole.

* * * * *